US009923575B2

(12) United States Patent
Yang et al.

(10) Patent No.: US 9,923,575 B2
(45) Date of Patent: Mar. 20, 2018

(54) COMPRESSION OF MULTIDIMENSIONAL SONIC DATA

(71) Applicant: Schlumberger Technology Corporation, Sugar Land, TX (US)

(72) Inventors: Jeehong Yang, Madison, WI (US); Julius Kusuma, Somerville, MA (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 764 days.

(21) Appl. No.: 13/766,780

(22) Filed: Feb. 14, 2013

(65) Prior Publication Data

US 2014/0229113 A1   Aug. 14, 2014

(51) Int. Cl.
| | | |
|---|---|---|
| G01V 1/40 | (2006.01) | |
| G01V 1/48 | (2006.01) | |
| H03M 7/40 | (2006.01) | |
| G01V 11/00 | (2006.01) | |
| E21B 47/12 | (2012.01) | |
| H03M 7/30 | (2006.01) | |

(Continued)

(52) U.S. Cl.
CPC ............ *H03M 7/40* (2013.01); *G01V 11/002* (2013.01); *E21B 47/12* (2013.01); *G01V 1/22* (2013.01); *G01V 1/46* (2013.01); *G01V 1/48* (2013.01); *H03M 7/30* (2013.01)

(58) Field of Classification Search
CPC ........ E21B 44/00; E21B 47/00; E21B 47/022; E21B 47/026; E21B 47/02208; E21B 47/12; E21B 47/14; G01V 3/38; G01V 11/00; G01V 1/46–1/50; G01V 1/30–1/32

USPC ........................ 702/9–11; 375/232, 240, 343
See application file for complete search history.

(56) References Cited

U.S. PATENT DOCUMENTS

| | | |
|---|---|---|
| 5,745,392 A | 4/1998 | Ergas et al. |
| 5,933,790 A | 8/1999 | Jeffryes |

(Continued)

FOREIGN PATENT DOCUMENTS

WO       2005/096016       10/2005

OTHER PUBLICATIONS

International search report and written opinion for the equivalent PCT patent application No. PCT/US2014/016162 dated May 20, 2014.

(Continued)

*Primary Examiner* — John Breene
*Assistant Examiner* — Christine Liao
(74) *Attorney, Agent, or Firm* — Trevor G. Grove

(57) ABSTRACT

Compression of multidimensional sonic data is disclosed. Example methods disclosed herein to compress input multidimensional sonic data include decorrelating the input multidimensional sonic data to determine decorrelated multidimensional sonic data. In some such examples, the input multidimensional sonic data has a plurality of dimensions corresponding to a respective plurality of azimuthal directions from which the input multidimensional sonic data was obtained. In such examples, the decorrelated multidimensional sonic data is decorrelated among the plurality of dimensions of the input multidimensional sonic data. Such example methods also include processing the decorrelated multidimensional sonic data to determine compressed data representative of the input multidimensional sonic data.

13 Claims, 35 Drawing Sheets

(51) Int. Cl.
　　　*G01V 1/22*　　　(2006.01)
　　　*G01V 1/46*　　　(2006.01)

(56) References Cited

U.S. PATENT DOCUMENTS

| | | | |
|---|---|---|---|
| 6,308,137 | B1 | 10/2001 | Underhill et al. |
| 6,405,136 | B1 | 6/2002 | Li et al. |
| 6,594,394 | B1 | 7/2003 | Stromberg et al. |
| 7,107,153 | B2 | 9/2006 | Kisra et al. |
| 7,689,637 | B1 * | 3/2010 | Gornstein .......... H03H 21/0043 708/322 |
| 8,024,121 | B2 * | 9/2011 | Tang ................... E21B 47/12 702/6 |
| 8,358,559 | B2 * | 1/2013 | Mansour .............. G01S 7/5208 367/11 |
| 8,855,011 | B2 * | 10/2014 | Ortega ................. H04W 52/04 370/254 |
| 2009/0192711 | A1 * | 7/2009 | Tang ................... E21B 47/12 702/6 |
| 2012/0014289 | A1 * | 1/2012 | Ortega ................. H04W 52/04 370/255 |
| 2012/0027318 | A1 * | 2/2012 | Hinds ................. H04N 19/625 382/250 |
| 2013/0307700 | A1 * | 11/2013 | Hassan ................. G01V 3/34 340/853.1 |

OTHER PUBLICATIONS

A.V. Djourik, et al, "Siberian Solar Radiotelescope: the PCA format of the SSRT data compressor".

M. Hans, et al., "Lossless Compression of Digital Audio," Hewlett Packard Technical Report, CSIP TR-97-07.

T. Robinson, "Shorten: Simple lossless and near-lossless waveform compression," Cambridge University Engineering Department Technical Report CUED/F-INFENG/TR.156, Dec. 1994.

R.F. Rice, "Some practical universal noiseless coding techniques," JetPropulsion Laboratory Technical Report, JPL-79-22, Pasadena, Mar. 15, 1979.

G. Mandyam, et al. "Lossless Seismic Data Compression using Adaptive Linear Prediction,".

P.C. Craven, et al., "Lossless Compression Using IIR Prediction Filters" at https://secure.aes.org/forum/pubs/conventions/?elib=7364.

TTA Lossless Audio Codec-True Audio Compressor Algorithms.

P. Breton et al., "Well Positioned Seismic Measurements," Oilfield Review, pp. 32-45, Spring, 2002.

Pistre et al., "A New Sonic Modular Tool Provides Complete Acoustic Formation Characterization", 2005 Society of Exploration Geophysicists International Exposition and Annual Meeting Proceedings, SEG, Houston, Nov. 6-11, 2005.

International Preliminary Report on Patentability issued in the related PCT Application PCT/US2014/016162, dated Aug. 18, 2015 (5 pages).

\* cited by examiner

COMPRESSION OF MULTIDIMENSIONAL SONIC DATA

FIELD OF THE DISCLOSURE

This disclosure relates generally to data compression and, more particularly, to compression of multidimensional sonic data.

BACKGROUND

In drilling and logging operations, sonic measurements can be used to determine characteristics of a geological formation. Sonic measurement techniques generally employ a sonic measurement tool including one or more acoustic transmitters and multiple sensors arranged along the tool. The sensors are arranged to obtain a multidimensional sonic waveform including multiple individual sonic waveforms, also referred to as acoustic waveforms, which have propagated from the acoustic transmitter(s), through the geological formation, and to the sensors at various depths and azimuthal directions. The signal components, or modes, and associated characteristics of the sensed, multidimensional sonic waveform can be used to characterize the formation. In applications in which the number of tool sensors is large, and/or the number of azimuthal directions supported by the tool sensors is large, the amount of sonic data sensed by the tool and to be reported to a surface monitoring station can be large and consume most or all of the available telemetry bandwidth. Accordingly, in some applications, compression is used to reduce the amount of sonic data to be reported by the sonic measurement tool via the telemetry link.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

The disclosure relates generally to data compression and, more particularly, to compression of multidimensional sonic data. Some disclosed example methods to compress input multidimensional sonic data include decorrelating the input multidimensional sonic data to determine decorrelated multidimensional sonic data. In some such examples, the input multidimensional sonic data has a plurality of dimensions corresponding to a respective plurality of azimuthal directions from which the input multidimensional sonic data was obtained. In such examples, the decorrelated multidimensional sonic data is decorrelated among the plurality of dimensions of the input multidimensional sonic data. Such example methods also include processing the decorrelated multidimensional sonic data to determine compressed data representative of the input multidimensional sonic data.

Other disclosed example methods to compress input multidimensional sonic data include processing the input multidimensional sonic data to determine one-dimensional sonic data corresponding to the input multidimensional sonic data. In some such examples, the input multidimensional sonic data has multiple dimensions corresponding to respectively to multiple azimuthal directions from which the input multidimensional sonic data was obtained. Some such example methods also include processing the one-dimensional sonic data with an adaptive filter to determine prediction error data corresponding to the one-dimensional sonic data. Some such example methods further include processing the prediction error data to determine compressed data representative of the input multidimensional sonic data.

Some disclosed example systems to compress input multidimensional sonic data include a sonic tool to obtain the input multidimensional sonic data. In some such examples, the sonic tool includes an acoustic source and multiple receiver stations. Each such receiver station is to detect audio over multiple azimuthal directions supported by the receiving stations. Such example systems also include an example sonic data compressor to decorrelate the input multidimensional sonic data to determine decorrelated multidimensional sonic data. In such examples, the decorrelated multidimensional sonic data is decorrelated among the plurality of dimensions of the input multidimensional sonic data, with each dimension of the input multidimensional sonic data corresponding to a respective different azimuthal direction supported by the receiving stations of the sonic tool. In such example systems, the sonic data compressor is also to process the decorrelated multidimensional sonic data to determine compressed data representative of the input multidimensional sonic data.

Other disclosed example systems to compress input multidimensional sonic data include a sonic tool to obtain the input multidimensional sonic data. In some such examples, the sonic tool includes an acoustic source and multiple receiver stations. Each such receiver station is to detect audio over multiple azimuthal directions supported by the receiving stations. In such examples, each dimension of the input multidimensional sonic data corresponds to a respective different azimuthal direction supported by the receiving stations. Such example systems also include an example sonic data compressor to process the input multidimensional sonic data to determine one-dimensional sonic data corresponding to the input multidimensional sonic data. In such example systems, the sonic data compressor is also to process the one-dimensional sonic data with an adaptive filter to determine prediction error data corresponding to the one-dimensional sonic data. In such example systems, the sonic data compressor is further to process the prediction error data to determine compressed data representative of the input multidimensional sonic data.

Some disclosed example machine readable storage medium include example machine readable instructions which, when executed, cause an example machine to at least decorrelate input multidimensional sonic data to determine decorrelated multidimensional sonic data. In some such examples, the input multidimensional sonic data has multiple dimensions corresponding respectively to multiple azimuthal directions from which the input multidimensional sonic data was obtained. In such examples, the decorrelated multidimensional sonic data is decorrelated among the plurality of dimensions of the input multidimensional sonic data. In some such examples, the example instructions, when executed, further cause the example machine to process the decorrelated multidimensional sonic data to determine compressed data representative of the input multidimensional sonic data.

Other disclosed example machine readable storage medium include example machine readable instructions which, when executed, cause an example machine to at least process input multidimensional sonic data to determine one-dimensional sonic data corresponding to the input multidimensional sonic data. In some examples, the input multidimensional sonic data has multiple dimensions corresponding respectively to multiple azimuthal directions from which the input multidimensional sonic data was obtained.

In some such examples, the example instructions, when executed, further cause the example machine to process the one-dimensional sonic data with an adaptive filter to determine prediction error data corresponding to the one-dimensional sonic data. In some such examples, the example instructions, when executed, further cause the example machine to process the prediction error data to determine compressed data representative of the input multidimensional sonic data.

BRIEF DESCRIPTION OF THE DRAWINGS

Example methods, apparatus, systems and articles of manufacture to compress multidimensional sonic data are described with reference to the following figures. Where possible, the same numbers are used throughout the figures to reference like features and components.

DETAILED DESCRIPTION

In the following detailed description, reference is made to the accompanying drawings, which form a part hereof, and within which are shown by way of illustration specific embodiments by which the invention may be practiced. It is to be understood that other embodiments may be utilized and structural changes may be made without departing from the scope of the disclosure.

Example methods, apparatus, systems and articles of manufacture (e.g., storage media) to implement techniques for compressing multidimensional sonic data are disclosed herein. Such example sonic data compression techniques are based on disclosed improvements that can be used together to perform sonic data compression, or individually in combination with existing sonic data compression techniques. One such improvement involves performing multichannel processing of multidimensional sonic data across the azimuthal channels corresponding to the different dimensions of the sonic data to reduce the correlation among the waveforms obtained on different channels. Such multichannel decorrelation processing can be performed on multidimensional sonic data to be compressed using example sonic data compression techniques disclosed herein, or to be compressed using prior compression techniques to improve the performance of those prior techniques. As disclosed in greater detail below, the multichannel decorrelation processing can be implemented using a Hadamard transform, or by successive stages of stereo decorrelation operations.

Another such improvement involves performing sonic data prediction on the multidimensional sonic data, and then using the resulting prediction error data to form the compressed sonic data. Such sonic data prediction can be performed on multidimensional sonic data that has been decorrelated using example multichannel decorrelation processing as disclosed herein, on multidimensional sonic data to be compressed using prior compression techniques to improve the performance of those prior techniques, on each dimension of the multidimensional sonic data independently of the other dimensions, etc. As disclosed in greater detail below, the sonic data prediction processing can be implemented using, for example, an adaptive filter.

Figure 1:
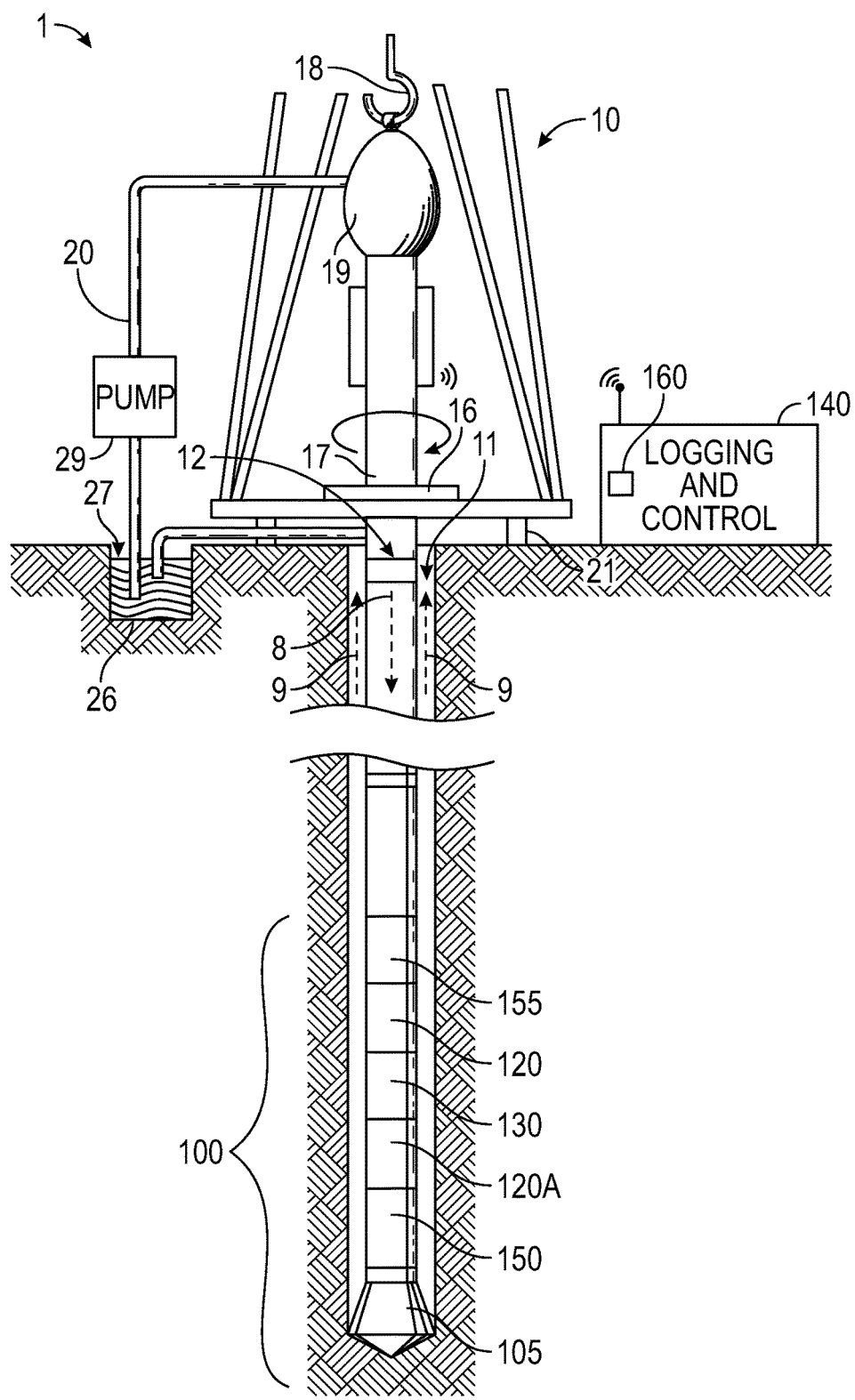
FIG. 1 is a diagram illustrating an example wellsite system capable of supporting compression of sonic data as disclosed herein.

Turning to the figures, FIG. 1 illustrates an example wellsite system 1 in which one or more of the disclosed example methods, apparatus, systems and/or articles of manufacture for performing multichannel sonic data compression can be employed. The wellsite can be onshore or offshore. In this example system, a borehole 11 is formed in subsurface formations by rotary drilling, whereas other example systems can use directional drilling.

A drillstring 12 is suspended within the borehole 11 and has a bottom hole assembly 100 that includes a drill bit 105 at its lower end. The surface system includes platform and derrick assembly 10 positioned over the borehole 11, the assembly 10 including a rotary table 16, kelly 17, hook 18 and rotary swivel 19. In an example, the drill string 12 is suspended from a lifting gear (not shown) via the hook 18, with the lifting gear being coupled to a mast (not shown) rising above the surface. An example lifting gear includes a crown block whose axis is affixed to the top of the mast, a vertically traveling block to which the hook 18 is attached, and a cable passing through the crown block and the vertically traveling block. In such an example, one end of the cable is affixed to an anchor point, whereas the other end is affixed to a winch to raise and lower the hook 18 and the drillstring 12 coupled thereto. The drillstring 12 is formed of drill pipes screwed one to another.

The drillstring 12 may be raised and lowered by turning the lifting gear with the winch. In some scenarios, drill pipe raising and lowering operations involve unhooking the drillstring 12 temporarily from the lifting gear. In such scenarios, the drillstring 12 can be supported by blocking it with wedges in a conical recess of the rotary table 16, which is mounted on a platform 21 through which the drillstring 12 passes.

In the illustrated example, the drillstring 12 is rotated by the rotary table 16, energized by means not shown, which engages the kelly 17 at the upper end of the drillstring 12. The drillstring 12 is suspended from the hook 18, attached to a traveling block (also not shown), through the kelly 17 and the rotary swivel 19, which permits rotation of the drillstring 12 relative to the hook 18. In some examples, a top drive system could be used.

In the illustrated example, the surface system further includes drilling fluid or mud 26 stored in a pit 27 formed at the well site. A pump 29 delivers the drilling fluid 26 to the interior of the drillstring 12 via a hose 20 coupled to a port in the swivel 19, causing the drilling fluid to flow downwardly through the drillstring 12 as indicated by the directional arrow 8. The drilling fluid exits the drillstring 12 via ports in the drill bit 105, and then circulates upwardly through the annulus region between the outside of the drillstring and the wall of the borehole, as indicated by the directional arrows 9. In this manner, the drilling fluid lubricates the drill bit 105 and carries formation cuttings up to the surface as it is returned to the pit 27 for recirculation.

The bottom hole assembly 100 includes one or more specially-made drill collars near the drill bit 105. Each such drill collar has one or more logging devices mounted on or in it, thereby allowing downhole drilling conditions and/or various characteristic properties of the geological formation (e.g., such as layers of rock or other material) intersected by the borehole 11 to be measured as the borehole 11 is deepened. In particular, the bottom hole assembly 100 of the illustrated example system 1 includes a logging-while-drilling (LWD) module 120, a measuring-while-drilling (MWD) module 130, a roto-steerable system and motor 150, and the drill bit 105.

The LWD module 120 is housed in a drill collar and can contain one or a plurality of logging tools. It will also be understood that more than one LWD and/or MWD module can be employed, e.g. as represented at 120A. (References, throughout, to a module at the position of 120 can mean a module at the position of 120A as well.) The LWD module 120 includes capabilities for measuring, processing, and storing information, as well as for communicating with the surface equipment.

The MWD module 130 is also housed in a drill collar and can contain one or more devices for measuring characteristics of the drillstring 12 and drill bit 105. The MWD module 130 further includes an apparatus (not shown) for generating electrical power to the downhole system. This may include a mud turbine generator powered by the flow of the drilling fluid, it being understood that other power and/or battery systems may be employed. In the illustrated example, the MWD module 130 includes one or more of the following types of measuring devices: a weight-on-bit measuring device, a torque measuring device, a vibration measuring device, a shock measuring device, a stick slip measuring device, a direction measuring device, and an inclination measuring device.

The wellsite system 1 also includes a logging and control unit 140 communicably coupled in any appropriate manner to the LWD module 120/120A and the MWD module 130. For example, the logging and control unit 140 may be communicatively coupled with the LWD module 120/120A and/or the MWD module 130 via a telemetry communication link (not shown). In the illustrated example, to reduce the amount of data to be communicated from the LWD module 120/120A and/or the MWD module 130 to the logging and control unit 140, the bottom hole assembly 100 further includes an example sonic data compressor 155, which is described in greater detail below. For example, the LWD module 120/120A and/or the MWD module 130 may include an example sonic measurement tool, which is described in greater detail below, that is to provide sonic waveforms to the logging and control unit 140. In such examples, the sonic data compressor 155 can be used to compress the sonic waveforms downhole to reduce the amount of data to be communicated uphole (e.g., via a low bandwidth telemetry communication link) to the logging and control unit 140. In some examples, the logging and control unit 140, in turn, may include an example sonic data decompressor 160, which is described in greater detail below, that is to decompress the sonic waveforms received from the LWD module 120/120A and/or the MWD module 130, and which were compressed by the sonic data compressor 155. Also, although some of the example sonic data compression techniques disclosed herein are described in the context of LWD and MWD applications, the disclosed example sonic data compression techniques are not limited thereto. Instead, sonic data compression as disclosed herein can also be used in other applications, such as wireline logging, production logging, permanent logging, formation evaluation, sampling-while-drilling, etc.

Figure 2A:
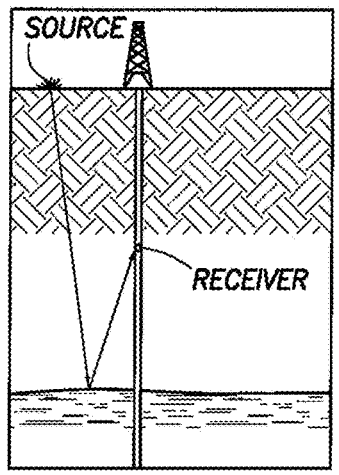
FIGS. 2A-D are diagrams illustrating example seismic-while-drilling tools that may be used to implement the wellsite system of FIG. 1.
Figure 2B:
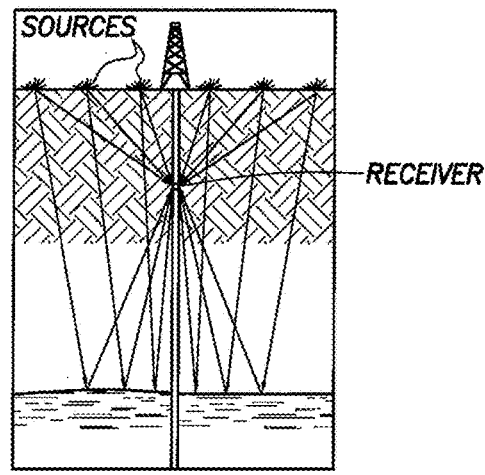
Figure 2C:
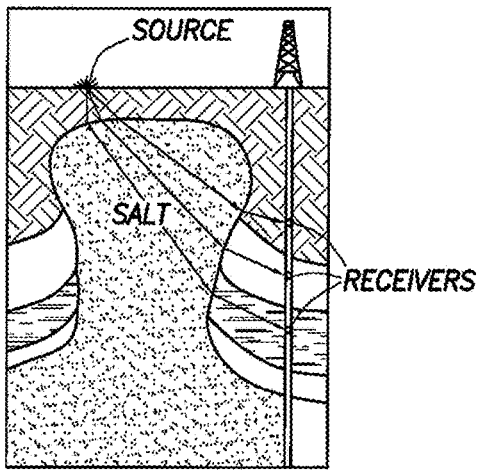
Figure 2D:
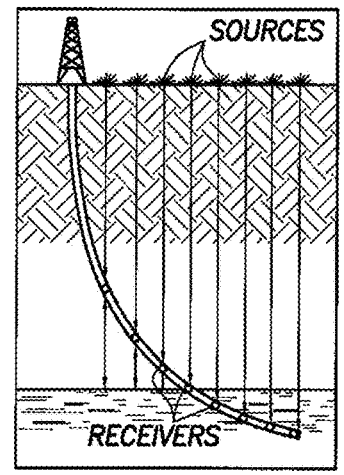
Figure 3:
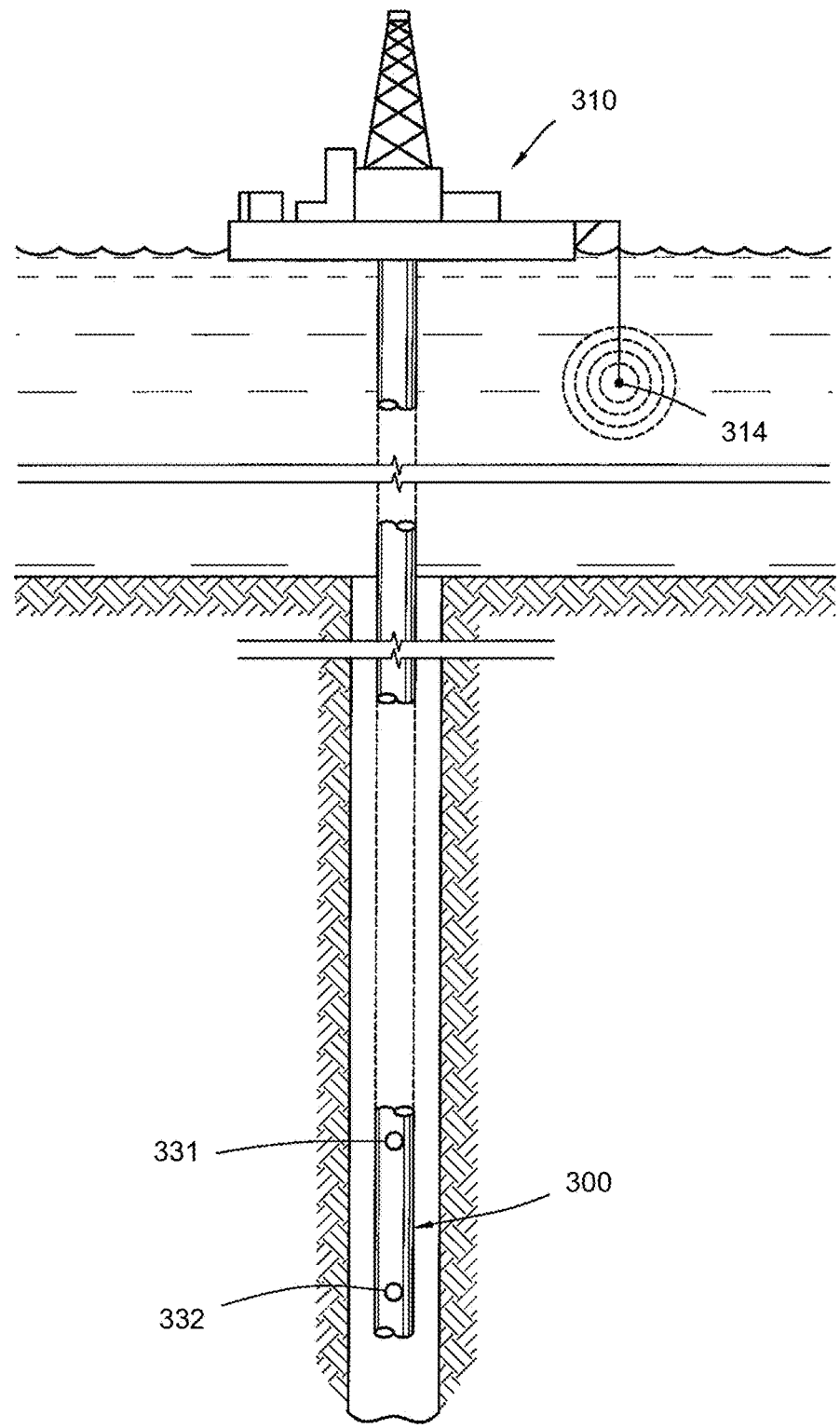
FIG. 3 is a diagram illustrating an example sonic-while-drilling tool that may be used to implement the wellsite system of FIG. 1.

For example, FIGS. 2A-D illustrate example seismic-while-drilling tools that can correspond to the LWD tool 120, or can be a part of an LWD tool suite 120A of the type disclosed in P. Breton et al., "Well Positioned Seismic Measurements," Oilfield Review, pp. 32-45, Spring, 2002, incorporated herein by reference. The downhole LWD module 120/120A can have a single receiver (as depicted in FIGS. 2A and 2B), or multiple receivers (as depicted in FIGS. 2C and 2D), and can be employed in conjunction with a single seismic source at the surface (as depicted in FIGS. 2A and 2C) to support monopole acoustic logging or plural seismic sources at the surface (as depicted in FIGS. 2B and 2D) to support multipole (e.g., dipole) acoustic logging. Accordingly, FIG. 2A, which includes reflection off a bed boundary, and is called a "zero-offset" vertical seismic profile arrangement, uses a single source and a single receiver; FIG. 2B, which includes reflections off a bed boundary, and is called a "walkaway" vertical seismic profile arrangement, uses multiple sources and a single receiver; FIG. 2C, which includes refraction through salt dome boundaries, and is called a "salt proximity" vertical seismic profile, uses a single source and multiple receivers; and FIG. 2D, which includes some reflections off a bed boundary, and is called a "walk above" vertical seismic profile, uses multiple sources and multiple receivers FIG. 3 illustrates a sonic logging-while-drilling tool that can correspond to the LWD tool 120, or can be a part of an LWD tool suite 120A of the type described in U.S. Pat. No. 6,308,137, incorporated herein by reference. In the illustrated example of FIG. 3, an offshore rig 310 is employed, and a sonic transmitting source or array 314 is deployed near the surface of the water. Alternatively, any other suitable type of uphole or downhole source or transmitter can be provided. An uphole processor controls the firing of the transmitter 314. The uphole equipment can also include acoustic receivers and a recorder for capturing reference signals near the source. The uphole equipment further includes telemetry equipment for receiving MWD signals from the downhole equipment. The telemetry equipment and the recorder are coupled to a processor so that recordings may be synchronized using uphole and downhole clocks. The downhole LWD module 300 includes at least acoustic receivers 331 and 332, which are coupled to a signal processor so that recordings may be made of signals detected by the receivers in synchronization with the firing of the signal source.

Figure 4:
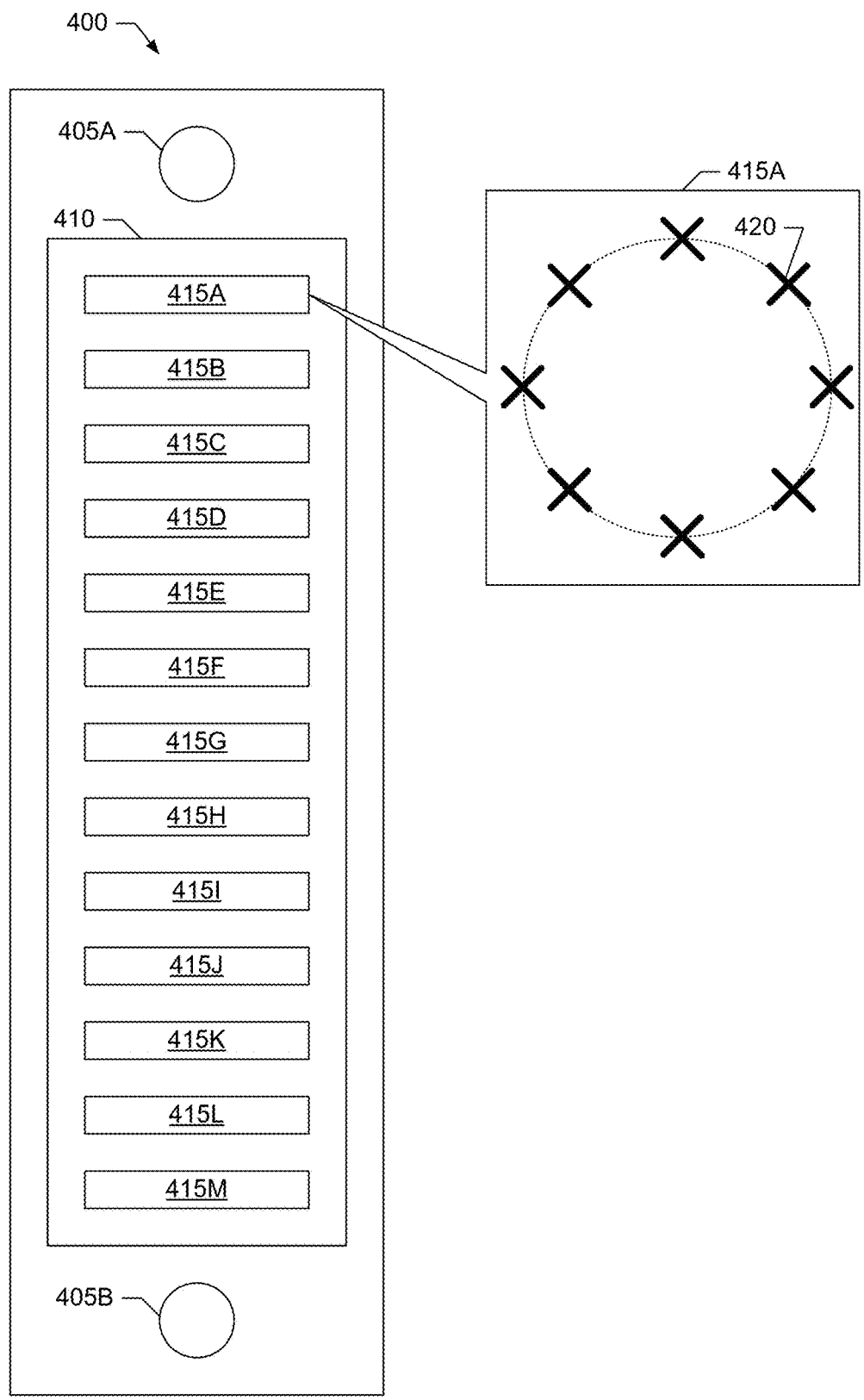
FIG. 4 is a diagram illustrating an example type of sonic measurement tool that may be used to implement the example tools in FIGS. 1-4.

An example sonic measurement tool 400 that may be included in the LWD module 120/120A and/or the MWD module 130 to determine multidimensional sonic waveforms that are to be compressed by the sonic data compressor 155 as disclosed herein is illustrated in FIG. 4. The sonic measurement tool 400 may be, for example, a Sonic Scanner™ tool from Schlumberger, which is generally described in Pistre et al., "A New Sonic Modular Tool Provides Complete Acoustic Formation Characterization", 2005 Society of Exploration Geophysicists International Exposition and Annual Meeting Proceedings, SEG, Houston, Nov. 6-11, 2005. However, any suitable logging device can be utilized to obtain multidimensional sonic waveforms that are to be compressed according to the example multidimensional sonic waveform compression techniques disclosed herein.

Turning to FIG. 4, the example sonic measurement tool 400 includes acoustic sources 405A-B to excite sonic waves that are to propagate along and/or through the geological formation to be characterized. The example sonic measurement tool 400 of FIG. 4 also includes an acoustic receiver array 410 containing thirteen, or some other suitable number, of spaced-apart receiver stations, designated 415A-M in FIG. 4. In the illustrated example of FIG. 4, each receiver station 415A-M includes eight, or some other suitable number, of acoustic sensors mounted azimuthally (e.g., at forty-five degree intervals) in the surface of the cylindrical logging tool 400. FIG. 4 shows eight such example acoustic sensors, collectively designated by the reference numeral 420, corresponding to the example receiver station 415A.

As used herein, a receiver station, or "station," refers to a sensing position along the tool 400, and an azimuthal direction for a particular acoustic sensor located at a particular station is referred to as a "channel." Accordingly, the sonic measurement tool 400 of FIG. 4 includes thirteen (13) stations each supporting eight (8) channels, corresponding to a total of 104 sonic waveforms being determined by the sonic measurement tool 400 at any given time. In some examples, the sonic waveforms generated at a particular receiver station 415A-M are grouped together to form a multidimensional sonic waveform acquired by the particular receiver station 415A-M. In such examples, each dimension of the multidimensional sonic data corresponds to a respective different channel, or azimuthal direction, supported by the receiver stations 415A-M. As described in greater detail below, the example sonic data compressor 155 compresses the multidimensional sonic data generated at each receiver station 415A-M to determine respective compressed sonic data for each receiver station 415A-M.

Figure 5:
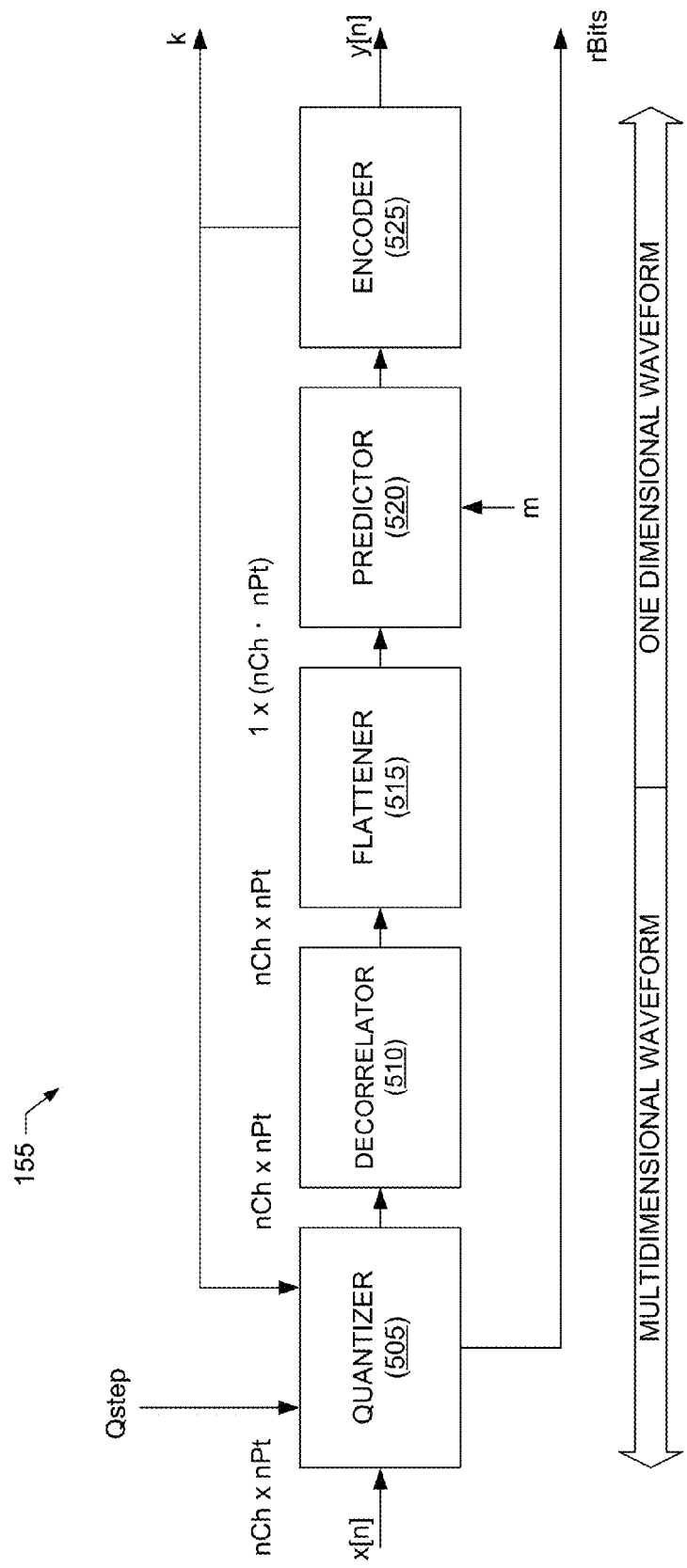
FIG. 5 is a block diagram illustrating an example sonic data compressor capable of compressing sonic data as disclosed herein.

A block diagram of an example implementation of the sonic data compressor 155 of FIG. 1 is illustrated in FIG. 5. As mentioned above, the example sonic data compressor 155 of FIG. 5 compresses the multidimensional sonic data (also referred to as multichannel sonic data) determined at each of the receiver stations 415A-M of the sonic measurement tool 400, where each dimension corresponds, respectively, to a different channel, or azimuthal direction, supported by the receiver stations 415A-M. Unlike prior sonic data compression techniques, the example sonic data compressor 155 of FIG. 5 is able to take advantage of the channel-wise correlation among the different channels (or dimensions) of the multidimensional sonic data determined at each of the receiver stations 415A-M.

Turning to FIG. 5, the example sonic data compressor 155 illustrated therein includes an example quantizer 505 to quantize the input multidimensional sonic data. Quantization provides a form of lossy compression in that the quantized multidimensional sonic data output by the quantizer 505 can be represented using fewer bits than the input multidimensional sonic data applied to the quantizer 505. In some examples, the quantizer 505 is adaptive such that the quantization bit reduction (designated as rBits herein) can be varied over successive sonic data blocks based on one or more parameters (e.g., such as the parameters Qstep and k depicted in FIG. 5). Implementation and operation of the quantizer 505 is described in greater detail below.

To reduce the correlation among the dimensions (or channels) of the input multidimensional sonic data, the example sonic data compressor 155 of FIG. 5 includes an example sonic data decorrelator 510. If the dimensions (or channels) of the input multidimensional sonic data are strongly correlated, then decorrelation can result in one or more of the decorrelated dimensions having relatively small values. The relatively small values of such decorrelated dimensions can, in turn, yield substantial compression gains. Example techniques for implementing the sonic data decorrelator 510 are described in greater detail below.

In the illustrated example of FIG. 5, the quantizer 505 and the sonic data compressor 155 of the sonic data compressor 155 operate on multidimensional sonic data. In other words, the quantizer 505 and the sonic data compressor 155 operate, in parallel, on sonic waveform samples taken from each of the channels 420 of a particular one of the receiver stations 415A-M. Other elements of the example sonic data compressor 155 of FIG. 5 are configured to operate on one-dimensional sonic data. Accordingly, the sonic data compressor 155 of FIG. 5 includes an example data flattener 515 to flatten the multidimensional sonic data to form one-dimensional sonic data. In some examples, to flatten multidimensional sonic data corresponding to a particular one of the receiver stations 415A-M, the data flattener 515 concatenates blocks of sonic data from each of the channels (or dimensions) of the particular receiver station 415A-M to form a sequence of one-dimensional sonic data. For example, if the number of channels (or dimensions) supported at a particular receiver station 415A-M is nCh (e.g., such as nCh=8, or some other appropriate number), and the data flattener 515 concatenates blocks of sonic data having nPt data points (e.g., nPt=16, 32, 64, etc., or some other appropriate number), then to flatten the multidimensional sonic data for the particular receiver station 415A-M, the data flattener 515 concatenates nPt data blocks from each of the nCh channels (or dimensions) one after the other to form a one-dimensional sonic data block having nCh×nPt data points, as shown in FIG. 5.

The example sonic data compressor 155 of FIG. 5 further includes an example sonic data predictor 520 to predict future data samples of an input sonic waveform. In the illustrated example, the sonic data compressor 155 implements adaptive prediction based on a parameter, m. Assuming the input sonic waveform is correlated across data samples, the residual prediction error between the actual sonic data samples and the predicted sonic data samples determined by the sonic data predictor 520 will be relatively small. As such, compressing this residual prediction error can be yield compression gains over compressing the original input sonic waveform. At the sonic data decompressor 160, the sonic data samples can be recovered using the compressed residual prediction error samples and knowledge of the relevant initial parameters of the sonic data compressor 155. Implementation and operation of the sonic data predictor 520 is described in greater detail below.

The example sonic data compressor 155 of FIG. 5 also includes an example data encoder 525 to encode the residual prediction error samples determined by the sonic data predictor 520 to yield compressed sonic data representative of the original multidimensional sonic data applied to the sonic data compressor 155. The data encoder 525 can implement any appropriate type of data encoding. In some examples, assuming the input data samples will be small (e.g., such as when the input data samples correspond to a residual prediction error), the data encoder 525 can implement Rice encoding to encode the input data samples. Furthermore, in some such examples, the data encoder 525 can implement adaptive Rice encoding based on an adaptive Rice parameter, k. Implementation and operation of the data encoder 525 is described in greater detail below.

Figure 6:
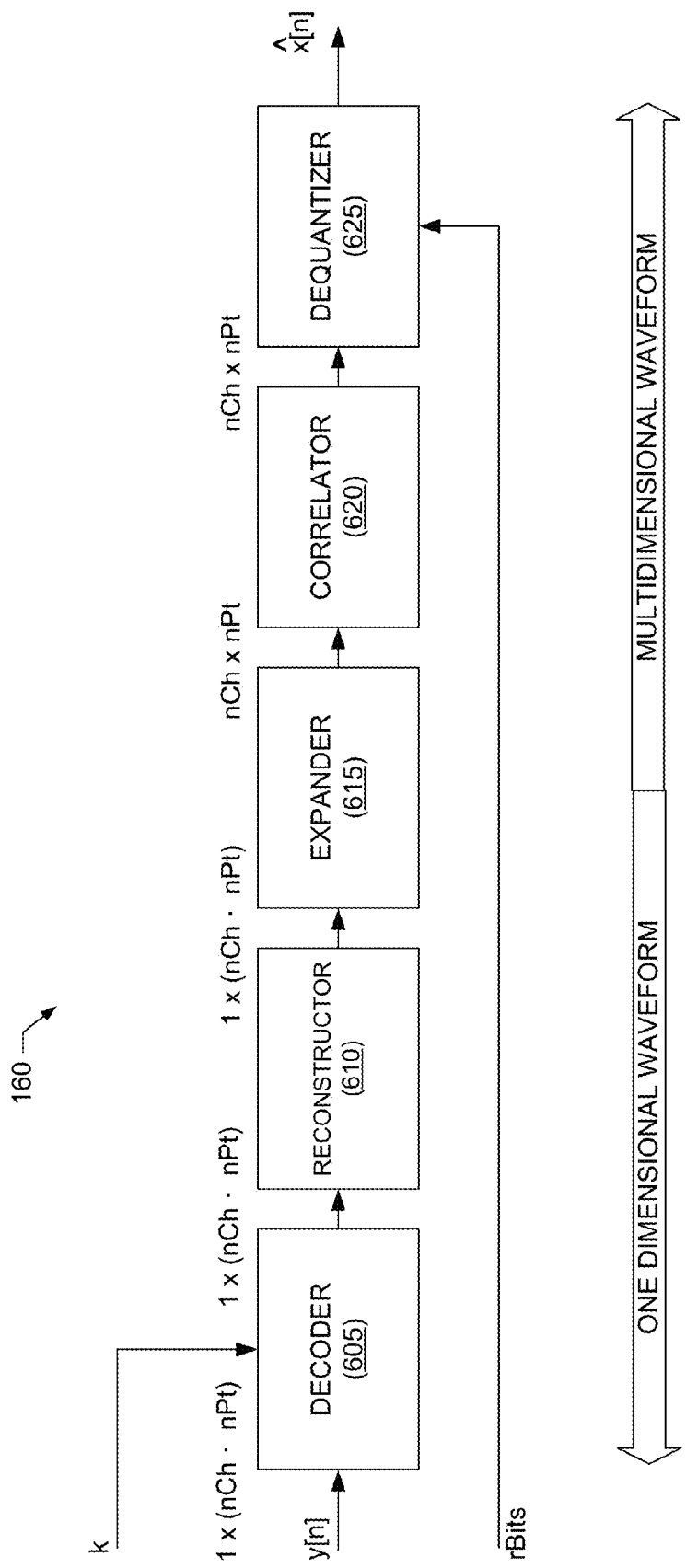
FIG. 6 is a block diagram illustrating an example sonic data decompressor capable of decompressing sonic data that has been compressed as disclosed herein.

As illustrated in the example of FIG. 5, the compressed sonic data output by the example sonic data compressor 155 for input multidimensional sonic data x[n] includes encoded residual prediction error data y[n], the values of the adaptive Rice parameter, k, for each encoded data block, and the adaptive quantization bit reduction parameter rBits for each quantized data block. FIG. 6 illustrates an example implementation of the sonic data decompressor 160 of FIG. 1 that can decompress the compressed sonic data output by the example sonic data compressor 155 of FIG. 5. The example sonic data decompressor 160 of FIG. 6 includes processing elements to decompress the compressed sonic data by performing the inverse of the processing performed by the respective elements of the example sonic data compressor 155 of FIG. 5.

As such, the example sonic data decompressor 160 of FIG. 6 includes an example data decoder 605 to perform decoding processing that is the inverse of the encoding processing performed by the example data encoder 525 of FIG. 5. For example, the data decoder 605 may implement adaptive Rice decoding based on the adaptive Rice parameter k included in the compressed data received from the sonic data compressor 155. The example sonic data decompressor 160 of FIG. 6 also includes an example sonic data reconstructor 610 to reconstruct one-dimensional sonic data from the decoded residual prediction error output by the data decoder 605. For example, the sonic data reconstructor 610 can reconstruct the one-dimensional sonic data using the residual prediction error output by the data decoder 605 and knowledge of the relevant configuration parameters of the sonic data predictor 520 of FIG. 5.

The example sonic data decompressor 160 of FIG. 6 further includes an example data expander 615 to invert the processing performed by the example data flattener 515 of FIG. 5 and, thus, convert the one-dimensional sonic data output by the sonic data reconstructor 610 to multidimensional sonic data. To undo the decorrelation processing performed by the sonic data decorrelator 510 of FIG. 5, the example sonic data decompressor 160 of FIG. 6 includes an example sonic data correlator 620. Example techniques for implementing the sonic data correlator 620 are described in greater detail below.

In some examples, the data decompressor 160 of FIG. 6 further includes an example dequantizer 625 to account for adaptive quantization performed by the quantizer 505 of FIG. 5. In such examples, the dequantizer 625 can use the quantization bit reduction parameter rBits received in the compresses sonic data to adjust the decompressed sonic data samples to account for the varying quantization bit reduction used by the quantizer 505 to adaptively quantize the input multidimensional sonic data that underwent compression.

Figure 7:
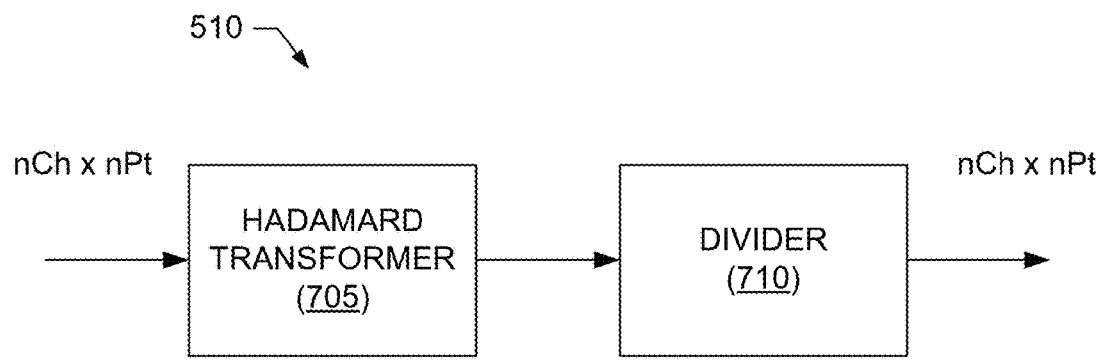
FIG. 7 is a block diagram of a first example sonic data decorrelator that can be used to implement the example sonic data compressor of FIG. 5.

A first example implementation of the sonic data decorrelator 510 of FIG. 5 is illustrated in FIG. 7. The example sonic data decorrelator 510 of FIG. 7 utilizes the Hadamard transform to decorrelate multidimensional sonic data obtained from a sonic tool receiver stations, such as one of the stations receiver stations 415A-M of the sonic tool 400 of FIG. 4. For reference, an example decorrelation scheme for stereo audio signals having a left (L) channel and right (R) channel involves computing mid and side signals from the stereo L and R signals using the following equations:

$$\text{mid}=\tfrac{1}{2}(L+R) \quad \text{Equation 1}$$

$$\text{side}=\tfrac{1}{2}(L-R) \quad \text{Equation 2}$$

If the L and R channels are substantially similar to each other, then the mid signal will be similar to (or equal to) the L (or R) channel, whereas the side signal will be a small signal that is close to (or equal to) zero. The resulting smaller signal can generally be compressed better (e.g., yielding a higher compression percentage/gain) than the original signals. Furthermore, because such a smaller signal will generally have smaller fluctuations, the sonic data predictor 520 can predict such a signal with smaller error, which further results in the data encoder 525 producing a shorter code stream.

The example sonic data decorrelator 510 of FIG. 7 builds upon the foregoing stereo decorrelation as follows. The stereo decorrelation defined by Equation 1 and Equation 2 can be represented by the following stereo decorrelation matrix:

$$H_s = H_2 = \frac{1}{2}\begin{bmatrix} +1 & +1 \\ +1 & -1 \end{bmatrix} \quad \text{Equation 3}$$

The stereo decorrelation matrix ($H_s$) of Equation 3 is also a Hadamard matrix of size 2 ($H_2$) normalized by the number of channels (i.e., 2) being decorrelated. To decorrelate 4-channel and 8-channel array waveforms, Hadamard matrices of size 4 and 8 can be generated by the following equation:

$$H_{2^{n+1}} = \begin{bmatrix} +H_{2^n} & +H_{2^n} \\ +H_{2^n} & -H_{2^n} \end{bmatrix} \text{ where } H_{2^0} = 1 \quad \text{Equation 4}$$

For example, let x be a $1 \times 2^n$ vector representing samples of a multidimensional sonic waveform having $2^n$ channels (or dimensions) at a given sample time. In other words, for a given time k, the first element of the vector x is the sonic sample at time k from the first channel, the second element of the vector x is the sonic sample at time k from the second channel, and so on. The decorrelated multidimensional sonic data vector d is then obtained by multiplying the vector x with the $2^n$ Hadamard matrix, which can be represented by:

$$d = x \cdot \frac{1}{2^n} H_{2^n} \quad \text{Equation 5}$$

Accordingly, the example sonic data decorrelator 510 of FIG. 7 includes an example Hadamard transformer 705 to implement the multiplication of the input multidimensional sonic data vector x having length $2^n$ (corresponding to $2^n$ channels/dimensions) by the $2^n$ Hadamard matrix $H_{2^n}$ as shown in Equation 5. The example sonic data decorrelator 510 of FIG. 7 also includes an example divider 710 to implement the division by $2^n$ shown in Equation 5 (or division by another factor that is based on, for example, the number of channels/dimensions of the multidimensional sonic data).

Figure 8:
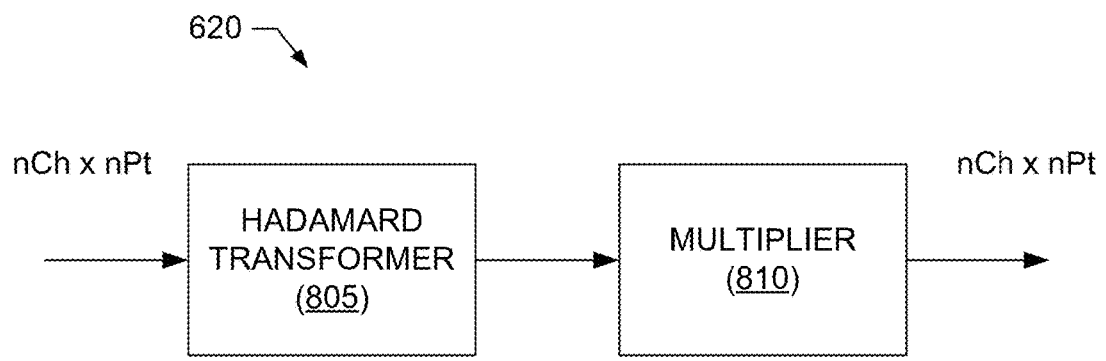
FIG. 8 is a block diagram of a first example sonic data correlator that can be used to implement the example sonic data decompressor of FIG. 6.

A first example implementation of the sonic data correlator 620 of FIG. 6 is illustrated in FIG. 8. The example sonic data correlator 620 of FIG. 8 is configured to correlate multidimensional sonic data that has been decorrelated using the example sonic decorrelator 510 of FIG. 7. As described above, the sonic decorrelator 510 of FIG. 7 decorrelates multidimensional sonic data based on the expression of Equation 5. With reference to Equation 5, the original multidimensional sonic data vector x can be recovered from the decorrelated multidimensional sonic data vector d by multiplying the decorrelated vector d by the $2^n$ Hadamard matrix again because:

$$H_{2^n} \cdot H_{2^n} = 2^n \cdot I_{2^n}. \quad \text{Equation 6}$$

where $I_{2^n}$ is a $2^n \times 2^n$ identity matrix. Written mathematically, the original multidimensional sonic data vector x can be recovered from the decorrelated multidimensional sonic data vector d using the following equation:

$$x = d \cdot H_{2^n} \quad \text{Equation 7}$$

Accordingly, the example sonic data correlator 620 of FIG. 8 includes an example Hadamard transformer 805 (which may be similar to the Hadamard transformer 705 of FIG. 7) to implement the multiplication of the decorrelated multidimensional sonic data vector d having length $2^n$ (corresponding to $2^n$ channels/dimensions) by the $2^n$ Hadamard matrix $H_{2^n}$ as shown in Equation 7. As described in greater detail below, in some examples, the example sonic data correlator 620 of FIG. 8 may also include an example multiplier 810 to multiply the output of the Hadamard transformer 805 by a scale factor (e.g., which may be based on the number of channels/dimensions of the multidimensional sonic data).

In some examples, the sonic data decorrelator 510 of FIG. 7 may provide a lossy decorrelation if, for example, the decorrelated sonic data vector d is forced to be represented with a limited number (e.g., 16, or some other number) of bits, such as when the decorrelated sonic data vector d is forced to be represented with the same number of bits as the input multidimensional sonic data vector x. For example, if the input vector x is represented by 16 bit integers, then to force the decorrelated vector d to be representable by 16 bit integers, the Hadamard transformer 705 may implement division by right shifts to keep d within a 16 bit representation. Accordingly, n least significant bits can be lost during the decorrelation process for a $2^n$-channel waveform. Considering a waveform range that is $[-2^{-15}, 2^{15})$, the sample difference whose range is $(-2^{n-1}, 2^{n-1})$ may be small when n is equal to 2 (for a 4-channel signal) or 4 (for an 8-channel signal). However, this can cause some degradation when the input multidimensional signal is weak Therefore, in some examples, the example sonic data decorrelator 510 of FIG. 7 and the example sonic data correlator 620 of FIG. 8 can be modified to implement a decorrelation/correlation scheme given by $$d = x \cdot H_{2^n} \rightarrow x' = d \cdot \frac{1}{2^n} H_{2^n} \quad \text{Equation 8}$$

or by

-continued $$d = x \cdot \frac{1}{\sqrt{2^n}} H_{2^n} \to x' = d \cdot \frac{1}{\sqrt{2^n}} H_{2^n} \qquad \text{Equation 9}$$

In the preceding two examples of Equation 8 and Equation 9, the sonic data decorrelator 510 would implement the left side of the respective equation, and the sonic data correlator 620 would implement the right side of the corresponding equation. An example implementation based on Equation 8 can be used to make the decorrelation scheme lossless. However, because the decorrelated signal is not normalized, the range of d is $[-2^{-15-n}, 2^{15+n})$, which can yield less compression than the original signal. On the other hand, an example implementation based on Equation 9 normalizes the signal energy. However, if d is forced to be represented as an integer, then such an implementation can still exhibit quantization loss during the decorrelation process, as well as during the correlation process.

Figure 9:
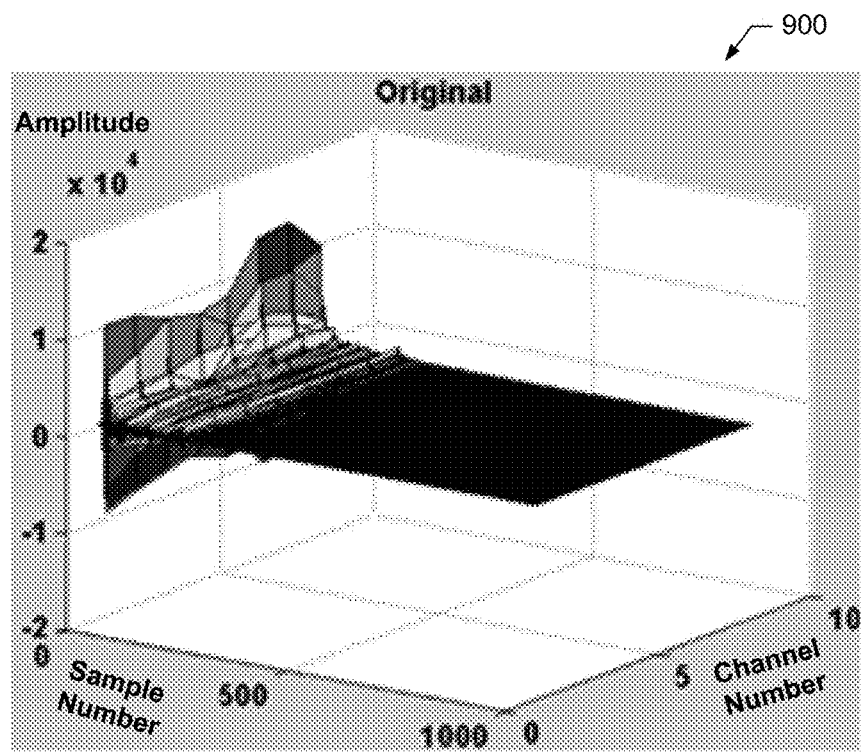
FIGS. 9-16 depict graphs illustrating example performance results achievable by the example sonic data decorrelator and correlator of FIGS. 7-8.
Figure 10:
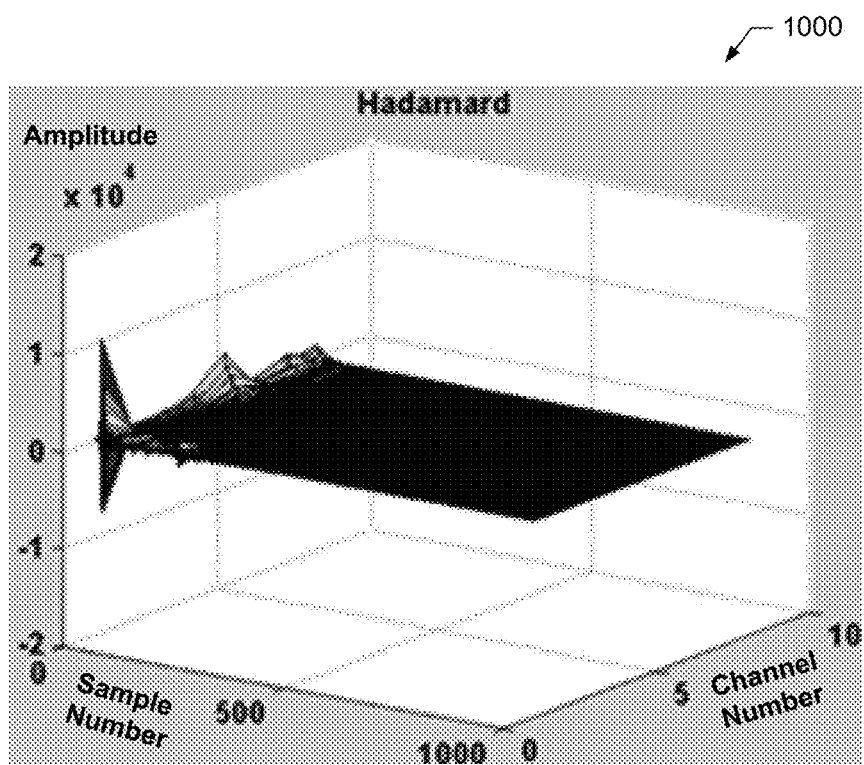
Figure 11:
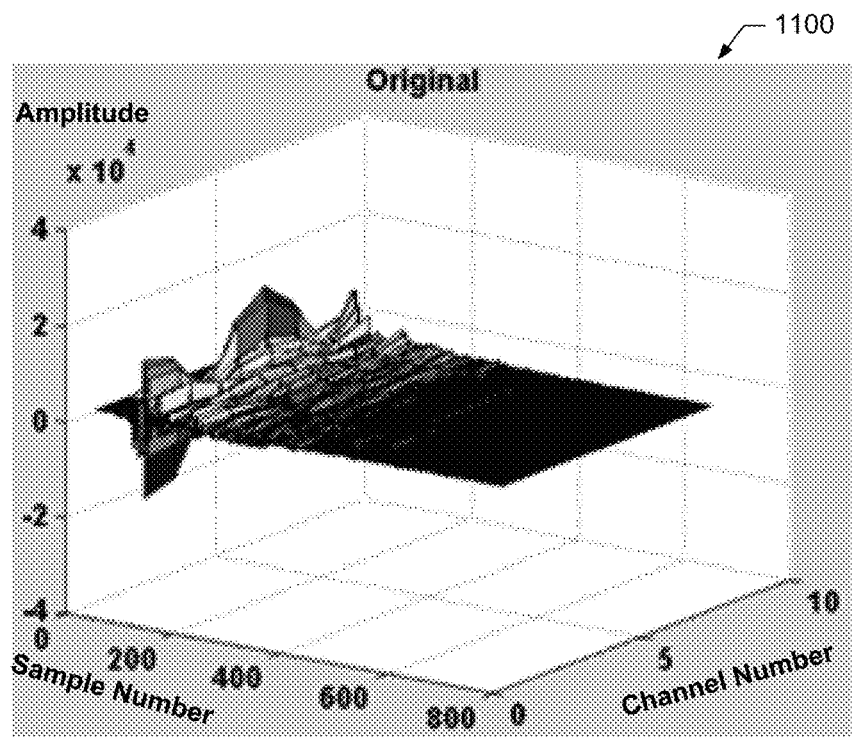
Figure 12:
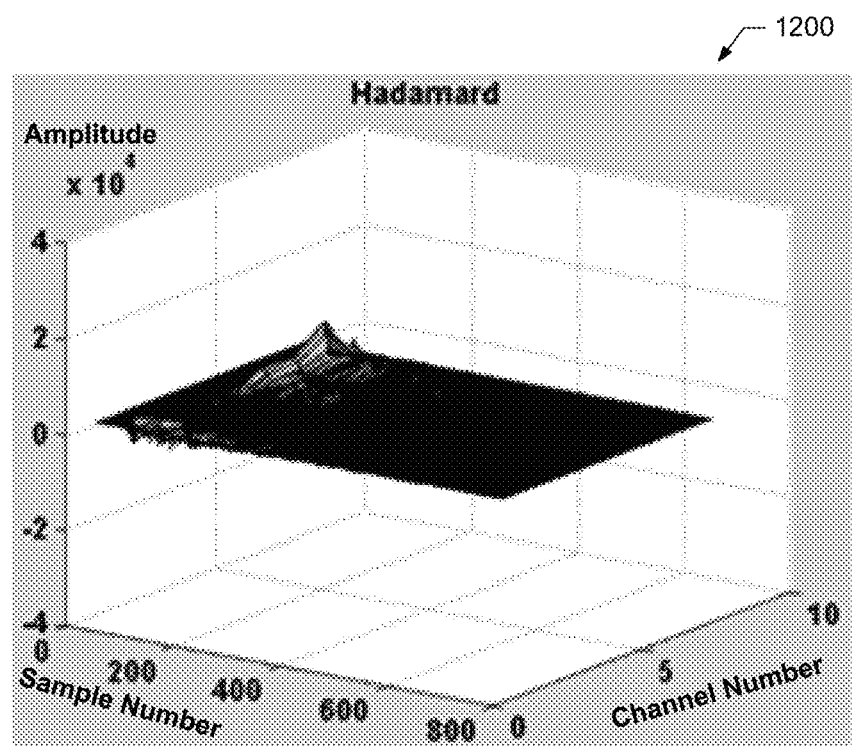

Example performance results achievable by the example sonic data decorrelator 510 of FIG. 7 and the example sonic data correlator of FIG. 8 are shown in FIGS. 9-16. FIG. 9 depicts an example monopole multidimensional sonic waveform 900 obtained by a given receiver station, and FIG. 11 illustrates an example dipole multidimensional sonic waveform 1100 obtained by a given receiver station. FIGS. 10 and 12 depict respective decorrelated waveforms 1000 and 1200 obtained by the example sonic data decorrelator 510 of FIG. 7 for the input multidimensional sonic waveforms 900 and 1100 depicted in FIGS. 9 and 11, respectively. In each of these figures, the x-axis represents the data sample index (e.g., corresponding to sample time), the y-axis represents the channel number, or dimension, (e.g., 0-7), and the z-axis represents the value of the sonic data. In the example of FIG. 9, the multidimensional monopole signal 900 is highly correlated over the different channels (dimensions), whereas in the example of FIG. 11, the multidimensional dipole signal 1100 is not as highly correlated over the channels (dimensions). However, after Hadamard decorrelation using the example sonic data decorrelator 510 of FIG. 7, the amplitudes of the resulting decorrelated signals 1000 and 1200 are reduced substantially.

Figure 13:
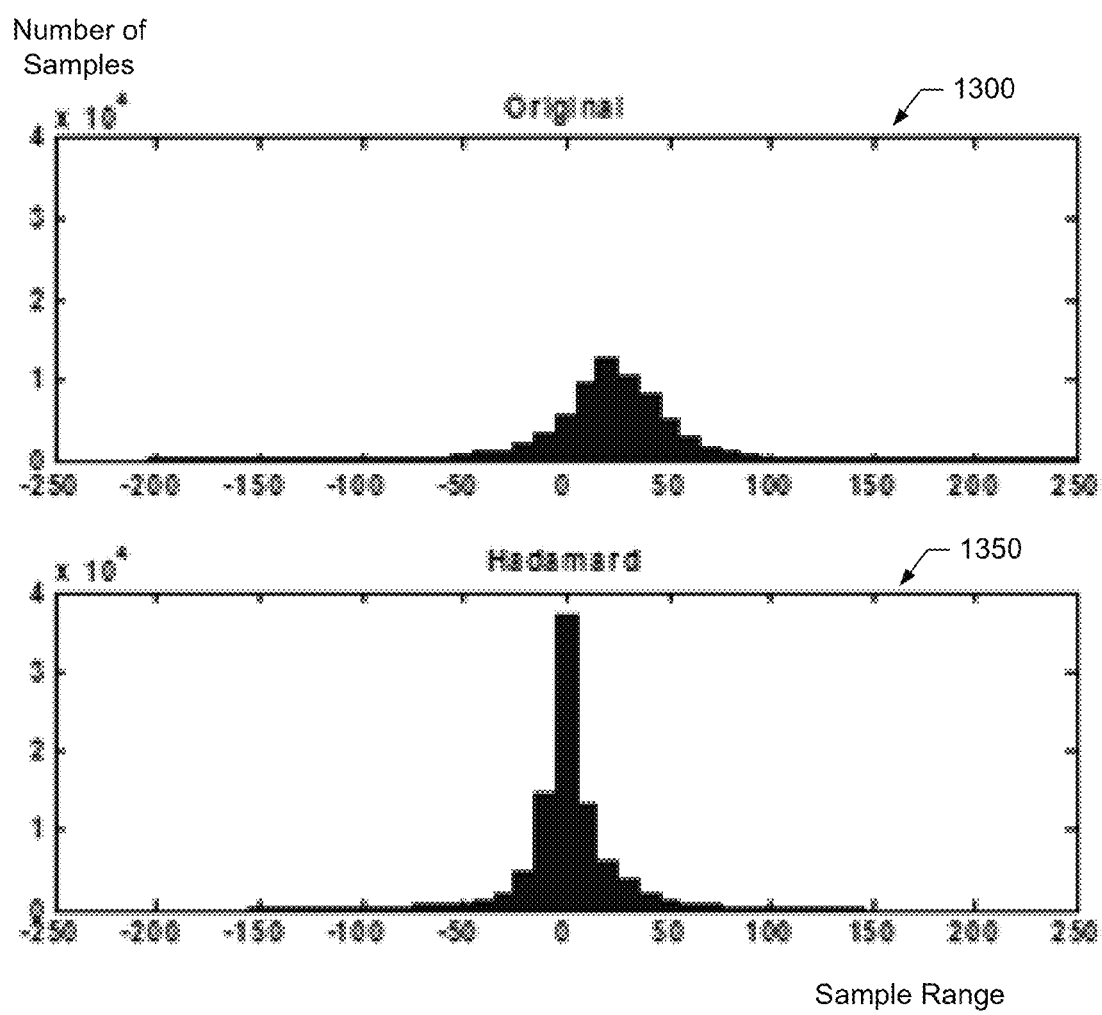
Figure 14:
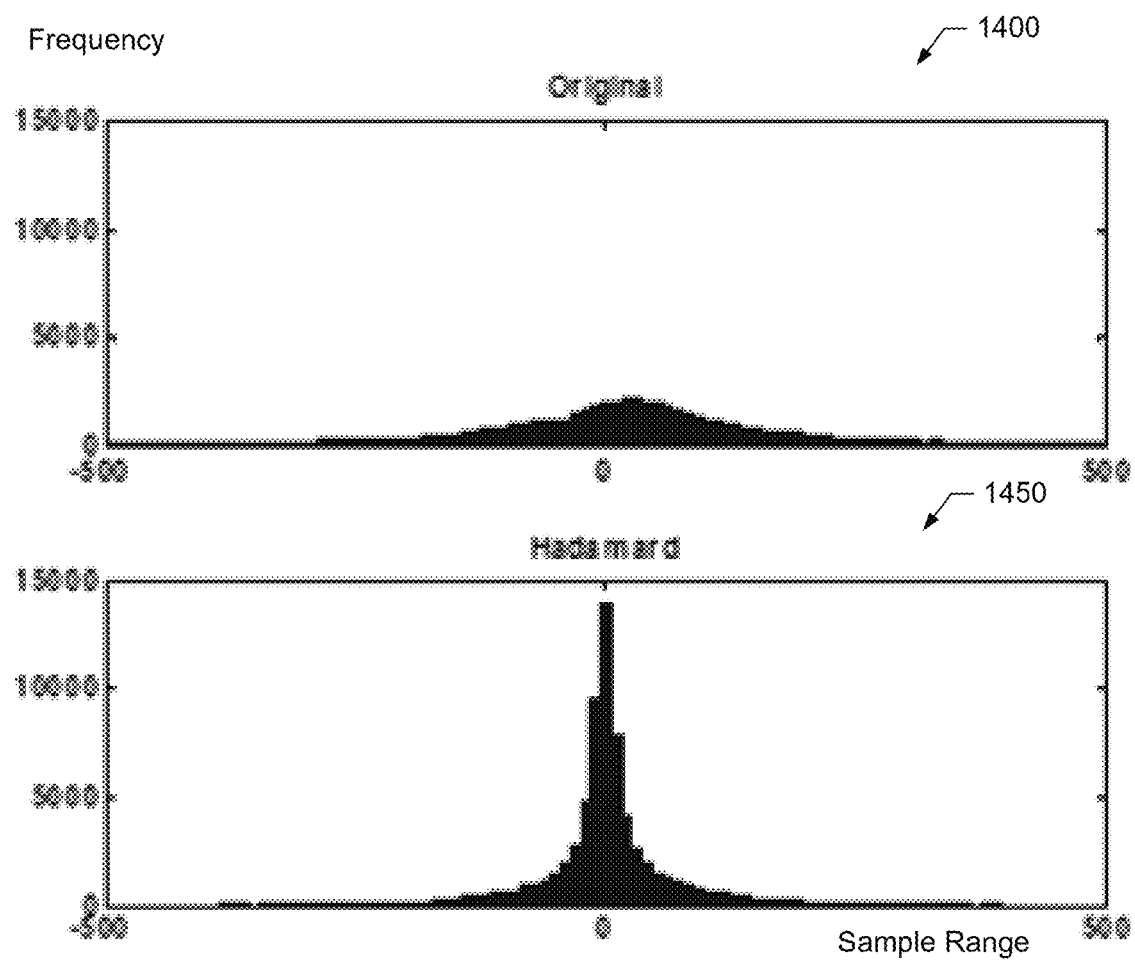

A goal of decorrelation is to concentrate the histogram of the decorrelated waveform in the origin such that a majority part of signal lies in a narrower range, with a higher peak at the center. In this way, the data encoder 525 implementing Rice encoding can encode the decorrelated signal with fewer bits than the original signal. For example, respective histograms 1300 and 1350 of the original monopole waveform 900 and the corresponding decorrelated monopole waveform 1000 are shown in FIG. 13. Similarly, respective histograms 1400 and 1450 of the original dipole waveform 1000 and the corresponding decorrelated dipole waveform 1200 are shown in FIG. 14. The example histograms depicted in FIGS. 13 and 14 demonstrate that the Hadamard decorrelation scheme implemented by the example sonic data decorrelator 510 of FIG. 7 achieves this goal. For the monopole example, the example histogram 1300 shows that 80% of original monopole samples were in the range [−240, 240], whereas the example histogram 1350 shows that 80% of Hadamard decorrelated monopole samples were in the range [−40, 40]. For the dipole example, the example histogram 1400 shows that 80% of original dipole samples were in the range [−520, 520], whereas the example histogram 1450 shows that 80% of Hadamard decorrelated dipole samples were in the range [420, 120].

Figure 15:
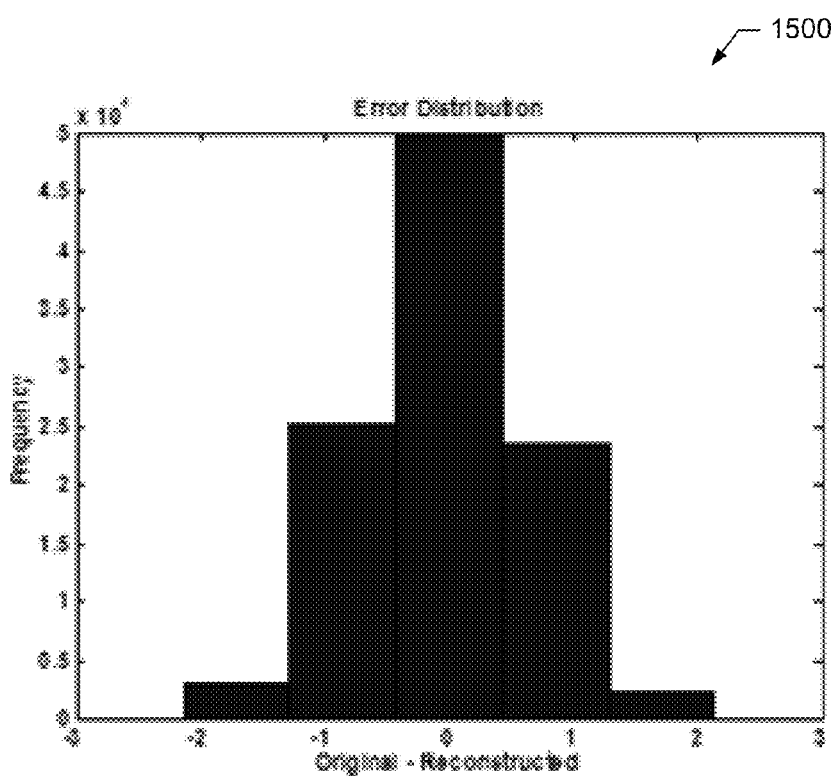
Figure 16:
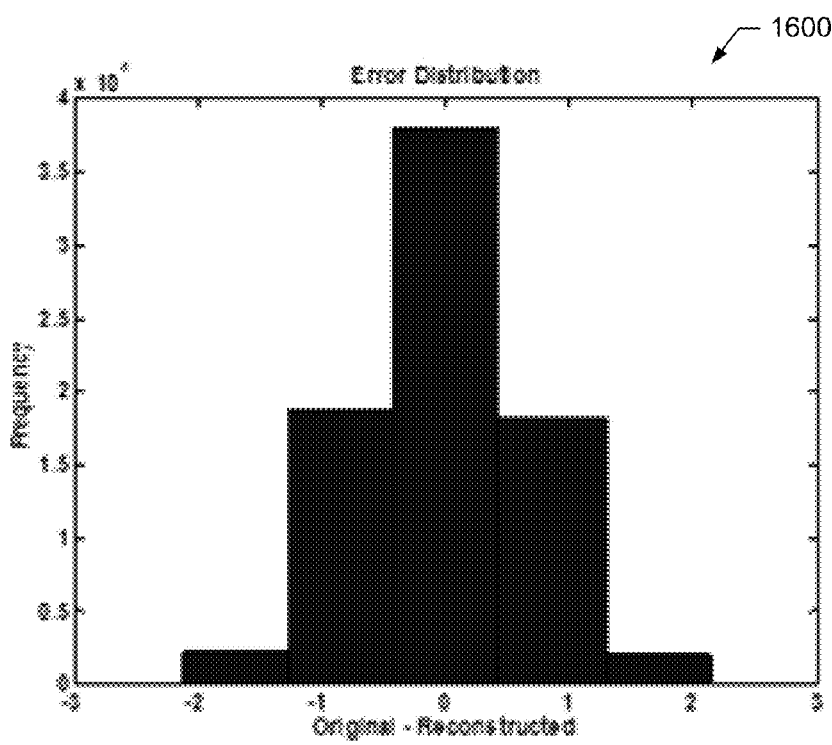

Examples of the decorrelation error introduced by the division performed by the example sonic data decorrelator 510 of FIG. 7 are shown in FIGS. 15-16. FIG. 15 depicts an example histogram 1500 of the error (defined as the difference between the original sample value and the reconstructed sample value after decorrelation and correlation) for the example monopole data of FIGS. 9 and 11, whereas FIG. 16 depicts an example histogram 1600 of the error for the example dipole data of FIGS. 10 and 12. The example histograms 1500 and 1600 show that the error ranges from −3 to 3 for the 8-channel array waveform and the error is concentrated at 0 with only a few samples having error of −3 or 3.

Figure 17:
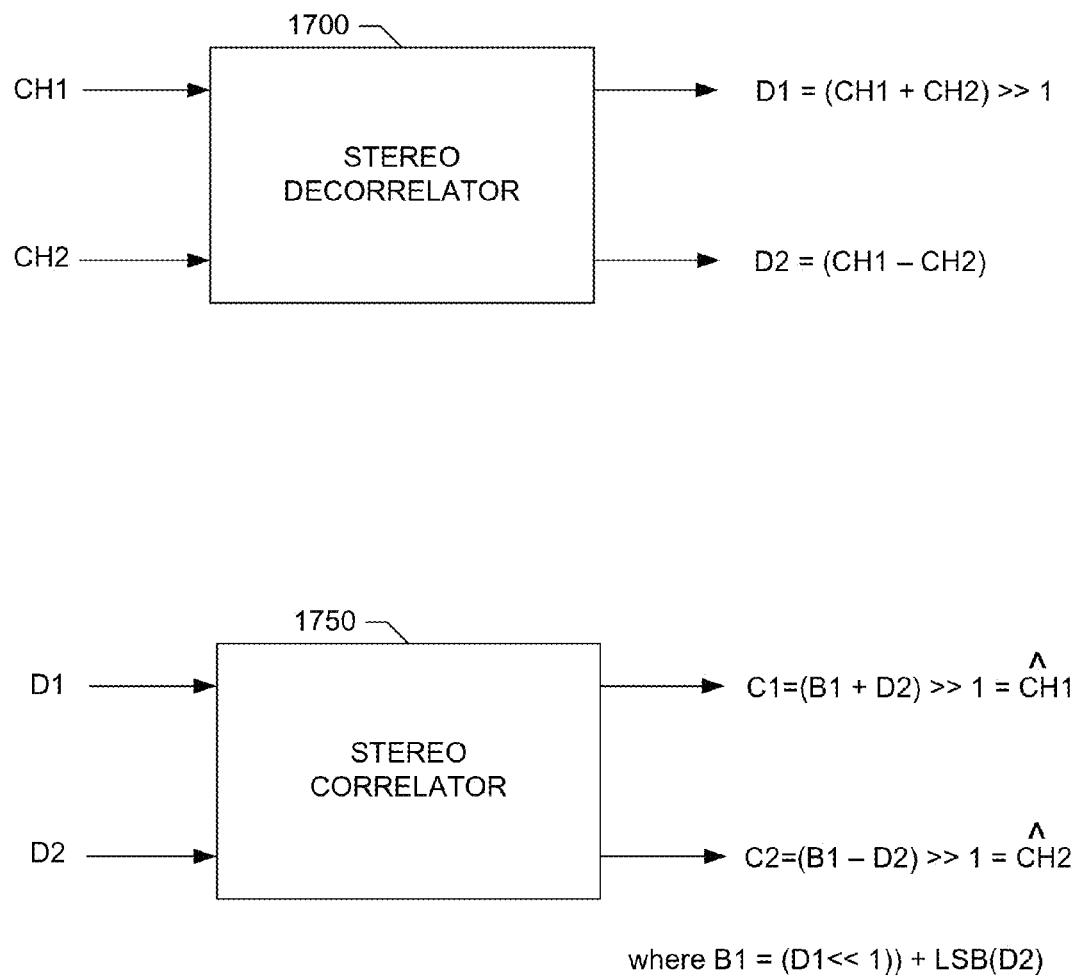
FIG. 17 includes block diagrams of an example stereo decorrelator and an example stereo correlator that can be used to implement the example sonic data decorrelators and correlators illustrated in FIGS. 18 and 19A-B.

As described above, the example sonic data decorrelator 510 of FIG. 7 and the example sonic data correlator 620 of FIG. 8 implement a first example sonic decorrelation and correlation scheme that may be lossy. A second example sonic decorrelation and correlation scheme that provides lossless (or less lossy) sonic decorrelation and correlation is now described. Stereo decorrelation as defined in Equation 1 and Equation 2 in which mid=(L+R)/2 and side=(L−R)/2 can be applied to analog signals without loss. However, because of the division by 2, such stereo decorrelation can be lossy when it is applied to the finite representation of digital signals. To address this issue, an example stereo decorrelator 1700 and a corresponding example stereo correlator 1750 that can implement stereo decorrelation and correlation of digital signals with less or no loss are illustrated in FIG. 17. The stereo decorrelator 1700 and corresponding stereo correlator 1750 of FIG. 17 are based on the fact that the least significant bit of the addition of the left and right stereo channels (L+R) and the least significant bit of the difference between the left and right stereo channels (L−R) are the same.

In the illustrated example of FIG. 17, the stereo decorrelator 1700 implements stereo decorrelation according to the following equations:

$$\text{mid} = \tfrac{1}{2}(L+R) \qquad \text{Equation 10}$$

and $$\text{side} = (L-R) \qquad \text{Equation 11}$$

where the division by 2 in Equation 10 is implemented by a right bit shift by 1 bit. (In the example of FIG. 17, the left channel L is represented as channel 1, or CH1, and the right channel R is represented as channel 2, or CH2.) Such a right shift would result in the loss of the least significant bit (LSB) of the mid signal under conventional stereo decorrelation. However, the example stereo correlator 1750 can recover this LSB and, thus, recover the original left and right channels without loss (or with less loss) as follows.

First, the stereo correlator 1750 left shifts the mid signal by 1 bit, which yields (L+R) with 0 as the LSB. Because (L+R) and (L−R) have the same LSB, the stereo correlator 1750 sets the LSB of (L+R) to be same as the LSB of the side signal. Then, the stereo correlator 1750 reconstructs the original L and R without (or with less) loss using linear combinations of the input decorrelated data. The resulting overall operation of the stereo correlator 1750 to recover the left (L) and right (R) signals from the decorrelated mid and side signals determined according to Equation 10 and Equation 11 is given by the following equations:

$$L = \tfrac{1}{2}(((\text{mid} \ll 1) + \text{LSB}(\text{side})) + \text{side}) \qquad \text{Equation 12}$$

and $$R = \tfrac{1}{2}(((\text{mid} \ll 1) + \text{LSB}(\text{side})) - \text{side}) \qquad \text{Equation 13}$$

Decorrelation of multidimensional sonic data having greater than two dimensions (or channels) can be performed using successive stages of the example stereo decorrelator 1700 of FIG. 17. The corresponding correlation of such decorrelated multidimensional sonic data can likewise be performed using successive stages of the example stereo correlator 1750 of FIG. 17. As described in greater detail below, each such successive decorrelation stage includes multiple stereo decorrelators 1700, with a stereo decorrelator 1700 in a successive stage operating on the outputs from two stereo decorrelators 1700 in a preceding stage. Similarly, each successive correlation stage includes multiple stereo correlators 1750, with a stereo correlator 1750 in a successive stage operating on the outputs from two stereo correlators 1750 in a preceding stage.

Figure 18:
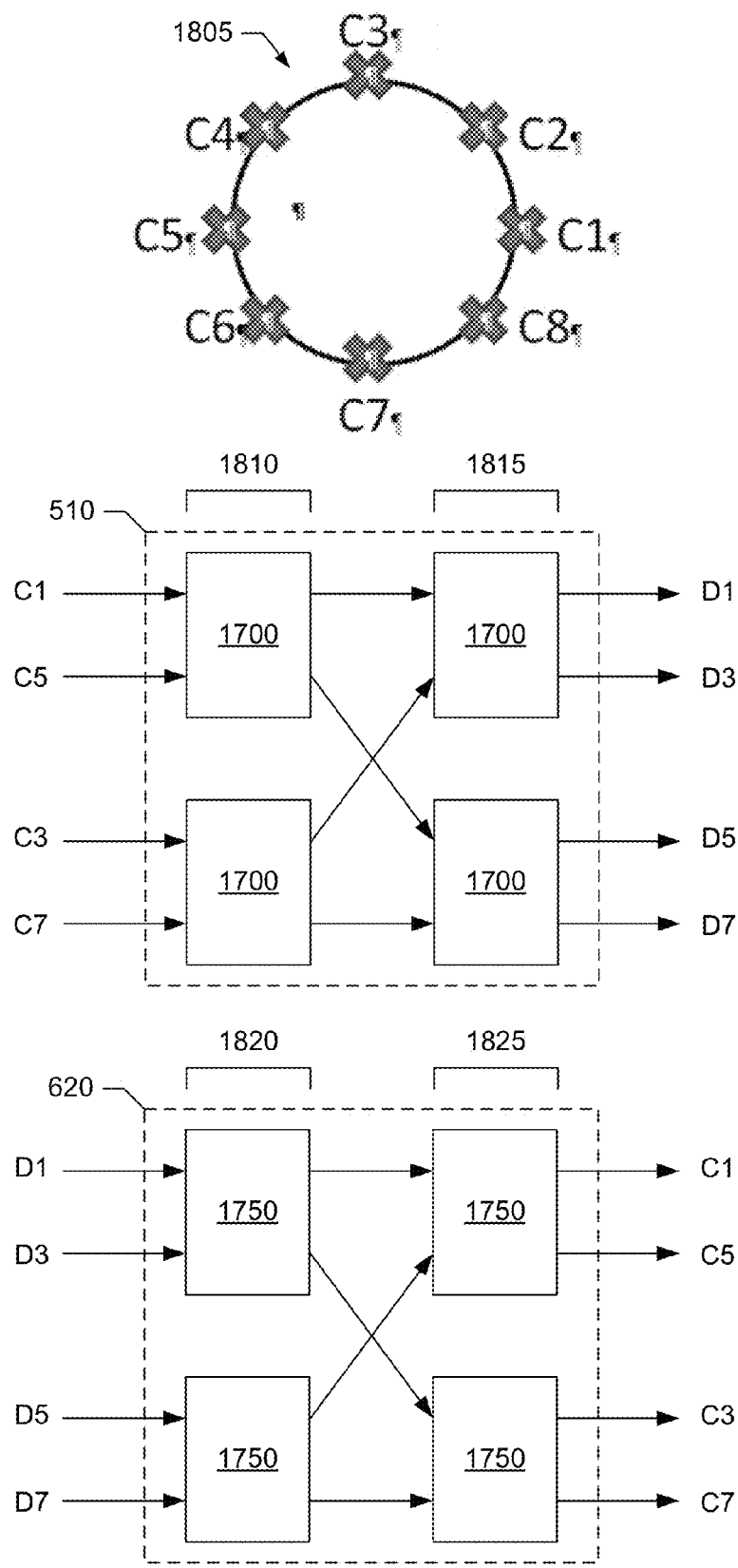
FIG. 18 include block diagrams of a second example sonic data decorrelator and a second example sonic data correlator, which are implemented using the example stereo decorrelator and the example stereo correlator of FIG. 17, and that can be used to implement the example sonic data compressor of FIG. 5 and the example sonic data decompressor of FIG. 6.

With the foregoing in mind, FIG. 18 illustrates a second example implementation of the example sonic data decorrelator 510 of FIG. 5 that is based on the example stereo decorrelator 1700 of FIG. 17. FIG. 18 also illustrates a corresponding second example implementation of the sonic data correlator 620 of FIG. 6 that is based on the example stereo correlator 1750 of FIG. 17. The example sonic data decorrelator 510 and the example sonic data correlator 620 of FIG. 18 implement 4-channel (or 4-dimension) decorrelation and correlation of sonic data obtained from channels C1, C3, C5 and C7 of the example receiver station 1805 illustrated in FIG. 18. As shown in FIG. 18, the channels C1, C3, C5 and C7 correspond to different azimuthal directions from which the sonic data is obtained at the receiver station 1805.

The example sonic data decorrelator 510 of FIG. 18 includes two stages of stereo decorrelators 1700 to implement 4-channel sonic data decorrelation. The first stereo decorrelation stage 1810 includes two stereo decorrelators 1700 that operate on pairs of opposite azimuthal channels such that one stereo decorrelator 1700 operates on the channel pair C1/C5, and the other stereo decorrelator 1700 operates on the channel pair C3/C7. The second stereo decorrelation stage 1815 includes two stereo decorrelators 1700 that operate on pairs of outputs of the first stereo decorrelation stage 1810 such that one stereo decorrelator 1700 operates on the pair of mid outputs from the first stage 1810, and the other stereo decorrelator 1700 operates on the pair of side outputs from the first stage 1810.

Likewise, the example sonic data correlator 620 of FIG. 18 includes two stages of stereo correlators 1750 to implement 4-channel sonic data correlation. The first stereo correlation stage 1820 includes two stereo correlators 1750 that operate on pairs of adjacent decorrelated azimuthal channels such that one stereo correlator 1750 operates on the decorrelated channel pair D1/D3, and the other stereo correlator 1750 operates on the decorrelated channel pair D5/D7. The second stereo correlation stage 1825 includes two stereo correlators 1750 that operate on pairs of outputs of the first stereo correlation stage 1820 such that one stereo correlator 1700 operates on the pair of left (L) outputs from the first stage 1815, and the other stereo correlator 1750 operates on the pair of right (R) outputs from the first stage 1815.

Figure 19A:
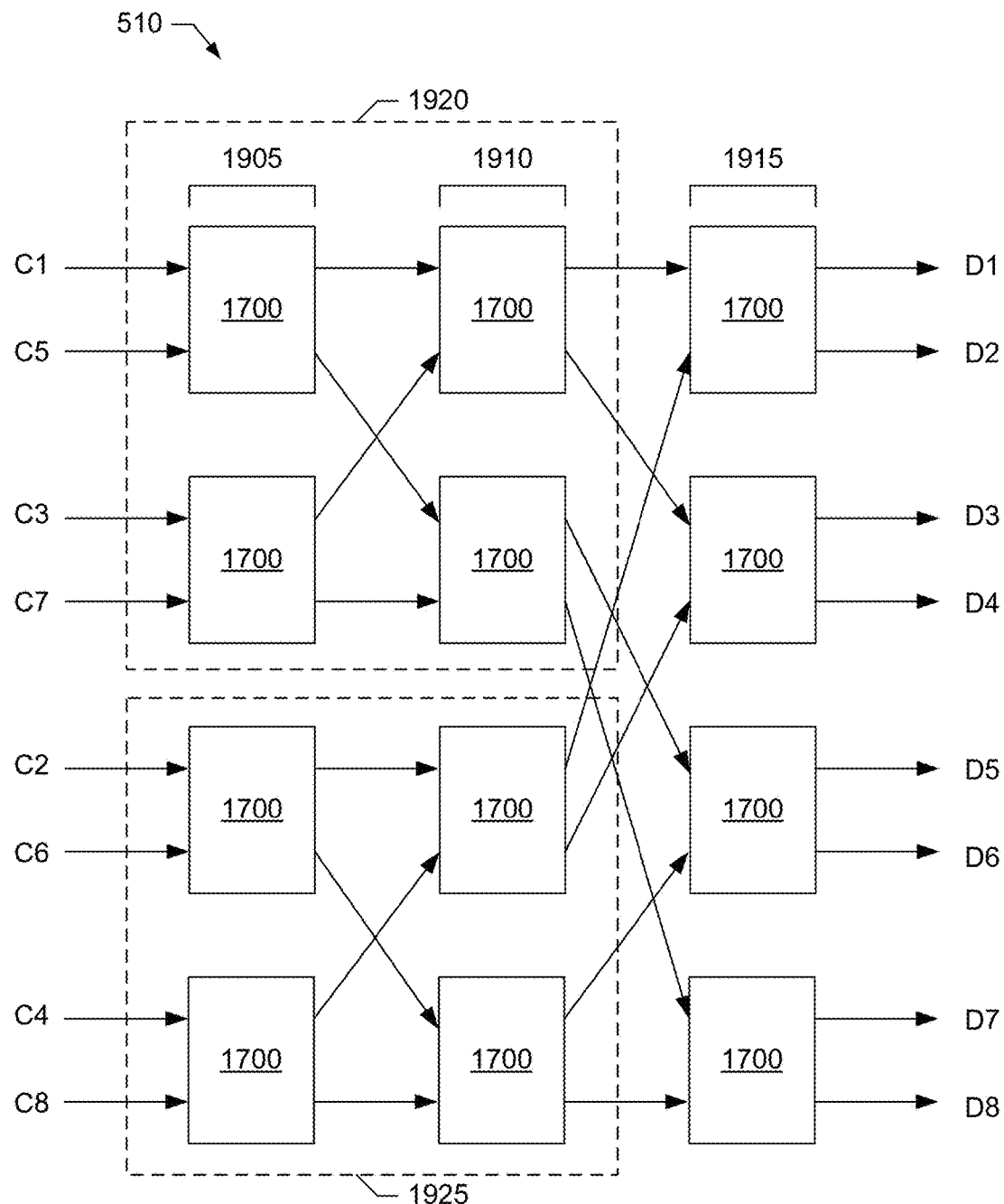
FIGS. 19A-B collectively include block diagrams of a third example sonic data decorrelator and a third example sonic data correlator, which are implemented using the example stereo decorrelator and the example stereo correlator of FIG. 17, and that can be used to implement the example sonic data compressor of FIG. 5 and the example sonic data decompressor of FIG. 6.
Figure 19B:
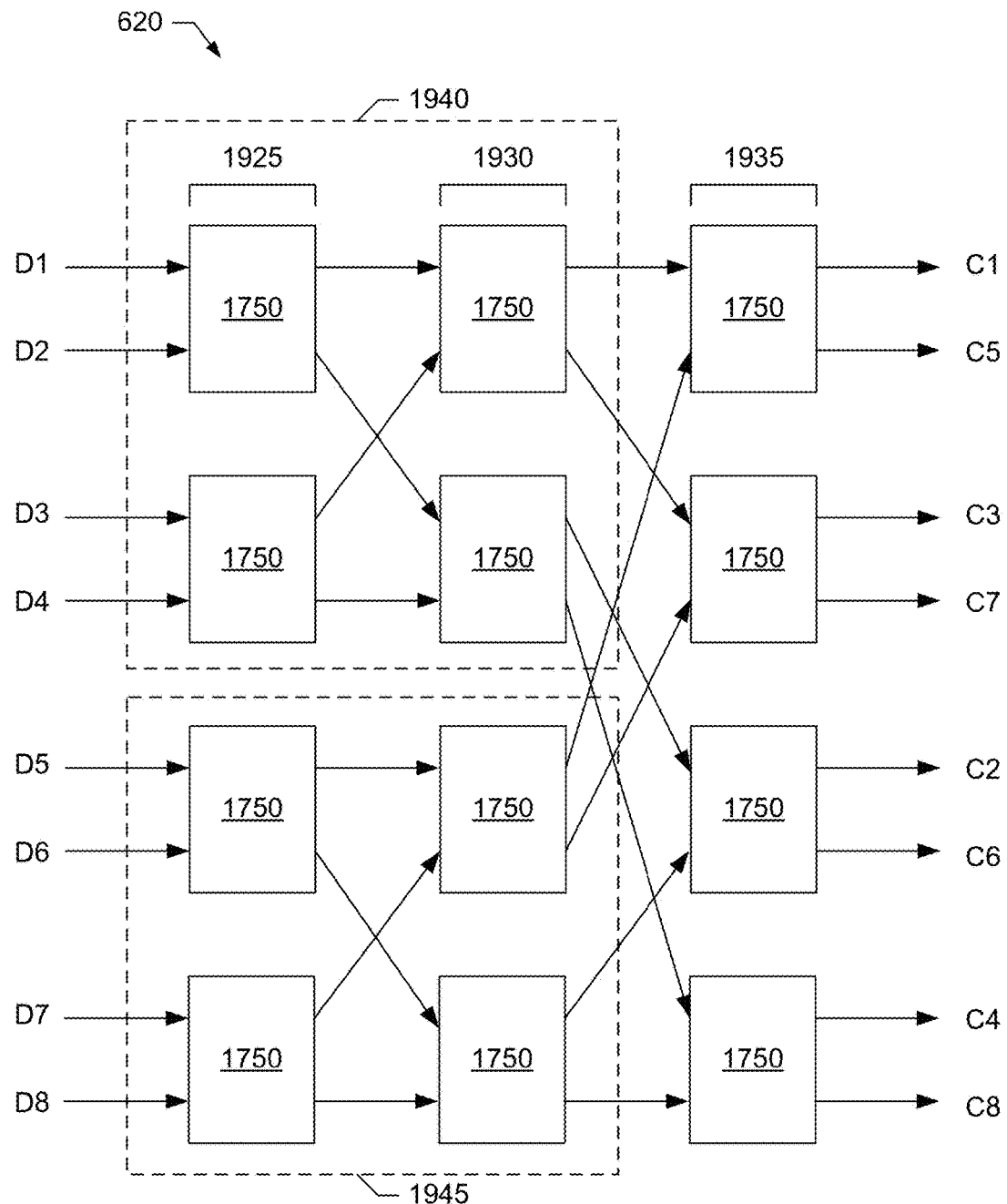

A third example implementation of the example sonic data decorrelator 510 of FIG. 5 that is based on the example stereo decorrelator 1700 of FIG. 17 is illustrated in FIG. 19A. A corresponding third example implementation of the sonic data correlator 620 of FIG. 6 that is based on the example stereo correlator 1750 of FIG. 17 is illustrated in FIG. 19B. The example sonic data decorrelator 510 of FIG. 19A and the example sonic data correlator 620 of FIG. 19B implement 8-channel (or 8-dimension) decorrelation and correlation of sonic data obtained from channels C1 through C8 of the example receiver station 1805 illustrated in FIG. 18. As shown in FIG. 18, the channels C1-C8 each correspond to different azimuthal directions from which the sonic data is obtained at the receiver station 1805.

The example sonic data decorrelator 510 of FIG. 19A includes three stages of stereo decorrelators 1700 to implement 8-channel sonic data decorrelation. The first two stereo decorrelation stage 1905 and 1910 each include four stereo decorrelators 1700 that are arranged to implement two, 4-channel sonic decorrelation operations 1920 and 1925, with the first 4-channel sonic decorrelation operation 1920 operating on the azimuthal channels C1, C3, C5 and C7, and the second 4-channel sonic decorrelation operation 1925 operating on the azimuthal channels C2, C4, C6 and C8. The third stereo decorrelation stage 1915 includes four stereo decorrelators 1700 that operate on pairs of outputs of the second stereo decorrelation stage 1910 such that a first stereo decorrelator 1700 operates on a first pair of mid outputs from the second stage 1910, a second stereo decorrelator 1700 operates on a second pair of mid outputs from the second stage 1910, a third stereo decorrelator 1700 operates on a first pair of side outputs from the second stage 1910, and the fourth stereo decorrelator 1700 operates on a second pair of side outputs from the second stage 1910.

Likewise, the example sonic data correlator 620 of FIG. 19B includes three stages of stereo correlators 1750 to implement 8-channel sonic data correlation. The first two stereo correlation stage 1925 and 1930 each include four stereo correlators 1750 that are arranged to implement two, 4-channel sonic correlation operation 1940 and 1945, with the first 4-channel sonic correlation operation 1940 operating on the decorrelated azimuthal channels D1-D4, and the second 4-channel sonic correlation operation 1945 operating on the decorrelated azimuthal channels D5-D8. The third stereo correlation stage 1935 includes four stereo correlators 1750 that operate on pairs of outputs of the second stereo correlation stage 1930 such that a first stereo correlator 1750 operates on a first pair of left (L) outputs from the second stage 1930, a second stereo correlator 1750 operates on a second pair of left (L) outputs from the second stage 1930, a third stereo correlator 1750 operates on a first pair of right (R) outputs from the second stage 1930, and the fourth stereo correlator 1750 operates on a second pair of right (R) outputs from the second stage 1930.

The example sonic data decorrelators 510 of FIGS. 18 and 19A yield data decorrelation that is similar to the example Hadamard transform decorrelator implementation of FIG. 7. For example, operation of the example 4-channel sonic data decorrelator 510 of FIG. 18 can be approximated by a 4-dimensional Hadamard transform operation given by the following equation:

$$d \cong x \cdot \text{diag}\left\{\left[\begin{array}{cccc} \frac{1}{4} & \frac{1}{2} & \frac{1}{2} & 1 \end{array}\right]\right\} \cdot H_4 \qquad \text{Equation 14}$$

where diag{z} represents a diagonal matrix whose diagonal elements are the elements of the vector z. As another example, operation of the example 8-channel sonic data decorrelator 510 of FIG. 19A can be approximated by an 8-dimensional Hadamard transform operation given by the following equation:

$$d \cong x \cdot \text{diag}\left\{\left[\begin{array}{cccccccc} \frac{1}{8} & \frac{1}{4} & \frac{1}{4} & \frac{1}{2} & \frac{1}{4} & \frac{1}{2} & \frac{1}{2} & 1 \end{array}\right]\right\} \cdot H_8 \qquad \text{Equation 15}$$

In some examples, the decorrelated signals obtained by the example sonic data decorrelators 510 of FIGS. 18 and 19A, which are based on the example stereo decorrelator 1700 of FIG. 17, may be similar to, but not necessarily equal to, the right hand sides of Equation 14 and Equation 15 because implementation of the successive stereo decorrelation stages may involve rounding operations at each stage (e.g., to maintain a fixed bit data representation). Furthermore, Equation 14 and Equation 15 demonstrate that the range of the decorrelated signals can be larger than the original signal. For example, for 16-bit input data, the decorrelated signals d produced by the example sonic data decorrelators 510 of FIGS. 18 and 19A can range from $[-2^{-16} \sim 2^{16})$, which can be represented using 17 bits. However, the large magnitude numbers seldom may seldom occur and, thus, may not degrade compression performance. Also, because of division (right shifts), the decorrelated signals produced by the example sonic data decorrelators 510 of FIGS. 18 and 19A may be more concentrated on the center, and hence improve compression performance.

Figure 20:
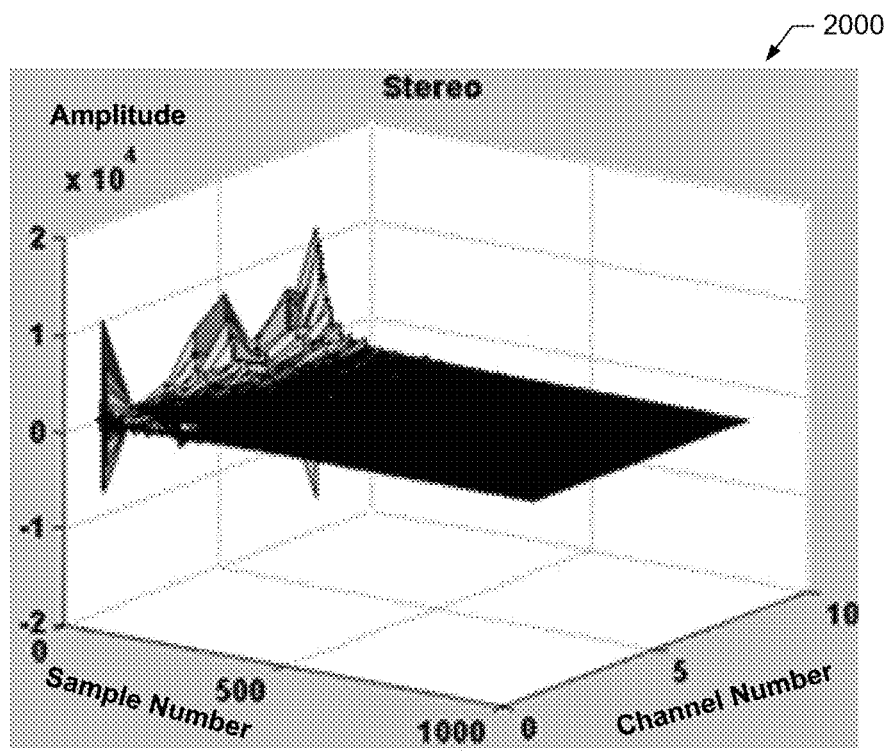
FIGS. 20-23 depict graphs illustrating example performance results achievable by the example sonic data decorrelators and correlators of FIGS. 17, 18 and 19A-B.
Figure 21:
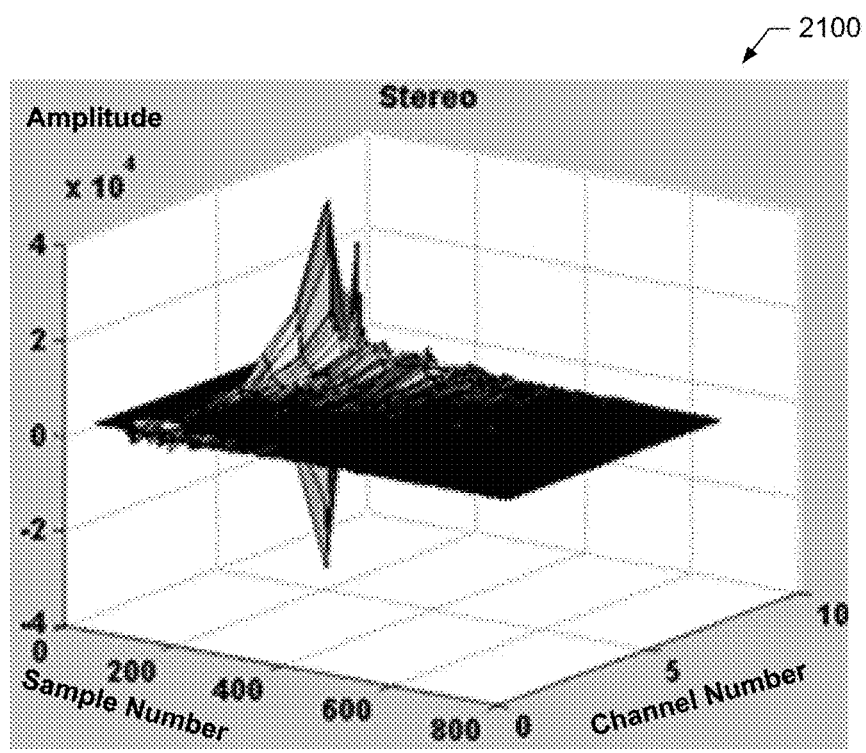
Figure 22:
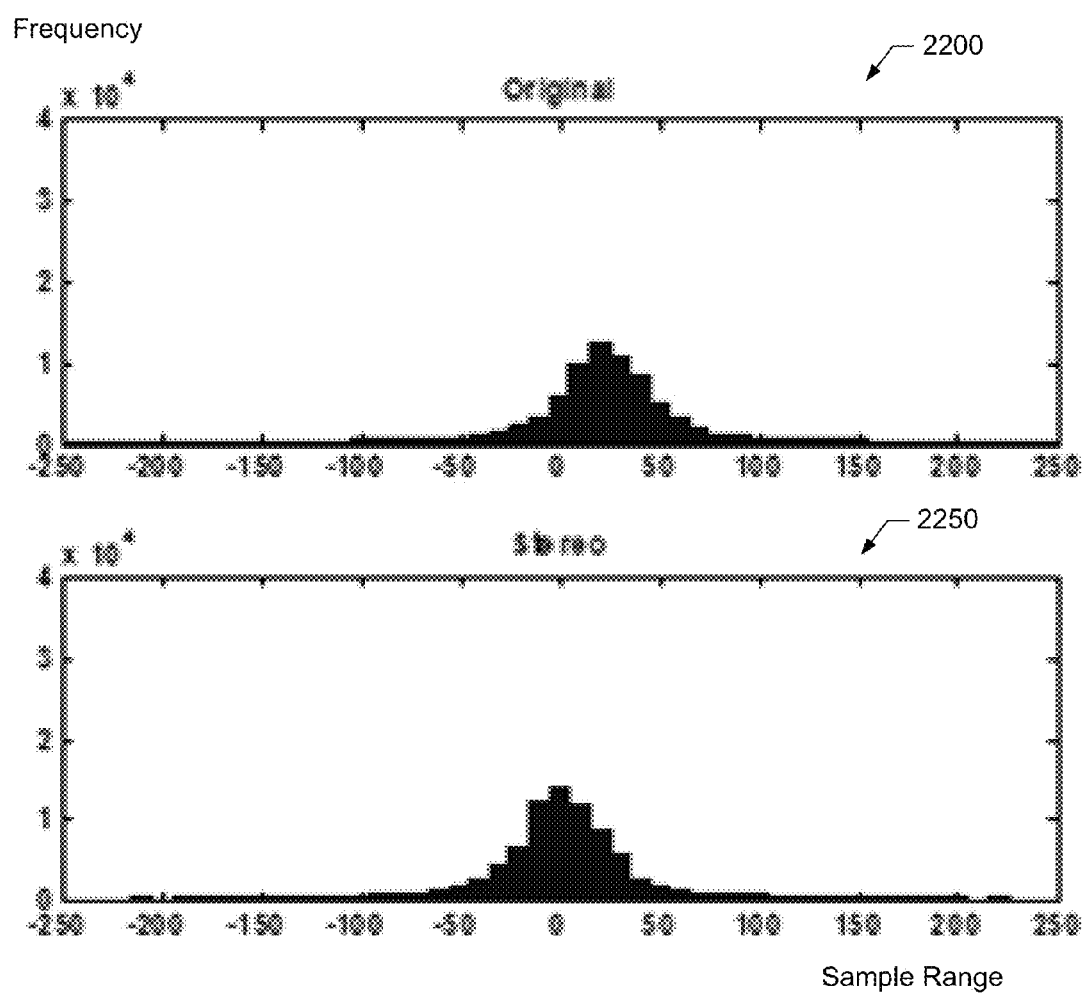
Figure 23:
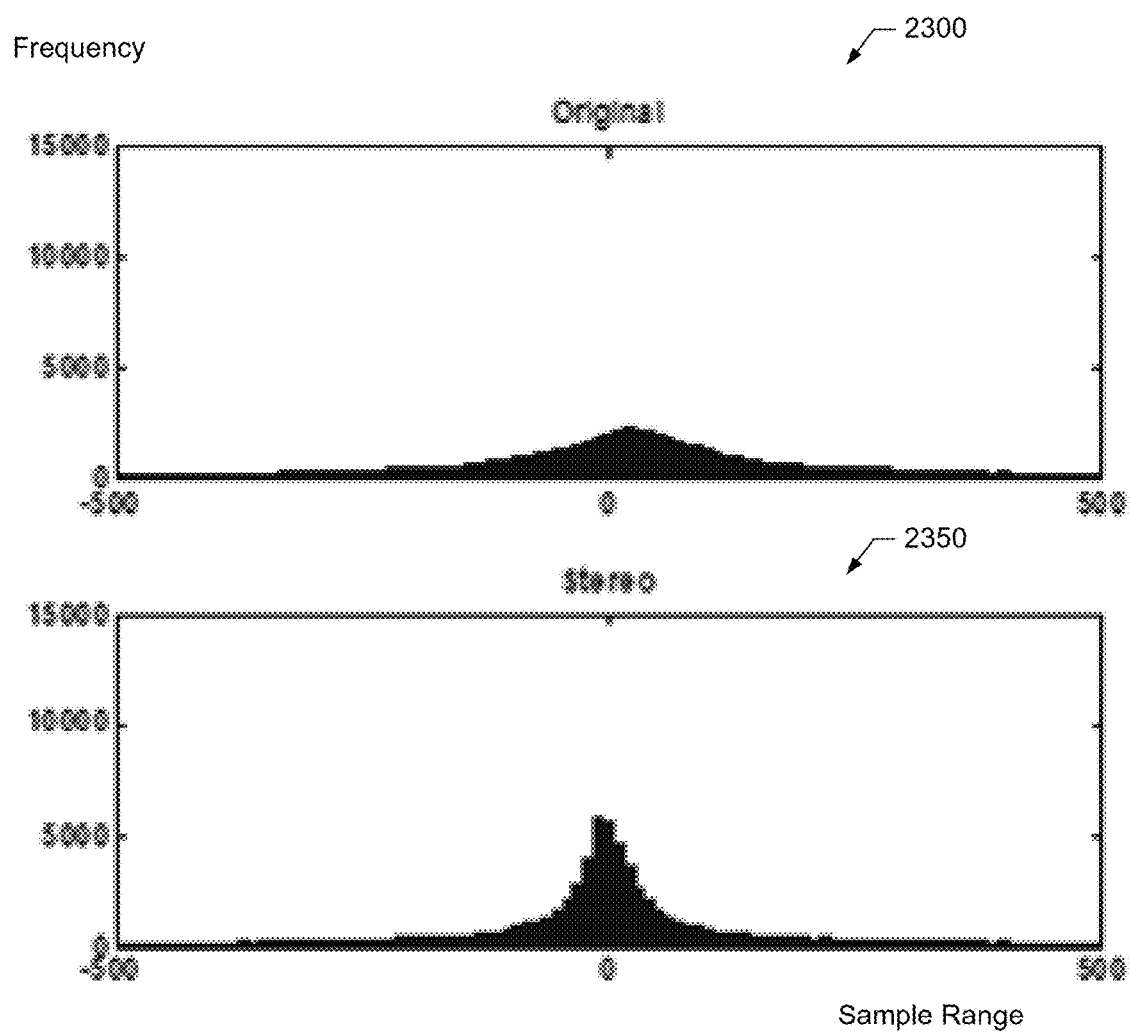

Example performance results achievable by the example sonic data decorrelators 510 of FIGS. 18 and 19A, and the example sonic data correlators of FIGS. 18 and 19B, are shown in FIGS. 20-23. FIGS. 20 and 21 depict respective decorrelated waveforms 2000 (monopole) and 2100 (dipole) obtained by the example sonic data decorrelator 510 of FIG. 19A for the 8-channel input multidimensional sonic waveforms 900 (monopole) and 1100 (dipole) depicted in FIGS. 9 and 11, respectively. FIG. 22 depicts histograms 2200 and 2250 of the original monopole waveform 900 and the decorrelated monopole waveform 2000, respectively. Likewise, FIG. 23 depicts histograms 2300 and 2350 of the original dipole waveform 1100 and the decorrelated monopole waveform 2100, respectively. The histogram 2250 indicates that the 80% range of the decorrelated monopole waveform 2000 is [−110, 110], whereas the histogram 2350 indicates that the 80% range of the decorrelated dipole waveform 2100 is [−360,360]. Accordingly, sonic data decorrelation based on the stereo decorrelator 1700 of FIG. 17 achieves the goal of concentrating the signal around zero. However, comparing FIGS. 22 and 23 with FIGS. 13 and 14 indicates that decorrelation based on the Hadamard transform can yield more signal decorrelation than decorrelation based on the stereo decorrelator 1700 of FIG. 17. Also, decorrelation based on the stereo decorrelator 1700 of FIG. 17 can be lossless (e.g., if the decorrelated signal is allowed to have higher precision than the input signal). However, the resulting decorrelation and correlation process can be more complex than the Hadamard transform decorrelation and correlation scheme described above.

Figure 24:
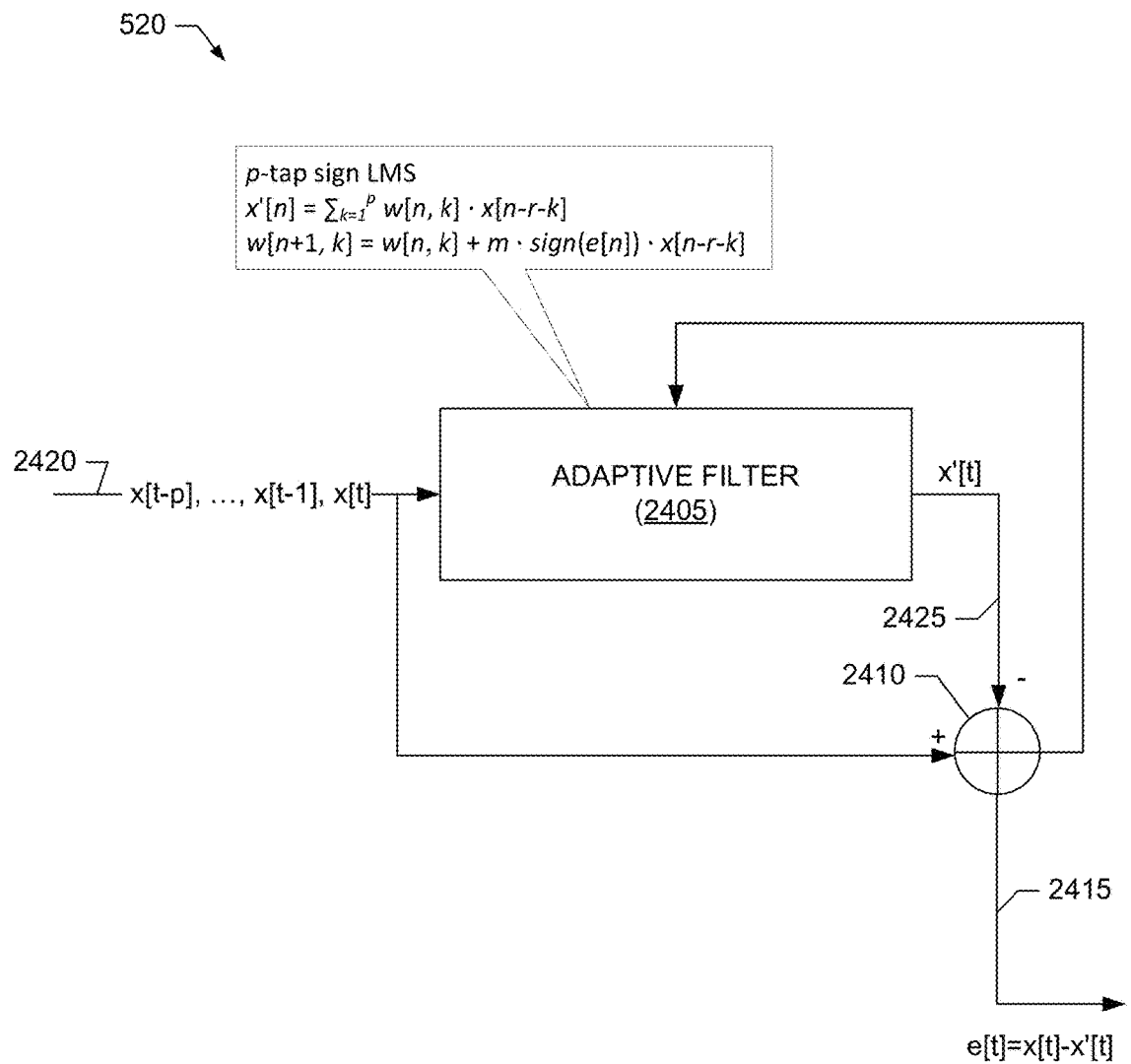
FIG. 24 is a block diagram of an example sonic data predictor that can be used to implement the example sonic data compressor of FIG. 5.

An example implementation of the sonic data predictor 520 of FIG. 5 is illustrated in FIG. 24. The example sonic data predictor 520 of FIG. 24 includes an example p-tap sign adaptive least mean-square (LMS) filter 2405, which is suited for handling non-stationary sonic waveforms. The example sonic data predictor 520 of FIG. 24 also includes an example subtractor 2410 to determine a prediction error output 2415 than is the difference between the original sonic data input 2420 and the predicted sonic data output 2425 of the LMS filter 2405. Using an adaptive LMS filter 2405 in combination with, for example, a data encoder 525 implementing adaptive Rice encoding can avoid the use of block processing in the example sonic data compressor 155.

As illustrated in the example of FIG. 24, the prediction error e[t] can be represented mathematically by the following equation:

$$e[t] = x[t] - \acute{x}[t] \quad \text{Equation 16}$$

where x[t] represents in the input sonic data and x́[t] represents the predicted sonic data output from the LMS filter 2405. If the p taps of the LMS filter 2405 at time n are represented by w[n, k] for k=1, . . . , p, then the predicted sonic data x́[t] output from the LMS filter 2405 is represented mathematically by the following equation:

$$\acute{x}[n] = \sum_{k=1}^{p} w[n, k] \cdot x[n - r - k] \quad \text{Equation 17}$$

where r is the prediction distance corresponding to how far ahead in time the sonic data predictor 520 is configured to predict. For example, r may be set to 0 or some other appropriate value. In the illustrated example, the taps w[n, k] of the LMS filter 2405 are updated at each new sample input using the following equation:

$$w[n+1, k] = w[n, k] + m \cdot \text{sign}(e[n]) \cdot x[n - r - k] \quad \text{Equation 18}$$

where m is the adaptation step size of the adaptive LMS filter 2405. In some examples, taps w[n, k] of the LMS filter 2405 are initialized for be all zeros if, for example, the sonic waveform to be predicted is expected to be substantially silent initially.

The example sonic data reconstructor 610 of FIG. 6 can reconstruct the input sonic waveform x[t] from the prediction error e[t] (which will be obtained by the example data decoder 605 from the compressed sonic data received by the sonic data decompressor 160 from the sonic data compressor 155) given knowledge of the initial values of the taps w[n, k] of the LMS filter 2405 (i.e., w[0, k]), the adaptation step size m, and the initial, original sonic data sequence {x[−r−1], x[−r−2], . . . , x[−r−p]}. In some examples, the initial, original sonic data sequence {x[−r−1], x[−r−2], . . . , x[−r−p]} is assumed to be all zeros, or is transmitted from the sonic data compressor 155 to the sonic data decompressor 160 during an initialization phase, etc. For example, given the foregoing initial knowledge, the sonic data reconstructor 610 can use an example LMS filter similar to the LMS filter 2405 to recursively recover the original sonic data x[t] from the prediction error e[t] using the following equation:

$$x[n] = e[n] + \acute{x}[n] = e[n] + \sum_{k=1}^{p} w[n, k] \cdot x[n - r - k] \quad \text{Equation 19}$$

Starting with n=0, the sonic data reconstructor 610 can use Equation 18 to update the taps w[n, k] of its LMS filter (e.g., used in Equation 19) from the received prediction error e[t], and knowledge of the initial values w[0, k] of taps the LMS filter 2405 (which may be assumed to be zeros in some examples), the adaptation step size m, and the initial, original sonic data sequence {x[−r−1], x[−r−2], . . . , x[−r−p]} (which may also be assumed to be zeros in some examples)).

Figure 25:
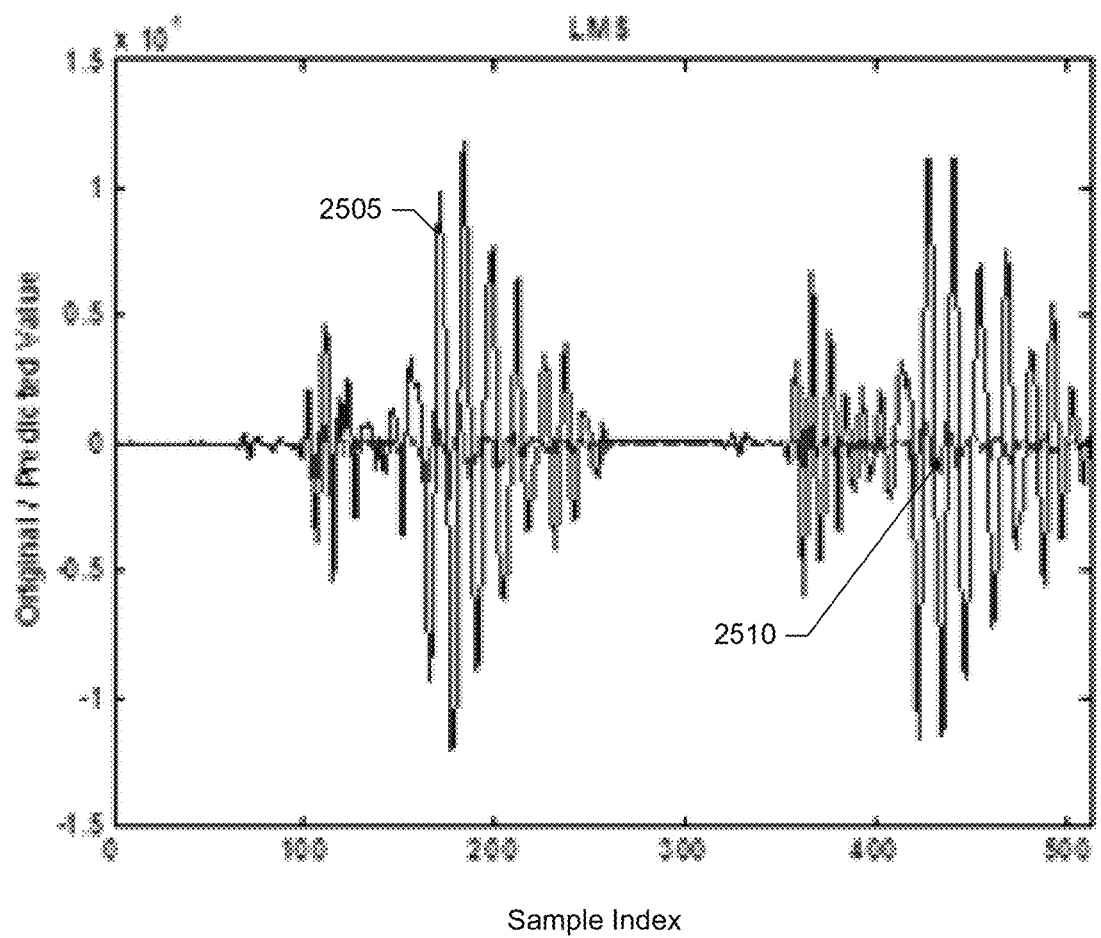
FIGS. 25-27 depict graphs illustrating example performance results achievable by the example sonic data predictor of FIG. 24.
Figure 26:
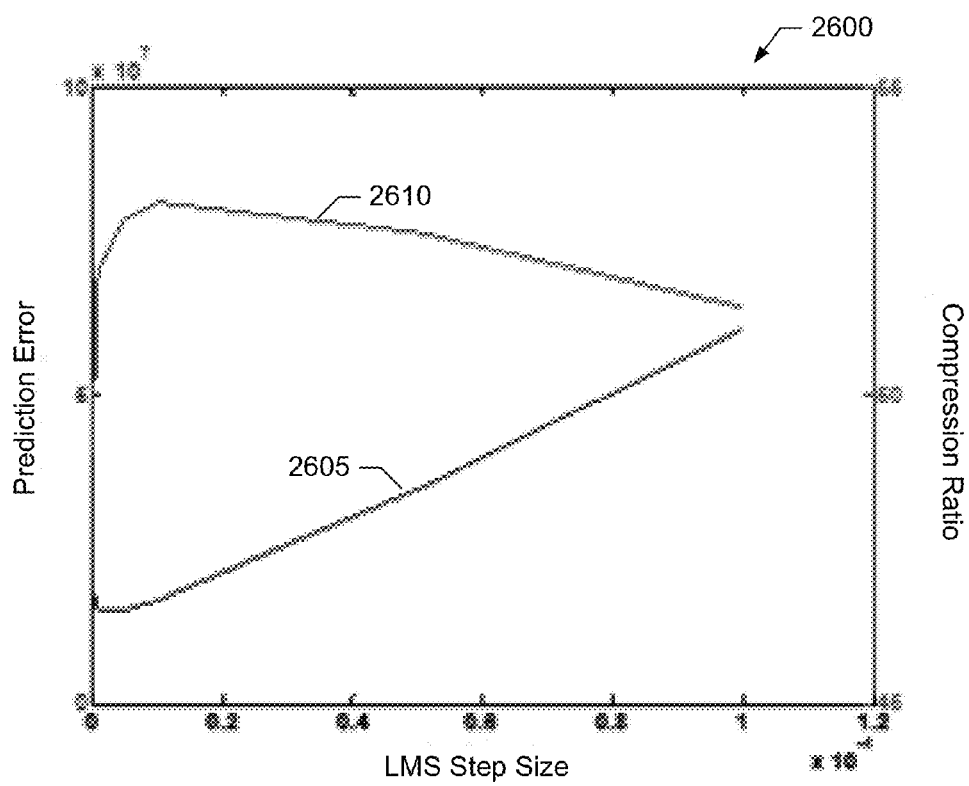
Figure 27:
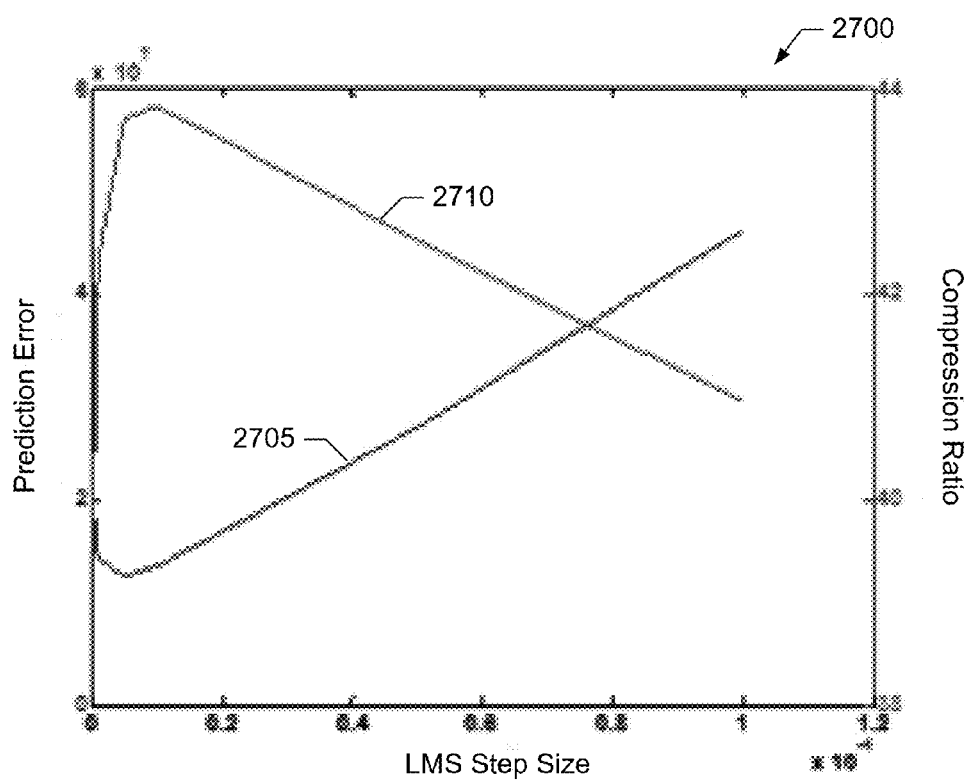

Example performance results achievable by the sonic data predictor 520 of FIG. 24 are shown in FIGS. 25-27. FIG. 25 illustrates example predicted sonic data 2505 and corresponding example prediction error 2510 determined by the example sonic data predictor 520 of FIG. 24 for an example input sonic data sequence. FIGS. 26 and 27 depict graphs 2600 and 2700 demonstrating the effects of the LMS adaptation step size m on the performance of the sonic data predictor 520. In the illustrated examples, the graph 2600 depicts an example prediction error performance curve 2605 and an example compression ratio performance curve 2610 for monopole sonic data, which are both functions of the LMS adaptation step size m. Likewise, the graph 2700 depicts an example prediction error performance curve 2705 and an example compression ratio performance curve 2710 for dipole sonic data, which are both functions of the LMS adaptation step size m. As shown in the examples of FIGS. 26 and 27, if the LMS step m is too small, the sonic data predictor 520 may have difficult tracking the input adaptation, which can result in higher prediction error. Conversely, if the LMS step m is too large, the sonic data predictor 520 may become unstable, which can also result in higher prediction error. The examples of FIGS. 26 and 27 also indicate that the achievable compression ratio is not completely dependent on the prediction error. This is because for the final compression stage, the illustrated examples employed an example data encoder 525 implementing adaptive Rice encoding, which adaptively changes the Rice parameter depending on the input.

Figure 28:
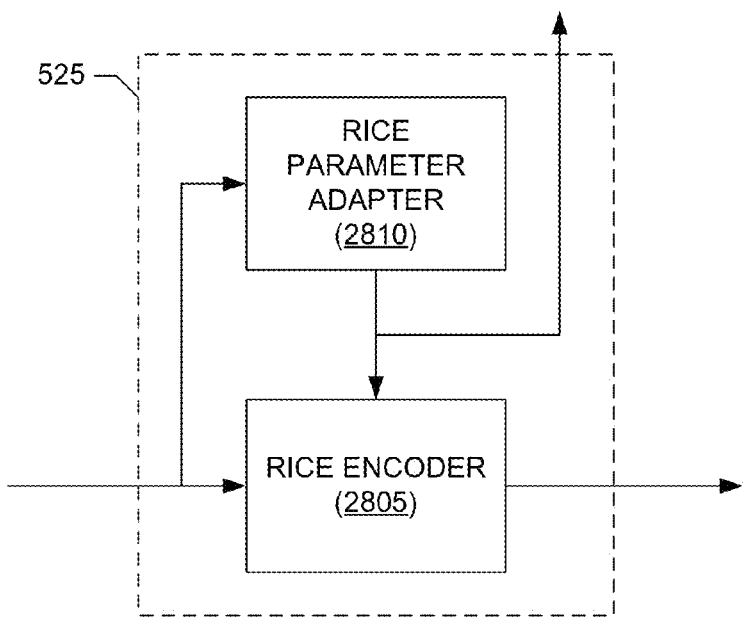
FIG. 28-29 are block diagrams of an example sonic data encoder that can be used to implement the example sonic data compressor of FIG. 5.
Figure 29:
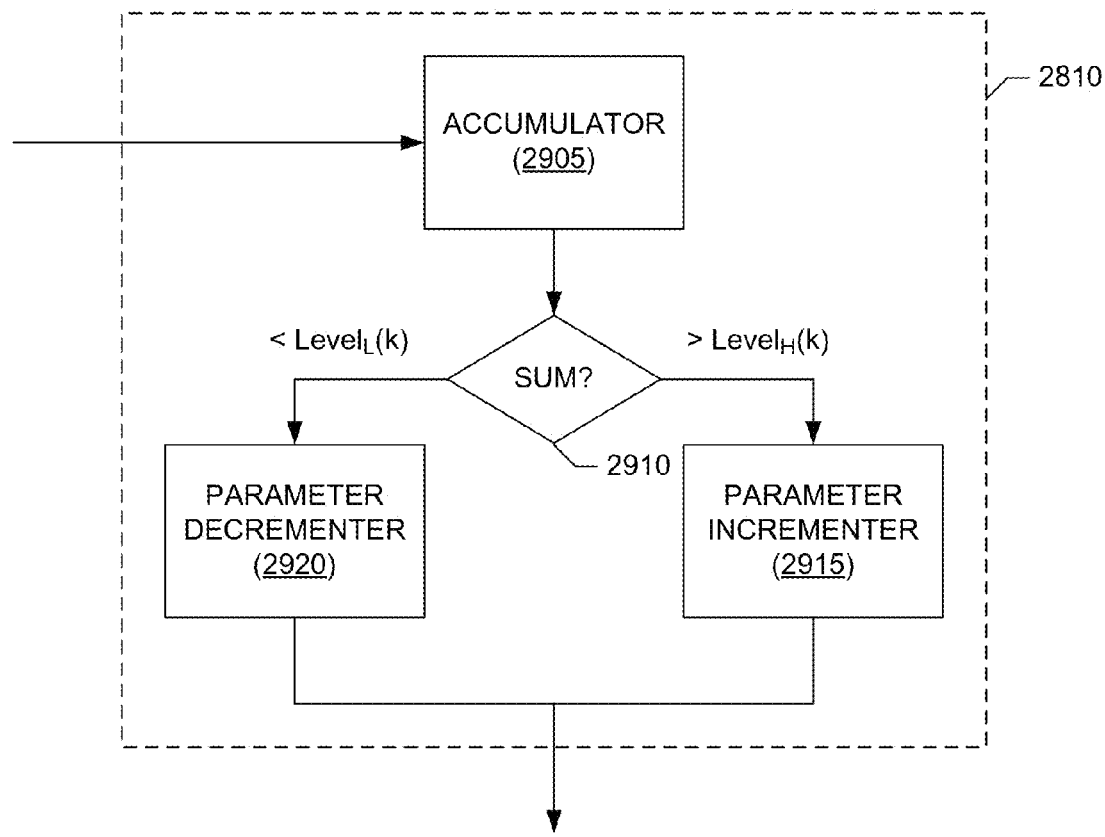

An example implementation of the sonic data encoder 525 of FIG. 5 is illustrated in FIGS. 28-29. The example sonic data encoder 525 of FIGS. 28-29 implements adaptive Rice encoding and, thus, includes an example Rice encoder 2805 and an example Rice parameter adapter 2810. The Rice encoder 2805 of the illustrated examples encodes an input data value as a combination of a binary value and a unary value. For reference, the unary value of a number N is represented by N ones followed by a zero. For example, the unary representation of the number N=3 is 1110, whereas the unary representation of the number N=5 is 111110.

More specifically, the example Rice encoder 2805 encodes an input data value (x) as a quotient (q) and a remainder (r), where r is encoded as a binary value, whereas q is encoded as a unary value. The quotient q is determined by dividing the data value x by the value $m=2^k$, where k is referred to herein as the Rice parameter, and r is the remainder of the division. In some examples, the Rice encoder 2805 can implement the division by m as a right shift by k bits, and can determine the remainder of this division by ANDing the data value x with the binary representation of m−1. Stated mathematically, the Rice encoder 2805 represents the data value x as:

$$x = q \cdot m + r \quad \text{Equation 20}$$

where $$m = 2^k \quad \text{Equation 21}$$

and $$q = x \gg k \quad \text{Equation 22}$$

and $$r = x \& (m-1) \quad \text{Equation 23}$$

with the symbol ">>" representing a right bit shift operation, and the symbol "&" representing a binary AND operation. As noted above, k represents the Rice parameter used by the Rice encoder 2805, and the Rice encoder 2805 encodes the remainder r as a binary value, and encodes the quotient q as a unary value.

In some examples, the Rice encoder 2805 further modifies the input x prior to encoding to ensure that the data to be encoded is a non-negative integer. For example, the Rice encoder 2805 can determine a revised input data value y that is the negative of twice the value of the input x if x is negative, and that is one plus twice the value of the input x otherwise. Mathematically, this adjustment is given by the following equation:

$$y = \begin{cases} -2x & \text{if } x < 0 \\ 2x+1 & \text{otherwise} \end{cases} \quad \text{Equation 24}$$

The original input value x can be recovered from the revised value y by right shifting y by 1 bit (which implements division by 2) and then using the LSB of y to determine whether the result of the right shift should be negated (e.g., if the LSB of y is 0) or left unchanged (e.g., if the LSB of y is 1).

With reference to Equation 20 through Equation 23, because the Rice encoder 2805 represents the quotient q of the input data value x as a unary value, to reduce the number of bits in the output values produced by the Rice encoder 2805, the value of k should be small if the input data value x, whereas the value of k should be large if the input data value x is large. Accordingly, the sonic data encoder 525 includes the Rice parameter adapter 2810 of FIGS. 28-29 to adapt the value of the Rice parameter k based on the size of the input data x. In the illustrated example of FIG. 29, the Rice parameter adapter 2810 updates the Rice parameter k based on a running sum of the values of the input data x. Accordingly, the example Rice parameter adapter 2810 of FIG. 29 includes an example accumulator 2905 to maintain the running sum of the input data x applied to the sonic data encoder 525. The Rice parameter adapter 2810 also includes an example evaluator 2910 to compare the running sum determined by the accumulator 2905 with one or more thresholds. For example, the example evaluator 2910 compares the running sum to a high threshold and a low threshold. If the running sum is greater than the high threshold, the evaluator 2910 invokes an example parameter incrementer 2915 to increase the value of the Rice parameter k (e.g., by incrementing the parameter k by one or some other value). If, however, the running sum is less than the low threshold, the evaluator 2910 invokes an example parameter decrementer 2920 to decrease the value of the Rice parameter k (e.g., by decrementing the parameter k by one or some other value). In the illustrated example of FIG. 29, the Rice parameter adapter 2810 leaves the value of the Rice parameter k unchanged if the running sum lies between the high and low thresholds.

Figure 30:
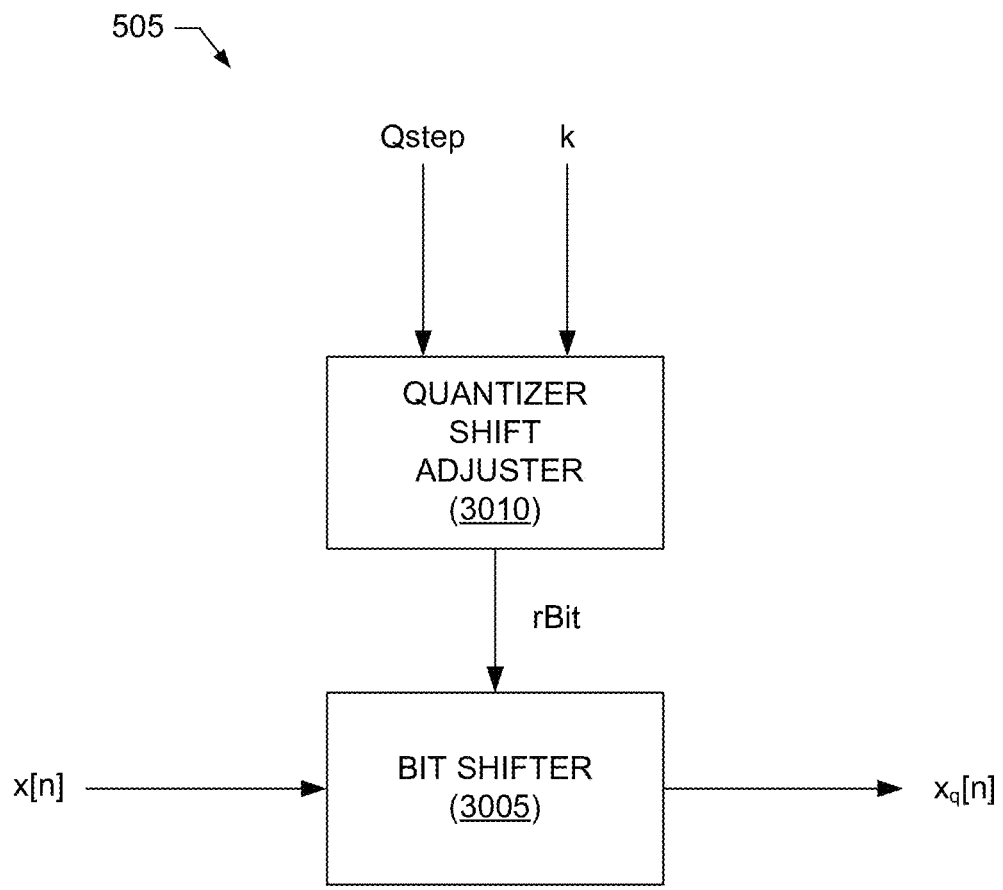
FIG. 30 is a block diagram of an example sonic data quantizer that can be used to implement the example sonic data compressor of FIG. 5.

An example implementation of the quantizer 505 of FIG. 5 is illustrated in FIG. 30. The example quantizer 505 of FIG. 5 includes an example bit shifter 3005 to implement quantization by shifting the input data x[n] to the right by a number of bits specified by the parameter rBits. Right shifting by rBits bits is similar to dividing the input data x[n] by $2^{rBits}$ and then truncating the result. Such bit shifting (or division and truncation) can introduce loss into the data compression implemented by the sonic data compressor 155. Accordingly, the example quantizer 505 of FIG. 5 also includes an example quantizer shift adjuster 3010 to adjust the quantizer bit shift parameter rBits as follows.

In the illustrated example of FIG. 30, the quantizer 505 operates on blocks of input data x[n] (e.g., corresponding to the block size employed by the example data flattener 515). To reduce loss introduced by the bit shifter 3005, the quantizer shift adjuster 3010 causes quantization to not be performed (e.g., by setting rBits=0) if the incoming input data block is weak. With reference to the example data encoder 525 of FIGS. 28-29, it can be seen that the Rice parameter k, as adapted by the Rice parameter adapter 2810, is related to the signal energy of the input data x[n] (e.g., because of the sum determined by the accumulator 2905). Thus, in the illustrated example of FIG. 30, the quantizer shift adjuster 3010 uses the adapted Rice parameter k and a quantization step parameter Qstep to determine the quantizer bit shift parameter rBits as follows:

1. Obtain the adapted Rice parameter k.
2. Compute an intermediate quantizer bit shift parameter rBits' as $$rBits'=\min(k-Qstep+2,k) \quad \text{Equation 25}$$

3. If rBits'<0, set rBits=0; otherwise set rBits=rBits'.

For a 16-bit data stream, Qstep can range from 2 to 15. Larger values of the quantization step parameter Qstep will yield less quantization loss, but will cause the output of the quantizer 505 to have more bits, thereby resulting in less compression. Furthermore, to reconstruct the original sonic data from the quantized sonic data, a stream of the quantizer bit shift parameters rBits used by the quantizer 505 are provided to the dequantizer 625, as illustrated in FIGS. 5-6.

Example compression ratio and compression speed performance results for different combinations of implementing the example sonic data decorrelator 510, the example sonic data predictor 520 and the example data encoder 525 are provided in Tables 1-4. The first column of Tables 1-4 identifies which of three possible decorrelation implementations is used by the example sonic data decorrelator 510. The three possible decorrelation implementations are no decorrelation (represented by the letter "X" in the tables), Hadamard decorrelation as implemented by the example sonic data decompressor 160 of FIG. 6 (represented by the letter "H" in the tables), and enhanced stereo decorrelation as implemented by the example sonic data decompressor 160 of FIGS. 18 and 19A (represented by the letter "S" in the tables). The second column of Tables 1-4 identifies which of two possible prediction implementations is used by the example sonic data predictor 520. The two possible prediction implementations are LMS prediction as implemented by the example sonic data predictor 520 of FIG. 24 (represented by the letter "O" in the tables), and an example prior prediction technique described in U.S. Pat. No. 7,107,153 (represented by the letter "X" in the tables). The third column of Tables 1-4 identifies which of two possible Rice parameter adaption implementations is used by the example data encoder 525. The two possible Rice parameter adaption implementations are adaptation as implemented by the example sonic data predictor 520 of FIG. 24 (represented by the letter "O" in the tables), and an example prior block adaptation technique described in U.S. Pat. No. 7,107,153 (represented by the letter "X" in the tables).

The example performance results provided in Tables 1-4 correspond to four different tests performed using four different example data sets. Table 1 summarizes the results of Test 1, which was based on a first example data set corresponding to a borehole measurement having 5 stations, 8 channels, and 101 samples, and a block size of 16. Table 2 summarizes the results of Test 2, which was based on a second example data set corresponding to a borehole measurement having 13 stations, 4 channels, and 256 samples, and a block size of 32. Table 3 summarizes the results of Test 3, which was based on a third example data set corresponding to a borehole measurement having 13 stations, 8 channels, 1000 samples, and a block size of 64. Table 4 summarizes the results of Test 4, which was based on a fourth example data set corresponding to a dipole measurement having 13 stations, 8 channels, 763 samples, X/Y components, and a block size of 64.

TABLE 1

| Decorrelate | LMS | Adaptive | Test 1 CR (%) | CR Imp. (%) | Runtime (s) | Run Imp. (x) |
|---|---|---|---|---|---|---|
| X | X | X | 14.14 | 0.00 | 0.031 | 1.00 |
| X | X | O | 11.04 | -3.10 | | |
| X | O | X | 17.71 | 3.57 | | |
| X | O | O | 16.82 | 2.68 | 0.015 | 2.07 |
| H | X | X | 29.48 | 9.68 | | |
| H | X | O | 25.40 | 5.60 | | |
| H | O | X | 30.57 | 10.76 | | |
| H | O | O | 28.52 | 8.71 | 0.015 | 2.07 |
| S | X | X | 20.16 | 6.02 | | |
| S | X | O | 16.38 | 2.24 | | |
| S | O | X | 21.36 | 7.22 | | |
| S | O | O | 19.54 | 5.40 | 0.017 | 1.82 |

TABLE 2

| Decorrelate | LMS | Adaptive | Test 2 CR (%) | Imp. (%) | Runtime (s) | Run Imp. (%) |
|---|---|---|---|---|---|---|
| X | X | X | 33.14 | 0.00 | 0.078 | 1.00 |
| X | X | O | 30.95 | -2.13 | | |
| X | O | X | 36.67 | 3.37 | | |
| X | O | O | 36.32 | 3.10 | 0.030 | 2.60 |
| H | X | X | 41.95 | 5.55 | | |
| H | X | O | 39.45 | 3.12 | | |
| H | O | X | 44.20 | 7.65 | | |
| H | O | O | 43.82 | 7.38 | 0.031 | 2.52 |
| S | X | X | 49.73 | 2.68 | | |
| S | X | O | 50.05 | 0.30 | | |
| S | O | X | 53.75 | 4.82 | | |
| S | O | O | 53.93 | 4.68 | 0.037 | 2.11 |

TABLE 3

| Decorrelate | LMS | Adaptive | Test 3 CR (%) | Imp. (%) | Runtime (s) | Run Imp. (%) |
|---|---|---|---|---|---|---|
| X | X | X | 49.44 | 0.00 | 0.281 | 1.00 |
| X | X | O | 49.76 | 0.32 | | |
| X | O | X | 53.41 | 3.98 | | |
| X | O | O | 53.62 | 4.18 | 0.092 | 3.05 |
| H | X | X | 64.35 | 12.51 | | |
| H | X | O | 64.80 | 12.96 | | |
| H | O | X | 66.89 | 15.05 | | |
| H | O | O | 67.30 | 15.46 | 0.094 | 2.99 |
| S | X | X | 55.65 | 6.22 | | |
| S | X | O | 56.04 | 6.60 | | |
| S | O | X | 59.75 | 10.31 | | |
| S | O | O | 60.14 | 10.71 | 0.109 | 2.58 |

TABLE 4

| Decorrelate | LMS | Adaptive | Test 4 CR (%) | Imp. (%) | Runtime (s) | Run Imp. (%) |
|---|---|---|---|---|---|---|
| X | X | X | 39.51 | 0.00 | 0.265 | 1.00 |
| X | X | O | 39.95 | 0.44 | | |
| X | O | X | 43.25 | 3.74 | | |
| X | O | O | 43.77 | 4.26 | 0.092 | 2.88 |
| H | X | X | 56.88 | 14.19 | | |
| H | X | O | 57.27 | 14.58 | | |
| H | O | X | 59.71 | 17.02 | | |

TABLE 4-continued

| Decorrelate | LMS | Adaptive | Test 4 CR (%) | Imp. (%) | Runtime (s) | Run Imp. (%) |
|---|---|---|---|---|---|---|
| H | ○ | ○ | 60.17 | 17.48 | 0.093 | 2.79 |
| S | X | X | 47.89 | 8.38 | | |
| S | X | ○ | 48.24 | 8.73 | | |
| S | ○ | X | 50.75 | 11.24 | | |
| S | ○ | ○ | 51.21 | 11.69 | 0.108 | 2.45 |

In Tables 1-4, the compression ratio represents the percentage by which compression was reduced relative to the baseline represented by the first row of the respective table. The runtime speed was measured in a personal computer (PC) implementation with a 2.13 GHz CPU and 2 GB of RAM, and with the example sonic data compressor 155 being implemented using MATLAB® and C++.

Comparing the 1$^{st}$ row with the 5$^{th}$ rows of the tables, the Hadamard transform is shown to improve the compression ratio by 5-15% relative to the baseline. Comparing the 1$^{st}$ rows with the 3$^{rd}$ row of the tables, LMS prediction is shown to improve the compression ratio by 3-4% relative to the baseline. Comparing the first two rows of the tables, adaptive Rice encoding is shown to improve the compression ratio on Test 3 and Test 4 by 1%, whereas the compression ratio deteriorates in Test 1 and Test 2 by 2-3%. Also, examining the encoding time, Tables 1-4 show that adaptive prediction and encoding as implemented by the sonic data compressor 155 can result in improved run time speed (e.g., corresponding to reduced run-time complexity) relative to the baseline represented by the first rows in the tables.

Figure 31:
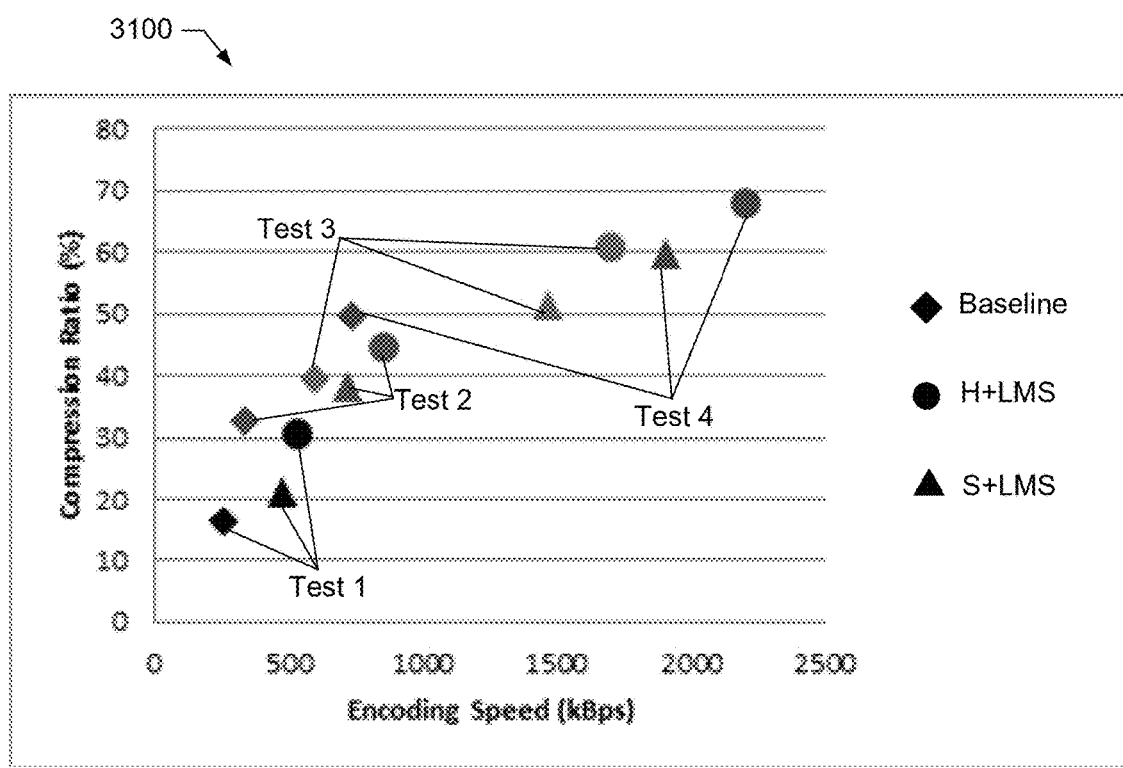
FIG. 31-35 depict graphs illustrating example performance results achievable by the example sonic data compressor and decompressor of FIGS. 5-6.
Figure 32:
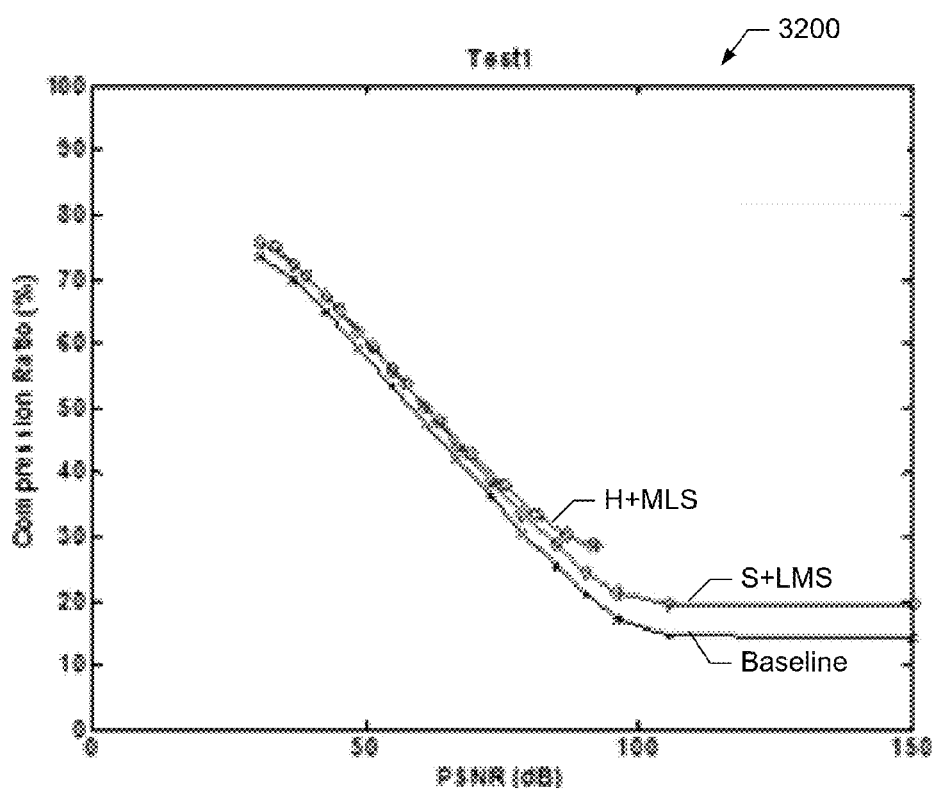
Figure 33:
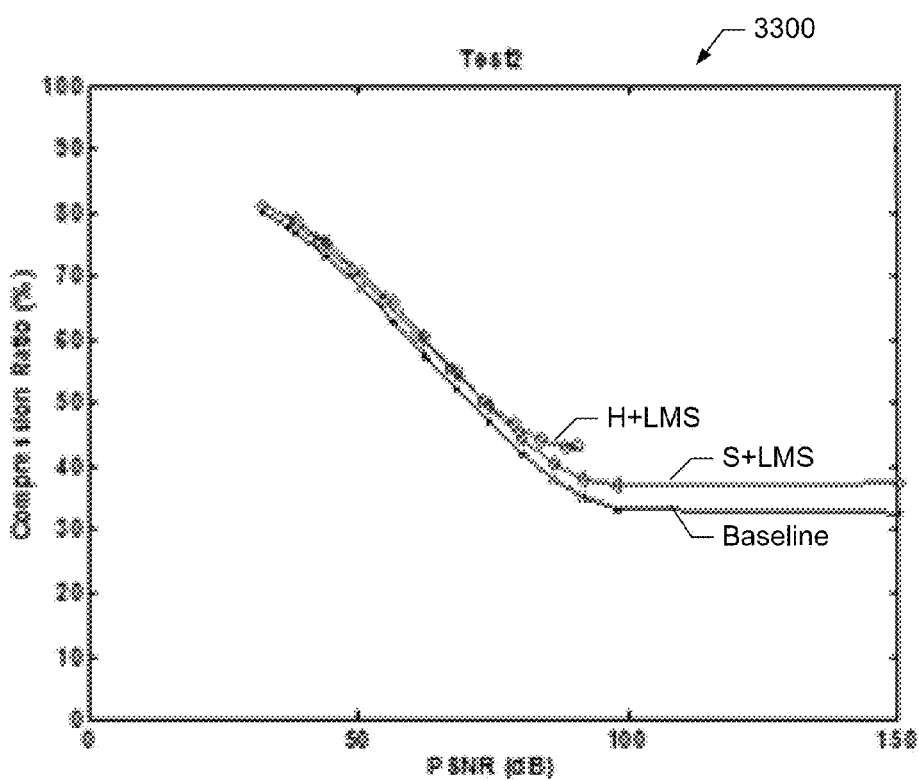
Figure 34:
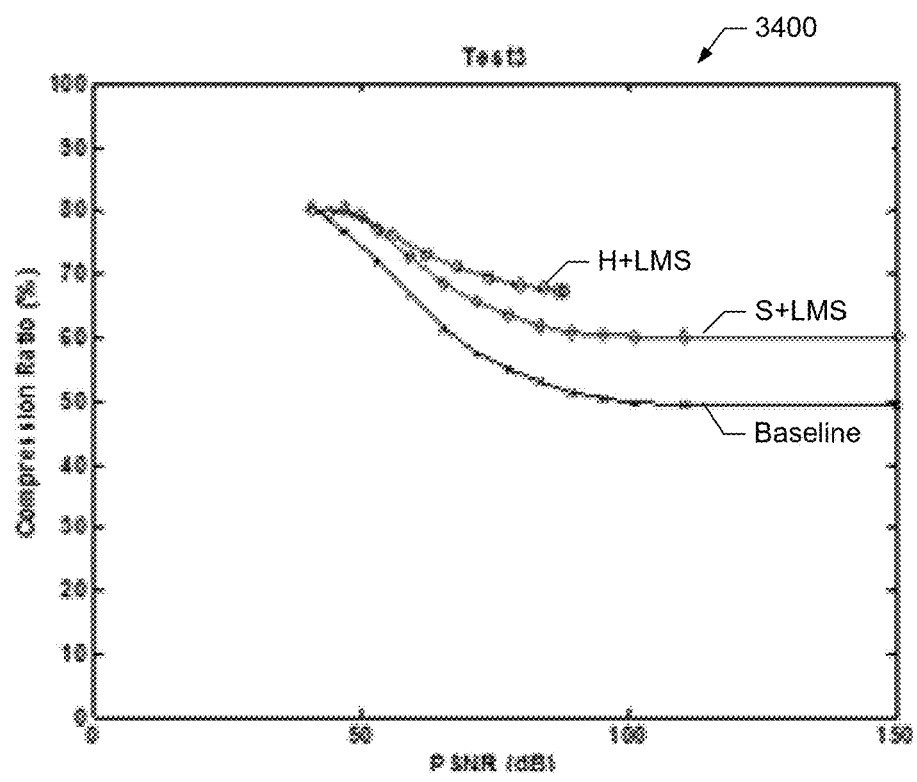
Figure 35:
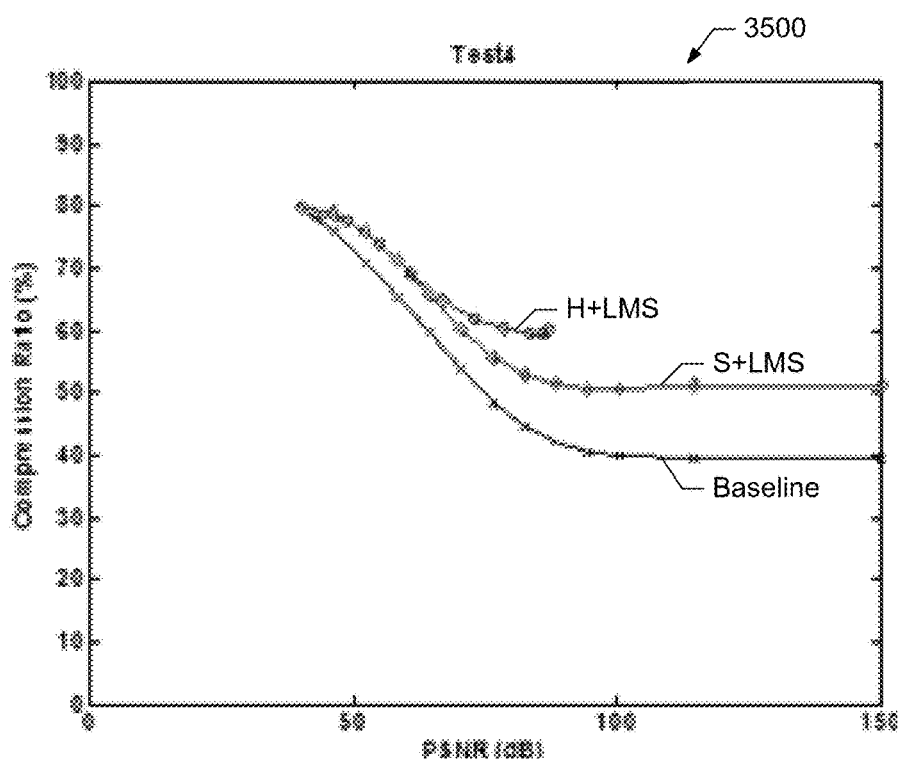

A further summary of the example performance results for the four Tests 1-4 of Tables 1-4 is illustrated by the graph 3100 depicted in FIG. 31. In the graph 3100, a diamond shape is used to represent the baseline performance results corresponding to Tests 1-4 of Tables 1-4. A circle shape is used to represent the performance results corresponding to Tests 1-4 of Tables 1-4 when Hadamard decorrelation is used with LMS prediction. A triangle shape is used to represent the performance results corresponding to Tests 1-4 of Tables 1-4 when enhanced stereo decorrelation is used with LMS prediction. Graph 3100 demonstrates that the sonic data compressor 155 implemented using Hadamard decorrelation with LMS prediction or with enhanced stereo decorrelation with LMS prediction yields a higher compression ratio than the baseline implementation, and with faster encoding speed than the baseline implementation.

FIGS. 32-35 illustrate further example performance results related to distortion exhibited by the example quantizer 505 of FIG. 30. The example performance results of FIGS. 32-35 depict the effects of waveform PSNR (peak signal-to-noise ratio) on the achievable compression ratio corresponding to the four Tests 1-4 of Tables 1-4. If the i$^{th}$ sample of the original sonic data prior compression and the resulting compressed and then decompressed sonic data are $Org_i$ and $Dec_i$, respectively, then the waveform PSNR is defined by the following equation:

$$PSNR(dB) \stackrel{def}{=} 10 \log_{10}\left(\frac{\max_i(Org_i^2)}{\frac{1}{N}\sum_{i=1}^{N}(Org_i - Dec_i)^2}\right) \quad \text{Equation 26}$$

Because more quantization (less Qstep which corresponds to more rBits) yields more compression, but higher quantization noise (and, thus, lower PSNR), the example graphs 3200-3500 of FIGS. 32-35, respectively, depict rate-distortion curves that are monotonically decreasing as PSNR decreases (e.g., because the decreasing amount of quantization yields a correspondingly decreasing amount of compression), and monotonically increasing as PSNR increases (e.g., because the increasing amount of quantization yields a correspondingly increasing amount of compression). Moreover, graphs 3200-3500 of FIGS. 32-35 depict that an example implementation of the sonic data compressor 155 utilizing Hadamard decorrelation with LMS prediction (labeled "H+LMS" in FIGS. 32-35) yields better performance than an example implementation of the sonic data compressor 155 utilizing enhanced stereo decorrelation with LMS prediction (labeled "S+LMS" in FIGS. 32-35). Furthermore, both of the foregoing example implementations of the sonic data compressor 155 yield better performance than the baseline.

While example manners of implementing the example sonic data compressor 155 and the example sonic data decompressor 160 have been illustrated in FIGS. 5-8, 17, 18, 19A-B, 24 and 28-30 one or more of the elements, processes and/or devices illustrated in FIGS. 5-8, 17, 18, 19A-B, 24 and 28-30 may be combined, divided, re-arranged, omitted and/or implemented in any other way. Further, the example quantizer 505, example sonic data decorrelator 510, the example data flattener 515, the example sonic data predictor 520, the example data encoder 525, the example data decoder 605, the example sonic data reconstructor 610, the example data expander 615, the example sonic data correlator 620, the example dequantizer 625, the example Hadamard transformer 705, the example divider 710, the example Hadamard transformer 805, the example multiplier 810, the example stereo decorrelator 1700, the example stereo correlator 1750, first example stereo decorrelation stage 1810, the second example stereo decorrelation stage 1815, first example stereo correlation stage 1820, the second example stereo correlation stage 1825, the first example stereo decorrelation stage 1905, the second example stereo decorrelation stage 1910, the third example stereo decorrelation stage 1915, the first example stereo correlation stage 1925, the second example stereo correlation stage 1930, the third example stereo correlation stage 1935, the example adaptive LMS filter 2405, the example subtractor 2410, the example Rice encoder 2805, the example Rice parameter adapter 2810, the example accumulator 2905, the example evaluator 2910, the example parameter incrementer 2915, the example parameter decrementer 2920, the example bit shifter 3005, the example quantizer shift adjuster 3010 and/or, more generally, the example sonic data compressor 155 and/or the example sonic data decompressor 160 may be implemented by hardware, software, firmware and/or any combination of hardware, software and/or firmware. Thus, for example, any of the example quantizer 505, example sonic data decorrelator 510, the example data flattener 515, the example sonic data predictor 520, the example data encoder 525, the example data decoder 605, the example sonic data reconstructor 610, the example data expander 615, the example sonic data correlator 620, the example dequantizer 625, the example Hadamard transformer 705, the example divider 710, the example Hadamard transformer 805, the example multiplier 810, the example stereo decorrelator 1700, the example stereo correlator 1750, first example stereo decorrelation stage 1810, the second example stereo decorrelation stage 1815, first example stereo correlation stage 1820, the second example stereo correlation stage 1825, the first example stereo decorrelation stage 1905, the second example stereo decorrelation stage 1910, the third example stereo decorrelation stage 1915, the first example stereo correlation stage 1925, the second example stereo correlation stage 1930, the third example stereo correlation stage 1935, the example adaptive LMS filter 2405, the example subtractor 2410, the example Rice encoder 2805, the example Rice parameter adapter 2810, the example accumulator 2905, the example evaluator 2910, the example parameter incrementer 2915, the example parameter decrementer 2920, the example bit shifter 3005, the example quantizer shift adjuster 3010 and/or, more generally, the example sonic data compressor 155 and/or the example sonic data decompressor 160 could be implemented by one or more circuit(s), programmable processor(s), application specific integrated circuit(s) (ASIC(s)), programmable logic device(s) (PLD(s)) and/or field programmable logic device(s) (FPLD(s)), etc. When any of the appended apparatus or system claims are read to cover a purely software and/or firmware implementation, at least one of the example sonic data compressor 155, the example sonic data decompressor 160, the example quantizer 505, example sonic data decorrelator 510, the example data flattener 515, the example sonic data predictor 520, the example data encoder 525, the example data decoder 605, the example sonic data reconstructor 610, the example data expander 615, the example sonic data correlator 620, the example dequantizer 625, the example Hadamard transformer 705, the example divider 710, the example Hadamard transformer 805, the example multiplier 810, the example stereo decorrelator 1700, the example stereo correlator 1750, first example stereo decorrelation stage 1810, the second example stereo decorrelation stage 1815, first example stereo correlation stage 1820, the second example stereo correlation stage 1825, the first example stereo decorrelation stage 1905, the second example stereo decorrelation stage 1910, the third example stereo decorrelation stage 1915, the first example stereo correlation stage 1925, the second example stereo correlation stage 1930, the third example stereo correlation stage 1935, the example adaptive LMS filter 2405, the example subtractor 2410, the example Rice encoder 2805, the example Rice parameter adapter 2810, the example accumulator 2905, the example evaluator 2910, the example parameter incrementer 2915, the example parameter decrementer 2920, the example bit shifter 3005 and/or the example quantizer shift adjuster 3010 are hereby expressly defined to include a tangible computer readable medium such as a memory, digital versatile disk (DVD), compact disk (CD), etc., storing such software and/or firmware. Further still, the example sonic data compressor 155 and/or the example sonic data decompressor 160 may include one or more elements, processes and/or devices in addition to, or instead of, those illustrated in FIGS. 5-8, 17, 18, 19A-B, 24 and 28-30, and/or may include more than one of any or all of the illustrated elements, processes and devices.

Flowcharts representative of example processes that may be executed to implement the example sonic data compressor 155, the example sonic data decompressor 160, the example quantizer 505, example sonic data decorrelator 510, the example data flattener 515, the example sonic data predictor 520, the example data encoder 525, the example data decoder 605, the example sonic data reconstructor 610, the example data expander 615, the example sonic data correlator 620, the example dequantizer 625, the example Hadamard transformer 705, the example divider 710, the example Hadamard transformer 805, the example multiplier 810, the example stereo decorrelator 1700, the example stereo correlator 1750, first example stereo decorrelation stage 1810, the second example stereo decorrelation stage 1815, first example stereo correlation stage 1820, the second example stereo correlation stage 1825, the first example stereo decorrelation stage 1905, the second example stereo decorrelation stage 1910, the third example stereo decorrelation stage 1915, the first example stereo correlation stage 1925, the second example stereo correlation stage 1930, the third example stereo correlation stage 1935, the example adaptive LMS filter 2405, the example subtractor 2410, the example Rice encoder 2805, the example Rice parameter adapter 2810, the example accumulator 2905, the example evaluator 2910, the example parameter incrementer 2915, the example parameter decrementer 2920, the example bit shifter 3005 and/or the example quantizer shift adjuster 3010 are shown in FIGS. 36-44. In these examples, the process represented by each flowchart may be implemented by one or more programs comprising machine readable instructions for execution by a processor, such as the processor 4512 shown in the example processing system 4500 discussed below in connection with FIG. 45. In some examples, the entire program or programs and/or portions thereof implementing one or more of the processes represented by the flowcharts of FIGS. 36-44 could be executed by a device other than the processor 4512 (e.g., such as a controller and/or any other suitable device) and/or embodied in firmware or dedicated hardware (e.g., implemented by an ASIC, a PLD, an FPLD, discrete logic, etc.). Also, one or more of the processes represented by the flowchart of FIGS. 36-44, or one or more portion(s) thereof, may be implemented manually. Further, although the example processes are described with reference to the flowcharts illustrated in FIGS. 36-44, many other techniques for implementing the example methods and apparatus described herein may be used. For example, with reference to the flowcharts illustrated in FIGS. 36-44, the order of execution of the blocks may be changed, and/or some of the blocks described may be changed, omitted, combined and/or subdivided into multiple blocks.

As mentioned above, the example processes of FIGS. 36-44 may be implemented using coded instructions (e.g., computer readable instructions) stored on a tangible computer readable storage medium such as a hard disk drive, a flash memory, a read-only memory (ROM), a CD, a DVD, a cache, a random-access memory (RAM) and/or any other storage media in which information is stored for any duration (e.g., for extended time periods, permanently, brief instances, for temporarily buffering, and/or for caching of the information). As used herein, the term tangible computer readable storage medium is expressly defined to include any type of computer readable storage and to exclude propagating signals. The example processes of FIGS. 36-44 may be implemented using coded instructions (e.g., computer readable instructions) stored on a non-transitory computer readable medium, such as a flash memory, a ROM, a CD, a DVD, a cache, a random-access memory (RAM) and/or any other storage media in which information is stored for any duration (e.g., for extended time periods, permanently, brief instances, for temporarily buffering, and/or for caching of the information). As used herein, the term non-transitory computer readable medium is expressly defined to include any type of computer readable medium and to exclude propagating signals. Also, as used herein, the terms "computer readable" and "machine readable" are considered equivalent unless indicated otherwise.

Figure 36:
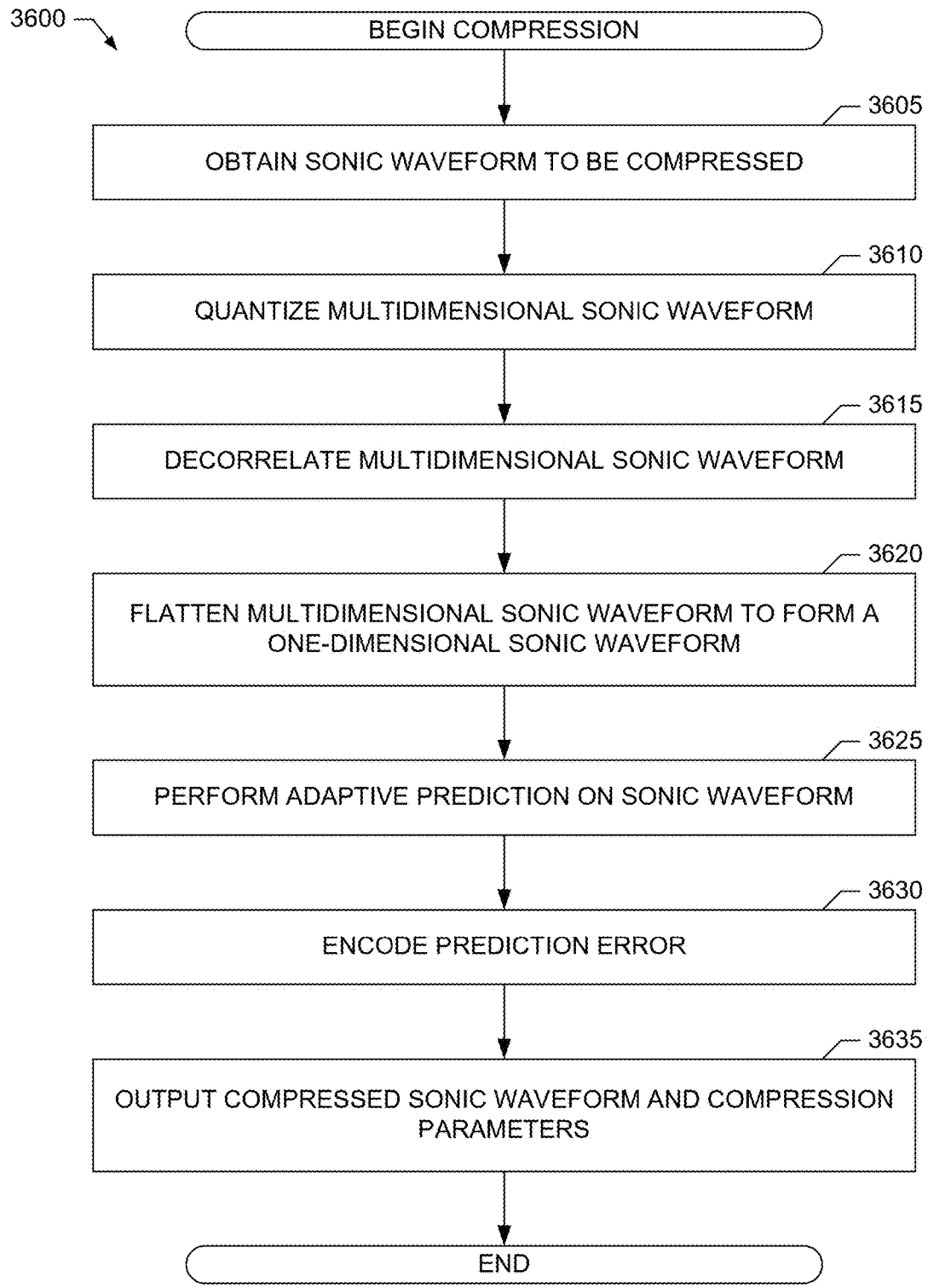
FIG. 36 is a flowchart representative of an example process that may be performed to implement the example sonic data compressor of FIG. 5.

An example process 3600 that may be executed to implement the example sonic data compressor 155 of FIGS. 1 and 5 is illustrated in FIG. 36. With reference to the preceding figures and associated descriptions, the example process 3600 begins execution at block 3605 at which the sonic data compressor 155 obtains multidimensional sonic data from, for example, the sonic measurement tool 400, as described above. At block 3610, the quantizer 505 of the sonic data compressor 155 quantizes the multidimensional sonic data obtained at block 3605, as described above. At block 3615, the sonic data decorrelator 510 of the sonic data compressor 155 decorrelates the quantized multidimensional sonic data obtained at block 3610, as described above. At block 3620, the data flattener 515 of the sonic data compressor 155 flattens the decorrelated multidimensional sonic data obtained at block 3615 to thereby determine one-dimensional decorrelated sonic data for subsequent processing, as described above. At block 3625, the sonic data predictor 520 of the sonic data compressor 155 performs adaptive prediction on the one-dimensional decorrelated sonic data obtained at block 3620 to thereby generate prediction error data, as described above. At block 3630, the data encoder 525 of the sonic data compressor 155 encodes the prediction error data obtained at block 3625, as described above. At block 3635, the sonic data compressor 155 outputs compressed sonic data representative of the multidimensional sonic data obtained at block 3605, as well as one or more compression parameters. For example, the compressed sonic data output by the sonic data compressor 155 at block 3635 can be the encoded prediction error obtained at block 3630, and the compression parameters output by the sonic data compressor 155 at block 3635 can be one or more of a sequence of quantizer bit shift parameters rBits, a sequence of Rice parameters k, etc.

Figure 37:
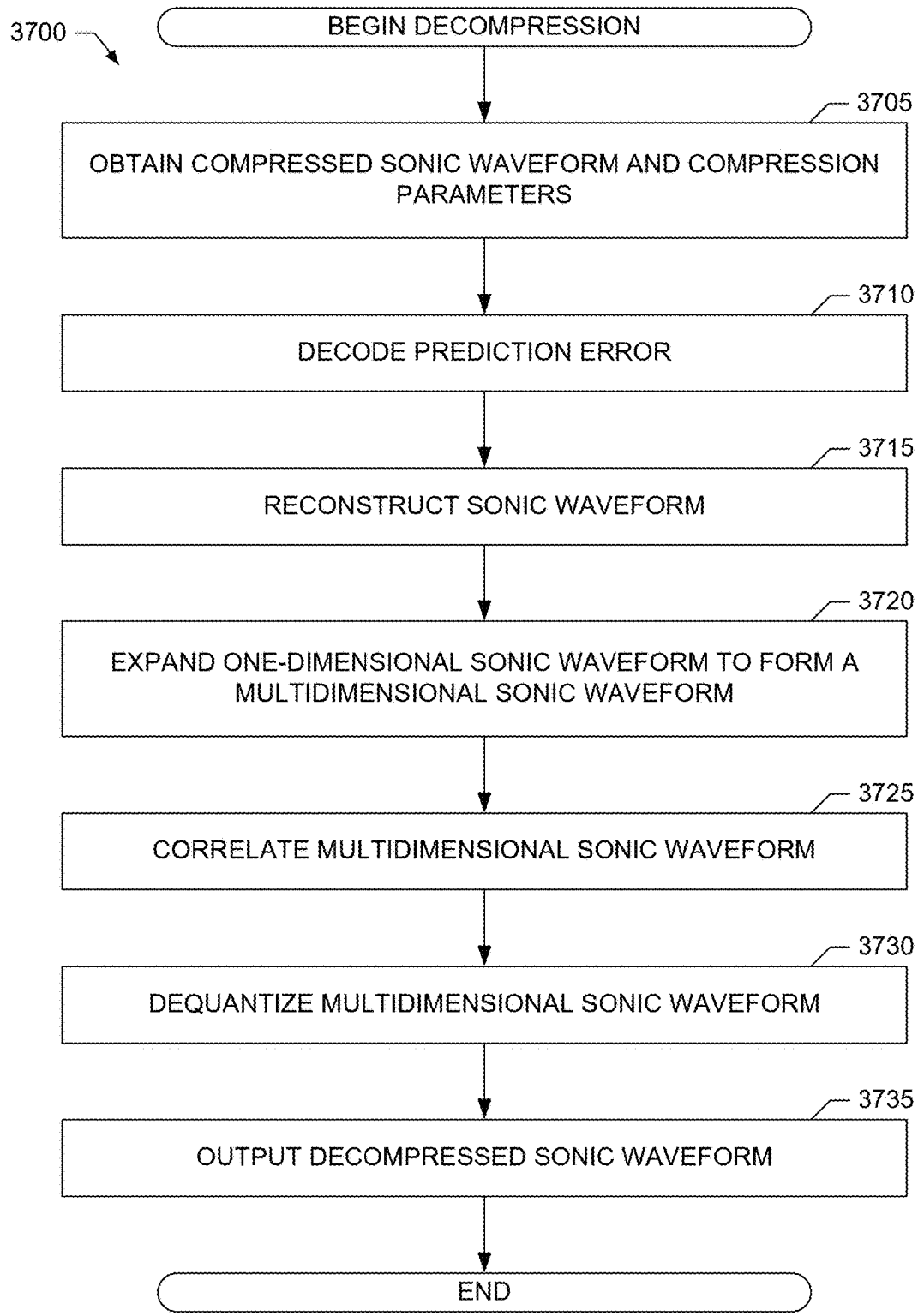
FIG. 37 is a flowchart representative of an example process that may be performed to implement the example sonic data decompressor of FIG. 6.

An example process 3700 that may be executed to implement the example sonic data decompressor 160 of FIGS. 1 and 6 is illustrated in FIG. 37. With reference to the preceding figures and associated descriptions, the example process 3700 begins execution at block 3705 at which the sonic data decompressor 160 obtains compressed sonic data from, for example, a telemetry link in communication with the sonic data compressor 155, as described above. At block 3710, the data decoder 605 of the sonic data decompressor 160 decodes, as described above, the compressed sonic data obtained at block 605 to recover, for example, the prediction error data that was encoded by the data encoder 525 of the sonic data compressor 155. At lock 3715, the sonic data reconstructor 610 of the sonic data decompressor 160 processes the decoded prediction error data obtained at block 3710, as described above, to reconstruct the one-dimensional decorrelated sonic data that was originally processed by the sonic data predictor 520 of the sonic data compressor 155. At block 3720, the data expander 615 of the sonic data decompressor 160 expands the one-dimensional decorrelated sonic data obtained at block 3715 to recover the multidimensional decorrelated sonic data, as described above. At block 3725, the sonic data correlator 620 of the sonic data decompressor 160 correlates the multidimensional decorrelated sonic data obtained at block 3720, as described above, to undo the decorrelation performed by the sonic data decorrelator 510 of the sonic data compressor 155. At block 3730, the dequantizer 625 of the sonic data decompressor 160 dequantizes the multidimensional sonic data obtained at block 3725, as described above, to counter the quantization performed by the quantizer 505 of the sonic data compressor 155. At block 3735, the sonic data decompressor 160 outputs the resulting decompressed, multidimensional sonic waveform.

Figure 38:
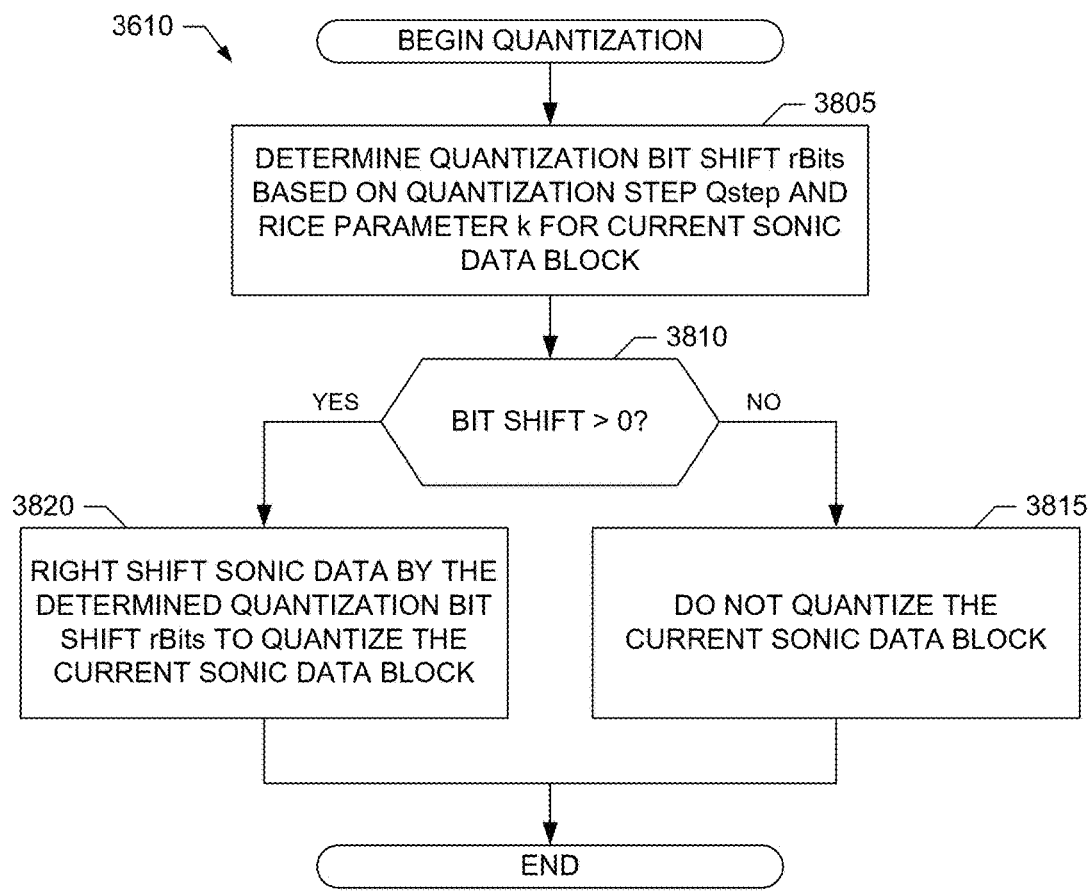
FIG. 38 is a flowchart representative of an example process that may be performed to implement the example sonic data quantizer of FIG. 30 and/or sonic data quantization in the example process of FIG. 36.

An example process 3610 that can be used to implement the example quantizer 505 of FIGS. 5 and/or 30, and/or the processing at block 3610 of FIG. 36, is illustrated in FIG. 38. With reference to the preceding figures and associated descriptions, the example process 3610 begins execution at block 3805 at which the quantizer shift adjuster 3010 of the quantizer 505 determines, as described above, the intermediate quantizer bit shift parameter rBits' from, for example, the adapted Rice parameter k determined by the data encoder 525 and the quantization step parameter Qstep. At block 3820, the quantizer shift adjuster 3010 determines whether the intermediate quantizer bit shift parameter rBits' is greater than zero. If the intermediate quantizer bit shift parameter rBits' is not greater than zero (block 3810), then at block 3815 the quantizer shift adjuster 3010 causes the bit shifter 3005 of the quantizer 505 to not quantize the input sonic data (e.g., by setting the quantizer bit shift parameter rBits to zero), as described above. However, if the intermediate quantizer bit shift parameter rBits' is greater than zero (block 3810), then at block 3820 the bit shifter 3005 sets the quantizer bit shift parameter rBits to be the intermediate value determined at block 3805, and the bit shifter 3005 quantizes the input sonic data by shifting the sonic data by rBits bits, as described above.

Figure 39:
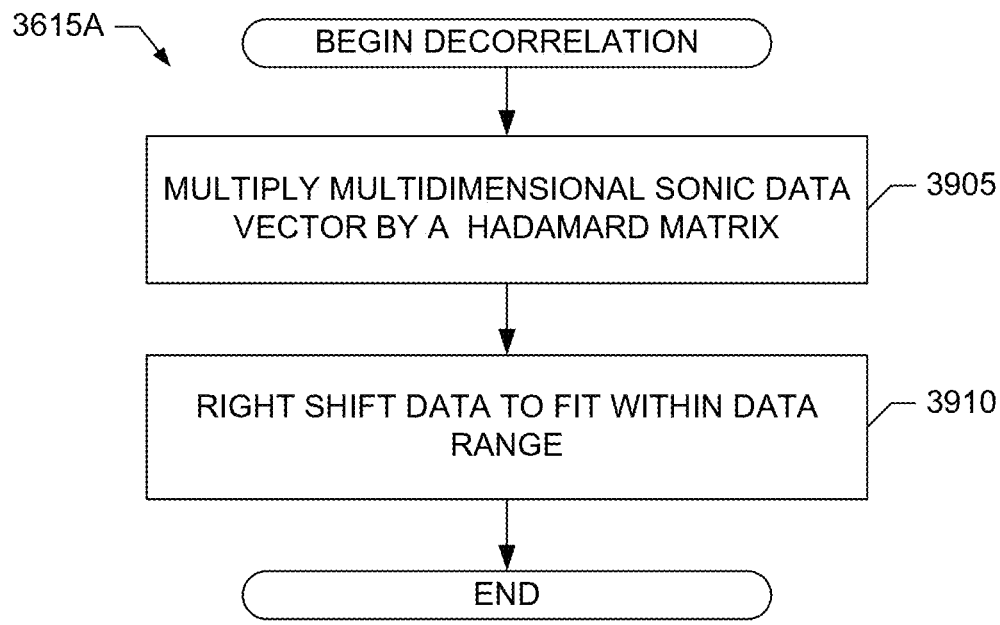
FIG. 39 is a flowchart representative of an example process that may be performed to implement the first example sonic data decorrelator of FIG. 7 and/or sonic data decorrelation in the example process of FIG. 36.

A first example process 3615A that can be used to implement the example sonic data decorrelator 510 of FIGS. 5 and/or 7, and or the processing at block 3615 of FIG. 36, is illustrated in FIG. 39. With reference to the preceding figures and associated descriptions, the example process 3615A begins execution at block 3905 at which the Hadamard transformer 705 of the sonic data decorrelator 510 multiplies the input multidimensional sonic data by a Hadamard matrix, as described above, to determine decorrelated multidimensional sonic data. At block 3910, the divider 710 of the sonic data decorrelator 510 divides the decorrelated multidimensional sonic data by an appropriate value to cause the decorrelated data to lie within an appropriate bit range, as described above.

Figure 40:
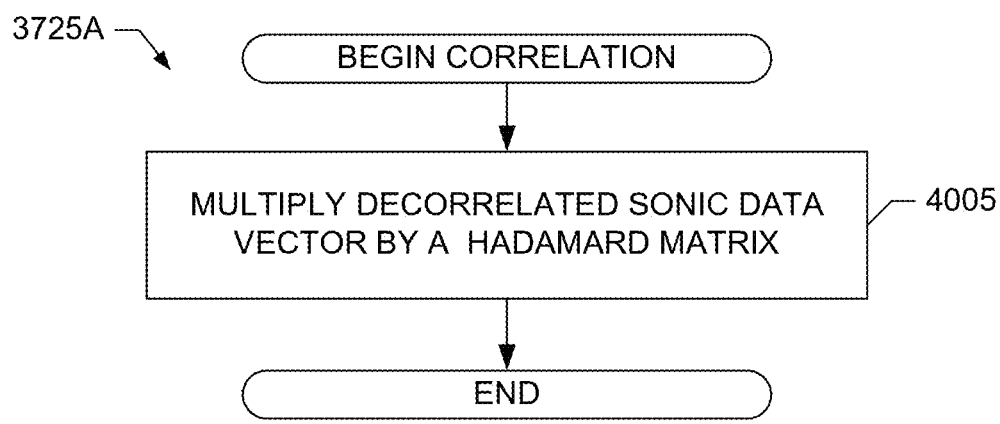
FIG. 40 is a flowchart representative of an example process that may be performed to implement the first example sonic data correlator of FIG. 8 and/or sonic data correlation in the example process of FIG. 37.

A first example process 3725A that can be used to implement the example sonic data correlator 620 of FIGS. 6 and/or 8, and or the processing at block 3725 of FIG. 37, is illustrated in FIG. 40. With reference to the preceding figures and associated descriptions, the example process 3725A begins execution at block 4005 at which the Hadamard transformer 805 of the sonic data correlator 620 multiplies the input decorrelated, multidimensional sonic data by a Hadamard matrix, as described above, to recover the original multidimensional sonic data that was decorrelated by the sonic data decorrelator 510 (e.g., using the example process 3615A of FIG. 49).

Figure 41:
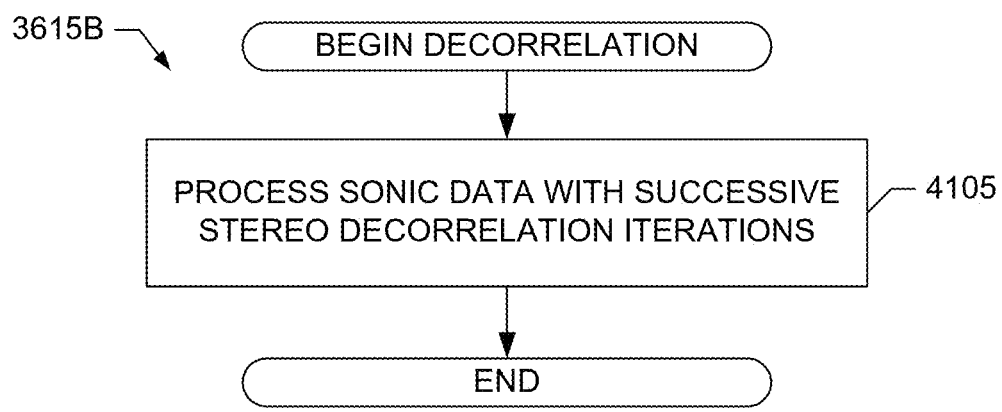
FIG. 41 is a flowchart representative of an example process that may be performed to implement the second and/or third example sonic data decorrelators of FIGS. 18 and/or 19A-B, and/or sonic data decorrelation in the example process of FIG. 36.

A second example process 3615B that can be used to implement the example sonic data decorrelator 510 of FIGS. 5, 18 and/or 19A, and or the processing at block 3615 of FIG. 36, is illustrated in FIG. 41. With reference to the preceding figures and associated descriptions, the example process 3615B begins execution at block 4105 at which the sonic data decorrelator 510 implements successive stereo decorrelation stages, as described above, to determine decorrelated multidimensional sonic data.

Figure 42:
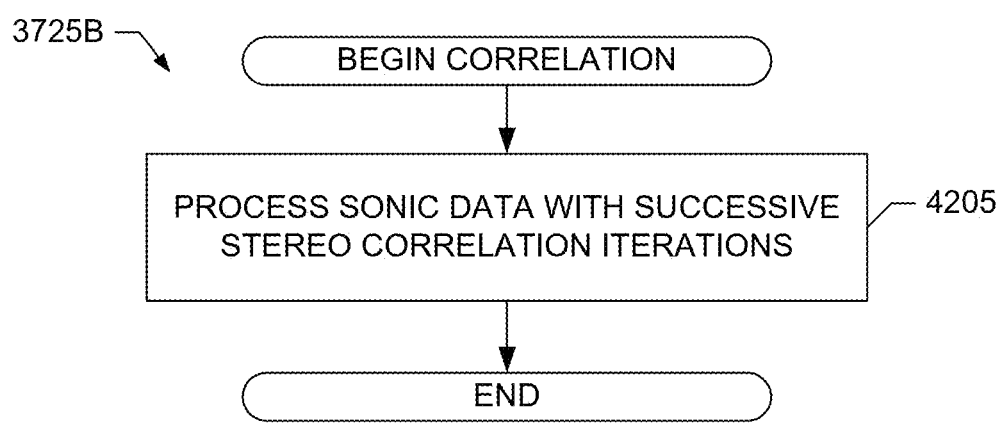
FIG. 42 is a flowchart representative of an example process that may be performed to implement the second and/or third example sonic data correlators of FIGS. 18 and/or 19A-B, and/or sonic data correlation in the example process of FIG. 37.

A second example process 3725B that can be used to implement the example sonic data correlator 620 of FIGS. 6, 18 and/or 19B, and or the processing at block 3725 of FIG. 37, is illustrated in FIG. 42. With reference to the preceding figures and associated descriptions, the example process 3725B begins execution at block 4205 at which the sonic data correlator 620 implements successive stereo correlation stages, as described above, to recover the original multidimensional sonic data that was decorrelated by the sonic data decorrelator 510 (e.g., using the example process 3615B of FIG. 41).

Figure 43:
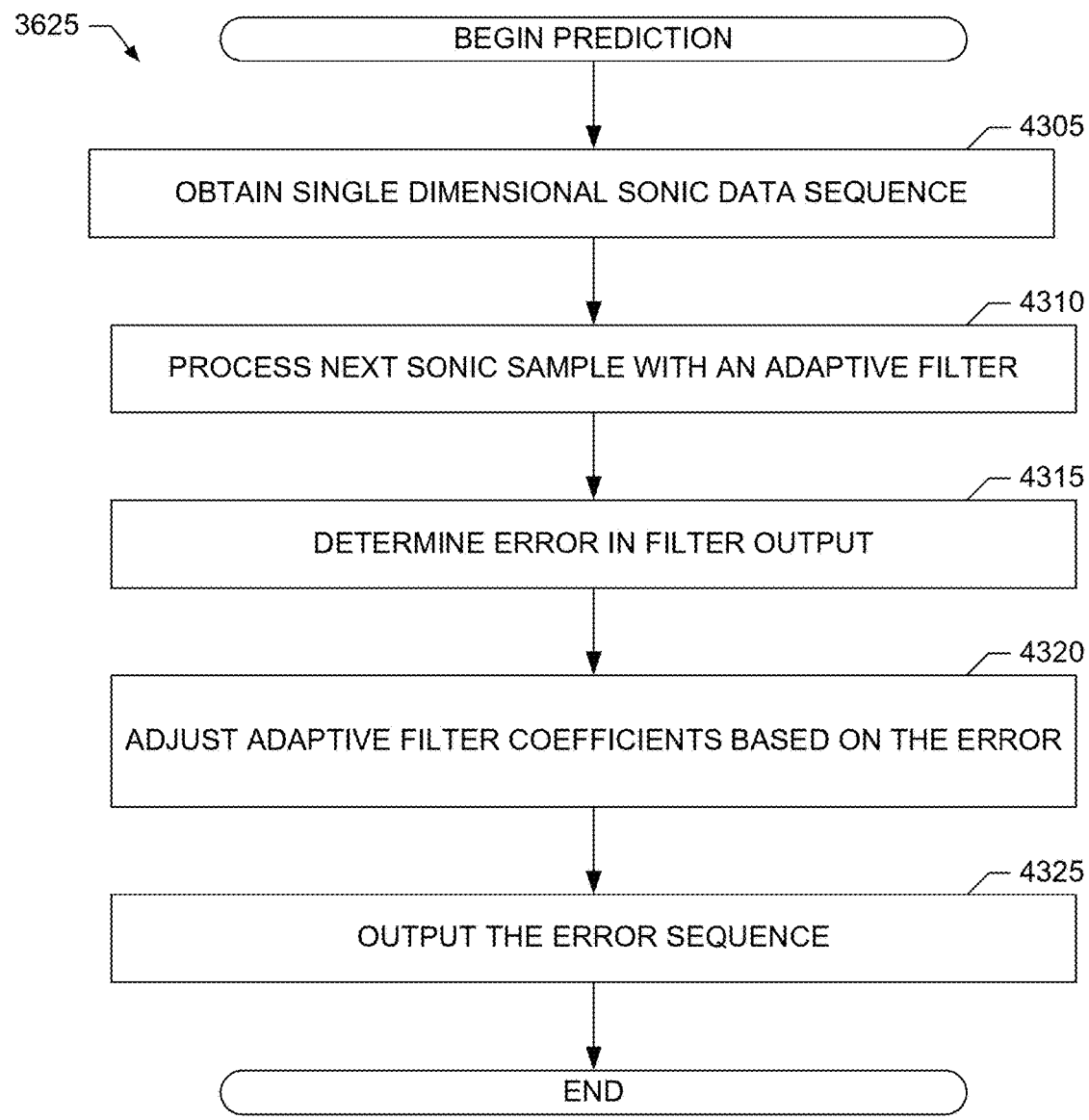
FIG. 43 is a flowchart representative of an example process that may be performed to implement the example sonic data predictor of FIG. 24 and/or sonic data prediction in the example process of FIG. 36.

An example process 3625 that can be used to implement the example sonic data predictor 520 of FIGS. 5 and/or 24, and/or the processing at block 3625 of FIG. 36, is illustrated in FIG. 43. With reference to the preceding figures and associated descriptions, the example process 3625 begins execution at block 4305 at which the sonic data predictor 520 obtains a one-dimensional sonic data sequence from, for example, the data flattener 515 of the sonic data compressor 155, as described above. At block 4310, the LMS filter 2405 of the sonic data predictor 520 processes successive sonic data samples obtained at block 4305 to determine predicted sonic data. At block 4315, the subtractor 2410 of the sonic data predictor 520 determines the prediction error, as described above, to be the difference between the input sonic data samples and the corresponding predicted sonic data samples output from the LMS filter 2405. At block 4320, the filter taps of the LMS filter 2405 are adjusted based on the prediction error samples, input sonic data samples and the adaptation step size, as described above. At block 4325, the sonic data predictor 520 outputs the prediction error for encoding by the data encoder 525, as described above.

Figure 44:
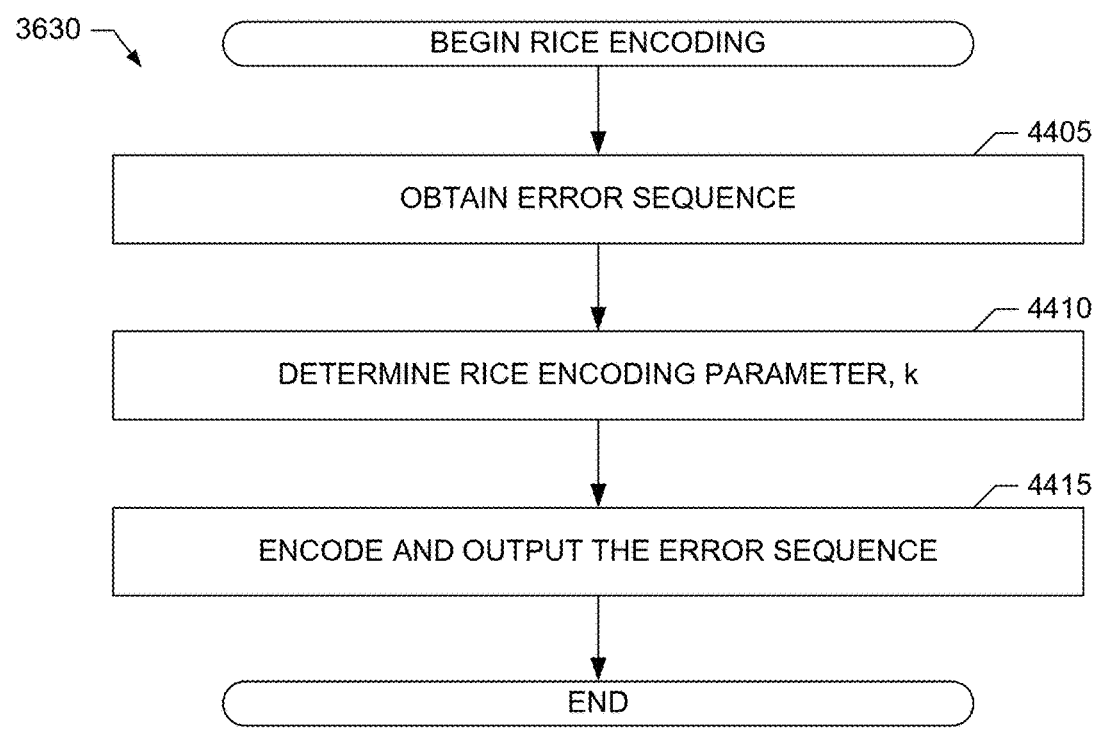
FIG. 44 is a flowchart representative of an example process that may be performed to implement the example sonic data encoder of FIGS. 28-29 and/or sonic data encoding in the example process of FIG. 36.

An example process 3630 that can be used to implement the example sonic data encoder 525 of FIGS. 5, 28 and/or 29, and/or the processing at block 3630 of FIG. 36, is illustrated in FIG. 44. With reference to the preceding figures and associated descriptions, the example process 3630 begins execution at block 4405 at which the sonic data encoder 525 obtains a prediction error sequence from, for example, the sonic data predictor 520 of the sonic data compressor 155, as described above. At block 4410, the Rice parameter adapter 2810 of the sonic data encoder 525 determines the Rice parameter to be used for encoding the prediction error data obtained at block 4405, as described above. At block 4415, the Rice encoder 2805 of the sonic data encoder 525 encodes, as described above, the prediction error data obtained at block 4405 using the Rice parameter obtained at block 4410.

Figure 45:
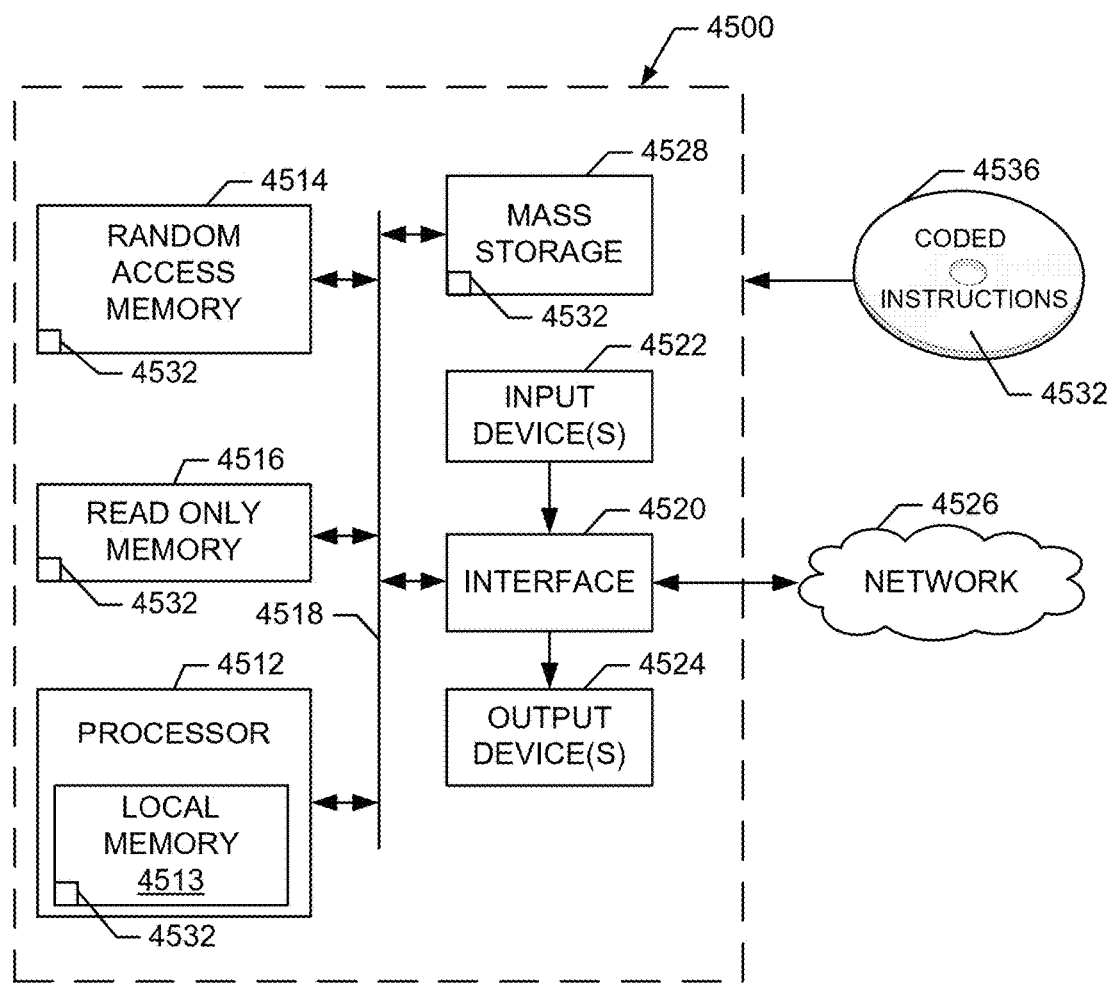
FIG. 45 is a block diagram of an example processing system that may execute example machine readable instructions used to implement one or more of the processes of FIGS. 36-43 and/or 44 to implement the example sonic data compressor of FIG. 5 and/or the example sonic data decompressor of FIG. 6.

FIG. 45 is a block diagram of an example processing system 4500 capable of executing the processes of FIGS. 36-44 to implement the example sonic data compressor 155, the example sonic data decompressor 160, the example quantizer 505, example sonic data decorrelator 510, the example data flattener 515, the example sonic data predictor 520, the example data encoder 525, the example data decoder 605, the example sonic data reconstructor 610, the example data expander 615, the example sonic data correlator 620, the example dequantizer 625, the example Hadamard transformer 705, the example divider 710, the example Hadamard transformer 805, the example multiplier 810, the example stereo decorrelator 1700, the example stereo correlator 1750, first example stereo decorrelation stage 1810, the second example stereo decorrelation stage 1815, first example stereo correlation stage 1820, the second example stereo correlation stage 1825, the first example stereo decorrelation stage 1905, the second example stereo decorrelation stage 1910, the third example stereo decorrelation stage 1915, the first example stereo correlation stage 1925, the second example stereo correlation stage 1930, the third example stereo correlation stage 1935, the example adaptive LMS filter 2405, the example subtractor 2410, the example Rice encoder 2805, the example Rice parameter adapter 2810, the example accumulator 2905, the example evaluator 2910, the example parameter incrementer 2915, the example parameter decrementer 2920, the example bit shifter 3005 and/or the example quantizer shift adjuster 3010 of FIGS. 5-8, 17, 18, 19A-B, 24 and 28-30. The processing system 4500 can be, for example, a smart controller, a special-purpose computing device, a server, a personal computer, a personal digital assistant (PDA), a smartphone, an Internet appliance, etc., or any other type of computing device.

The system 4500 of the instant example includes a processor 4512. For example, the processor 4512 can be implemented by one or more microprocessors and/or controllers from any desired family or manufacturer.

The processor 4512 includes a local memory 4513 (e.g., a cache) and is in communication with a main memory including a volatile memory 4514 and a non-volatile memory 4516 via a bus 4518. The volatile memory 4514 may be implemented by Static Random Access Memory (SRAM), Synchronous Dynamic Random Access Memory (SDRAM), Dynamic Random Access Memory (DRAM), RAMBUS Dynamic Random Access Memory (RDRAM) and/or any other type of random access memory device. The non-volatile memory 4516 may be implemented by flash memory and/or any other desired type of memory device. Access to the main memory 4514, 4516 is controlled by a memory controller.

The processing system 4500 also includes an interface circuit 4520. The interface circuit 4520 may be implemented by any type of interface standard, such as an Ethernet interface, a universal serial bus (USB), and/or a PCI express interface.

One or more input devices 4522 are connected to the interface circuit 4520. The input device(s) 4522 permit a user to enter data and commands into the processor 4512. The input device(s) can be implemented by, for example, a keyboard, a mouse, a touchscreen, a track-pad, a trackball, a trackbar (such as an isopoint), a voice recognition system and/or any other human-machine interface.

One or more output devices 4524 are also connected to the interface circuit 4520. The output devices 4524 can be implemented, for example, by display devices (e.g., a liquid crystal display, a cathode ray tube display (CRT)), a printer and/or speakers. The example interface circuit 4520, thus, includes a graphics driver card.

The interface circuit 4520 also includes a communication device, such as a modem or network interface card, to facilitate exchange of data with external computers via a network 4526 (e.g., an Ethernet connection, a digital subscriber line (DSL), a telephone line, coaxial cable, a cellular telephone system, etc.).

The processing system 4500 also includes one or more mass storage devices 4528 for storing machine readable instructions and data. Examples of such mass storage devices 4528 include floppy disk drives, hard drive disks, compact disk drives and digital versatile disk (DVD) drives.

Coded instructions 4532 corresponding to the instructions of FIGS. 36-44 may be stored in the mass storage device 4528, in the volatile memory 4514, in the non-volatile memory 4516, in the local memory 4513 and/or on a removable storage medium, such as a CD or DVD 4536.

As an alternative to implementing the methods and/or apparatus described herein in a system such as the processing system of FIG. 45, the methods and or apparatus described herein may be embedded in a structure such as a processor and/or an ASIC (application specific integrated circuit).

From the foregoing, example methods, apparatus, systems and articles of manufacture (e.g., storage media) to compress multidimensional sonic data have been disclosed. Some disclosed example methods to compress input multidimensional sonic data include decorrelating the input multidimensional sonic data to determine decorrelated multidimensional sonic data. In some such examples, the input multidimensional sonic data has a plurality of dimensions corresponding to a respective plurality of azimuthal directions from which the input multidimensional sonic data was obtained. In such examples, the decorrelated multidimensional sonic data is decorrelated among the plurality of dimensions of the input multidimensional sonic data. Such example methods also include processing the decorrelated multidimensional sonic data to determine compressed data representative of the input multidimensional sonic data.

In some such example methods, decorrelating the input multidimensional sonic data includes multiplying a vector representation of the input multidimensional sonic data by a Hadamard matrix to determine the decorrelated multidimensional sonic data. In such examples, each element of the vector representation includes a respective sonic data sample corresponding to a respective different azimuthal direction from which the input multidimensional sonic data was obtained. Also, in some such example methods, decorrelating the input multidimensional sonic data further includes shifting a result of multiplying the vector representation of the input multidimensional sonic data by the Hadamard matrix to cause the decorrelated multidimensional sonic data to be integers representable by a first number of bits.

In some such example methods, decorrelating the input multidimensional sonic data includes performing successive stages of stereo decorrelation operations on the input multidimensional sonic data. In such examples, a stereo decorrelation operation operates on a pair of data inputs to produce a pair of data outputs that are based on linear combinations of the pair of data inputs. Also, in some such examples, the stereo decorrelation operation includes adding and shifting the pair of data inputs to determine a first one of the pair of data outputs, and subtracting the pair of data inputs to determine a second one of the pair of data outputs. Furthermore, in some such examples, a first stage of the successive stages of stereo decorrelation operations includes first and second stereo decorrelation operations, and a second stage of the successive stages of stereo decorrelation operations includes a third stereo decorrelation operation that is to process one output of the first stereo decorrelation operation and one output from the second stereo decorrelation operation.

In some such example methods, processing the decorrelated multidimensional sonic data includes flattening the input multidimensional sonic data to determine one-dimensional sonic data, processing the one-dimensional sonic data with an adaptive filter to determine prediction error data corresponding to the one-dimensional sonic data, and encoding the prediction error data to determine the compressed data representative of the input multidimensional sonic data.

Other disclosed example methods to compress input multidimensional sonic data include processing the input multidimensional sonic data to determine one-dimensional sonic data corresponding to the input multidimensional sonic data. In some such examples, the input multidimensional sonic data has multiple dimensions corresponding to respectively to multiple azimuthal directions from which the input multidimensional sonic data was obtained. Some such example methods also include processing the one-dimensional sonic data with an adaptive filter to determine prediction error data corresponding to the one-dimensional sonic data. Some such example methods further include processing the prediction error data to determine compressed data representative of the input multidimensional sonic data.

In some such example methods, processing the input multidimensional sonic data to determine the one-dimensional sonic data includes flattening a plurality of sonic data blocks corresponding respectively to the plurality of azimuthal directions from which the input multidimensional sonic data was obtained to form a single sonic data block containing the sonic data samples from the plurality of sonic data blocks.

In some such example methods, processing the one-dimensional sonic data with the adaptive filter includes applying the one-dimensional sonic data to the adaptive filter to determine filtered sonic data, and subtracting the filtered sonic data from the one-dimensional sonic data applied to the adaptive filter to determine the prediction error data. Also, in some such examples, the adaptive filter includes a plurality of filter coefficients, and such example methods further include adapting the filter coefficients based on the one-dimensional sonic data applied to the adaptive filter, the prediction error data and a filter parameter.

In some such example methods, processing the prediction error data to determine the compressed data includes performing Rice encoding of the prediction error data to determine the compressed data. Also, in some such examples, the Rice encoding is based on a Rice parameter, and such example methods further include adapting the Rice parameter based on the prediction error data. Furthermore, some such example methods further include quantizing the input multidimensional sonic data based on the Rice parameter and a quantization parameter.

Further example apparatus, systems and articles of manufacture to implement the foregoing example methods, as well as other example methods, apparatus, systems and articles of manufacture to compress multidimensional sonic data have been disclosed herein.

Although a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, means-plus-function clauses are intended to cover the structures described herein as performing the recited function and not just structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

Finally, although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method to improve characterization of a surrounding formation comprising:
   obtaining input multidimensional sonic measurements from receivers of a sonic measurement tool after having activated a transmitter;
   processing the input multidimensional sonic measurements via a quantizer according to a bit reduction parameter to generate processed input multidimensional sonic measurements, wherein the quantizer comprises a quantizer bit shift adjuster that causes quantization to not be performed if an incoming data block is weak;
   decorrelating, with a processor, the processed input multidimensional sonic measurements to determine decorrelated multidimensional sonic measurements, the input multidimensional sonic measurements having a plurality of dimensions corresponding to a respective plurality of azimuthal directions from which the input multidimensional sonic measurements were measured by sonic tools, the decorrelated multidimensional sonic measurements being decorrelated among the plurality of dimensions of the input multidimensional sonic measurements;
   processing, with the processor, the decorrelated multidimensional sonic measurements to determine compressed data representative of the input multidimensional sonic measurements; and
   transmitting the compressed data to a surface system via a telemetry link in order to characterize the surrounding formation.

2. A method as defined in claim 1 wherein decorrelating the processed input multidimensional sonic measurements comprises multiplying a vector representation of the processed input multidimensional sonic measurements by a Hadamard matrix to determine the decorrelated multidimensional sonic measurements, each element of the vector representation including a respective sonic measurements sample corresponding to a respective different azimuthal direction from which the input multidimensional sonic measurements were measured.

3. A method as defined in claim 2 wherein decorrelating the processed input multidimensional sonic measurements further comprises shifting a result of multiplying the vector representation of the processed input multidimensional sonic measurements by the Hadamard matrix to cause the decorrelated multidimensional sonic measurements to be integers representable by a first number of bits.

4. A method as defined in claim 1 wherein decorrelating the processed input multidimensional sonic measurements comprises performing successive stages of stereo decorrelation operations on the processed input multidimensional sonic measurements, a stereo decorrelation operation operating on a pair of data inputs to produce a pair of data outputs that are based on linear combinations of the pair of data inputs.

5. A method as defined in claim 4 wherein the stereo decorrelation operation comprises:
   adding and shifting the pair of data inputs to determine a first one of the pair of data outputs; and
   subtracting the pair of data inputs to determine a second one of the pair of data outputs.

6. A method as defined in claim 4 wherein a first stage of the successive stages of stereo decorrelation operations includes first and second stereo decorrelation operations, and a second stage of the successive stages of stereo decorrelation operations includes a third stereo decorrelation operation that is to process one output of the first stereo decorrelation operation and one output from the second stereo decorrelation operation.

7. A method as defined in claim 1 wherein processing the decorrelated multidimensional sonic measurements comprises:
   flattening the input multidimensional sonic measurements to determine one-dimensional sonic measurements;
   processing the one-dimensional sonic measurements with an adaptive filter to determine prediction error data corresponding to the one-dimensional sonic measurements; and
   encoding the prediction error data to determine the compressed data representative of the input multidimensional sonic measurements.

8. An improved downhole acoustic system for evaluating a surrounding formation, the downhole acoustic system comprising:
   an acoustic source;
   a plurality of receiving stations, each receiving station to input multidimensional sonic measurements over a plurality of azimuthal directions supported by the plurality of receiving stations;
   a sonic data compressor to:
      process the input multidimensional sonic measurements via a quantizer according to a bit reduction parameter to generate processed input multidimensional sonic measurements, wherein the quantizer comprises a quantizer bit shift adjuster that causes quantization to not be performed if an incoming data block is weak;
      decorrelate the processed input multidimensional sonic measurements to determine decorrelated multidimensional sonic measurements, the decorrelated multidimensional sonic measurements being decorrelated among the plurality of dimensions of the input multidimensional sonic measurements, each dimension of the input multidimensional sonic measurements corresponding to a respective different azimuthal direction supported by the plurality of receiving stations; and
      process the decorrelated multidimensional sonic measurements to determine compressed data representative of the input multidimensional sonic measurements; and
   a telemetry system to transmit the compressed data to a surface system to facilitate evaluation of the surrounding formation.

9. A system as defined in claim 8 wherein to decorrelate the processed input multidimensional sonic measurements, the sonic data compressor is to multiply a vector representation of the processed input multidimensional sonic measurements by a Hadamard matrix to determine the decorrelated multidimensional sonic measurements, each element of the vector representation including a respective sonic measurements sample corresponding to a respective different azimuthal direction supported by the plurality of receiving stations.

10. A system as defined in claim 9 wherein the sonic data compressor is further to shift a result of multiplying the vector representation of the processed input multidimensional sonic measurements by the Hadamard matrix to cause the decorrelated multidimensional sonic measurements to be integers representable by a first number of bits.

11. A system as defined in claim 8 wherein to decorrelate the processed input multidimensional sonic measurements, the sonic data compressor is to perform successive stages of stereo decorrelation operations on the processed input multidimensional sonic measurements, a stereo decorrelation operation to operate on a pair of data inputs to produce a pair of data outputs that are based on linear combinations of the pair of data inputs, the stereo decorrelation operation to:
- add and shift the pair of data inputs to determine a first one of the pair of data outputs; and
- subtract the pair of data inputs to determine a second one of the pair of data outputs.

12. A system as defined in claim 11 wherein a first stage of the successive stages of stereo decorrelation operations includes first and second stereo decorrelation operations, and a second stage of the successive stages of stereo decorrelation operations includes a third stereo decorrelation operation that is to process one output of the first stereo decorrelation operation and one output from the second stereo decorrelation operation.

13. A system as defined in claim 8 wherein to process the decorrelated multidimensional sonic measurements, the sonic data compressor is to:
- flatten the input multidimensional sonic measurements to determine one-dimensional sonic measurements;
- process the one-dimensional sonic measurements with an adaptive filter to determine prediction error data corresponding to the one-dimensional sonic measurements; and
- encode the prediction error data to determine the compressed data representative of the input multidimensional sonic measurements.

* * * * *